(12) United States Patent
Lyle et al.

(10) Patent No.: US 7,295,578 B1
(45) Date of Patent: Nov. 13, 2007

(54) METHOD AND APPARATUS FOR SYNCHRONIZING AUXILIARY DATA AND VIDEO DATA TRANSMITTED OVER A TMDS-LIKE LINK

(76) Inventors: James D. Lyle, 3750 Miraverde Ct., Santa Clara, CA (US) 95051; Gyudong Kim, 1012 S. De Anza Blvd., C204, San Jose, CA (US) 95129; Min-Kyu Kim, 20257 Vista Ct., Cupertino, CA (US) 95014; Ken-Sue Tan, 13405 Surrey La., Saratoga, CA (US) 95070; Paul Daniel Wolf, 2696 Eaton Ave., San Carlos, CA (US) 94070; Long Van Pham, 2322 Four Seasons Ct., San Jose, CA (US) 95131; Russel A. Martin, 481 Vine St., Menlo Park, CA (US) 94025

( * ) Notice: Subject to any disclaimer, the term of this patent is extended or adjusted under 35 U.S.C. 154(b) by 1370 days.

(21) Appl. No.: 09/954,291

(22) Filed: Sep. 12, 2001

(51) Int. Cl.
*H04J 3/06* (2006.01)
(52) U.S. Cl. ..................... 370/503; 348/473
(58) Field of Classification Search ............. None
See application file for complete search history.

(56) References Cited

U.S. PATENT DOCUMENTS

| | | | |
|---|---|---|---|
| 5,150,211 A | 9/1992 | Charbonnel et al. | 358/143 |
| 5,199,030 A | 3/1993 | Ueda | 370/68 |
| 5,506,932 A | 4/1996 | Holmes et al. | 395/2.14 |
| 5,523,795 A | 6/1996 | Ueda | 348/480 |
| 5,541,662 A | 7/1996 | Adams et al. | 348/460 |
| 5,905,769 A | 5/1999 | Lee et al. | 375/376 |

(Continued)

FOREIGN PATENT DOCUMENTS

WO    WO 00/16525    3/2000

OTHER PUBLICATIONS

*High-Bandwidth Digital Content Protection System*, Revision 1.0, by Intel Corporation, Feb. 17, 2000, pp. 1-60.

(Continued)

*Primary Examiner*—Bob A. Phunkulh
(74) *Attorney, Agent, or Firm*—Girard & Equitz LLP

(57) ABSTRACT

A communication system including a transmitter, a receiver, and a TMDS-like link, in which video data and auxiliary data are transmitted from the transmitter to the receiver, or in which video data are transmitted over the link from the transmitter to the receiver and auxiliary data are transmitted from the receiver to the transmitter (or from the transmitter to the receiver and also from receiver to the transmitter), a transmitter or receiver for use in such a system, and methods for sending auxiliary data and video data over such a link, synchronizing such auxiliary data with such video data, and generating clocks having frequency closely matching the rate at which the auxiliary data are transmitted. Typically, the auxiliary data include one or more streams of audio data. In some embodiments the transmitter transmits a video clock to the receiver over a video clock channel, at least one of the transmitter and receiver transmits at least one stream of auxiliary data to the other one of the transmitter and the receiver, and at least one of the transmitter and the receiver transmits over the video clock channel at least one auxiliary clock for the auxiliary data.

48 Claims, 17 Drawing Sheets

U.S. PATENT DOCUMENTS

| | | | | |
|---|---|---|---|---|
| 5,940,070 | A | 8/1999 | Koo | 345/302 |
| 5,974,464 | A | 10/1999 | Shin et al. | 709/231 |
| 6,191,822 | B1 | 2/2001 | Smyers | 348/552 |
| 6,492,984 | B2* | 12/2002 | Martin | 345/213 |
| 6,501,310 | B2* | 12/2002 | Takami | 327/160 |
| 6,694,518 | B1* | 2/2004 | Dulac | 725/136 |
| 6,963,968 | B2* | 11/2005 | Kori | 713/1 |
| 2001/0036193 | A1* | 11/2001 | Kori | 370/402 |
| 2002/0118762 | A1* | 8/2002 | Shakiba et al. | 375/240.28 |

OTHER PUBLICATIONS

*High-Bandwith Digital Content Protection System Revision 1.0 Erratum*, by Intel Corporation, Mar. 19, 2001, pp. 1-9.

*Upstream Link for High-bandwidth Digital Content Protection*, Revision 1.00, by Intel Corporation, Jan. 26, 2001, pp. 1-38.

Lieberman, David "PC Video Interface Looks to Add Audio Capability", *EE Times* (Mar. 26, 2001, 11:57 a.m. EST), pp. 1-3, downloaded from the Internet on May 23, 2001 from http://www.eetimes.com/story/OEG20010326S0029.

Silicon Image, Inc., "*Silicon Image First to Couple Digital Audio and Video on the DVI Link*", Sunnyvale, Jan. 16, 2001, pp. 1-4, downloaded from the Internet on May 22, 2001 from http://www.siimage.com/press/01_16_01.asp.

Silicon Image, Inc., "*CE Industry Heavyweights Proclaim DVI HDCP as the Interface for HDTV-Further Propelling Silicon Image into the CE Space*", Las Vegas, Jan. 4, 2001, pp. 1-4, downloaded from the Internet on May 22, 2001 from http://www.siimage.com/press/01_04_01a.asp.

* cited by examiner

| INPUT | B0 | B1 | B2 | B3 | B4 | B5 | B6 | B7 | K0 | K1 | K2 | K3 | K4 | K5 | K6 | K7 |
|---|---|---|---|---|---|---|---|---|---|---|---|---|---|---|---|---|
| ORIGIN | Bz | Bz | Bz | Bz | Bz | Bz | Bz | By | Kz | Kz | Kz | Kz | Kz | Kz | Kz | Ky |
| OUTPUT BIT | | | | | | | | | | | | | | | | |
| 0 | 17 | 26 | 22 | 27 | 21 | 18 | 2 | 5 | 3 | 6 | 0 | 9 | 4 | 22 | 5 | 10 |
| 1 | 5 | 20 | 15 | 24 | 2 | 25 | 0 | 16 | 20 | 18 | 7 | 23 | 15 | 5 | 3 | 25 |
| 2 | 22 | 5 | 14 | 16 | 25 | 17 | 20 | 11 | 7 | 19 | 2 | 10 | 22 | 4 | 13 | 21 |
| 3 | 19 | 3 | 15 | 11 | 21 | 16 | 27 | 1 | 6 | 14 | 9 | 8 | 17 | 18 | 12 | 24 |
| 4 | 19 | 6 | 17 | 18 | 22 | 7 | 9 | 12 | 25 | 6 | 5 | 2 | 10 | 15 | 21 | 8 |
| 5 | 3 | 7 | 4 | 8 | 16 | 6 | 5 | 17 | 27 | 14 | 2 | 4 | 24 | 19 | 1 | 12 |
| 6 | 8 | 21 | 27 | 2 | 11 | 24 | 12 | 3 | 17 | 26 | 4 | 16 | 27 | 7 | 22 | 11 |
| 7 | 9 | 5 | 7 | 4 | 8 | 13 | 3 | 15 | 9 | 10 | 19 | 11 | 7 | 6 | 8 | 23 |
| 8 | 26 | 13 | 23 | 10 | 11 | 7 | 15 | 19 | 13 | 12 | 18 | 24 | 15 | 23 | 7 | 16 |
| 9 | 1 | 0 | 19 | 11 | 13 | 16 | 24 | 18 | 0 | 5 | 20 | 25 | 1 | 24 | 9 | 27 |
| 10 | 26 | 13 | 9 | 14 | 10 | 4 | 1 | 2 | 14 | 23 | 27 | 25 | 17 | 19 | 1 | 22 |
| 11 | 21 | 15 | 5 | 3 | 13 | 25 | 16 | 27 | 6 | 21 | 17 | 15 | 26 | 11 | 16 | 7 |
| 12 | 20 | 7 | 18 | 12 | 17 | 1 | 16 | 0 | 11 | 22 | 20 | 0 | 26 | 23 | 17 | 2 |
| 13 | 14 | 23 | 1 | 12 | 24 | 6 | 18 | 9 | 8 | 4 | 3 | 14 | 20 | 26 | 23 | 15 |
| 14 | 19 | 6 | 21 | 25 | 23 | 1 | 10 | 8 | 19 | 0 | 18 | 2 | 13 | 8 | 24 | 14 |
| 15 | 3 | 0 | 27 | 23 | 19 | 8 | 4 | 7 | 16 | 21 | 24 | 25 | 12 | 27 | 15 | 18 |
| 16 | 6 | 5 | 14 | 22 | 24 | 18 | 2 | 21 | 3 | 5 | 8 | 25 | 7 | 27 | 2 | 26 |
| 17 | 3 | 4 | 2 | 6 | 22 | 14 | 12 | 26 | 11 | 14 | 23 | 17 | 22 | 13 | 19 | 4 |
| 18 | 25 | 21 | 19 | 9 | 10 | 15 | 13 | 22 | 1 | 16 | 14 | 11 | 12 | 6 | 10 | 19 |
| 19 | 23 | 11 | 10 | 20 | 1 | 12 | 14 | 4 | 21 | 1 | 10 | 20 | 18 | 26 | 9 | 13 |
| 20 | 11 | 26 | 20 | 17 | 8 | 23 | 0 | 24 | 20 | 21 | 9 | 25 | 12 | 3 | 15 | 0 |
| 21 | 9 | 17 | 26 | 4 | 27 | 0 | 15 | 6 | 18 | 12 | 21 | 27 | 1 | 16 | 24 | 20 |
| 22 | 22 | 12 | 2 | 10 | 7 | 20 | 25 | 13 | 13 | 0 | 3 | 16 | 22 | 11 | 26 | 9 |
| 23 | 27 | 24 | 26 | 8 | 0 | 9 | 18 | 23 | 2 | 0 | 13 | 5 | 4 | 8 | 10 | 3 |

FIG. 5
(PRIOR ART)

METHOD AND APPARATUS FOR SYNCHRONIZING AUXILIARY DATA AND VIDEO DATA TRANSMITTED OVER A TMDS-LIKE LINK

TECHNICAL FIELD OF THE INVENTION

The invention pertains to transmission of auxiliary data (e.g., one or both of audio data and control information) with video data over a serial link, regeneration of a clock for the auxiliary data (distinct from a clock for the video data) at the receiver, and performance of error detection and correction on the transmitted auxiliary data. In some embodiments, the serial link is a transition minimized differential signaling ("TMDS") link, or a link having some but not all of the characteristics of a TMDS link.

BACKGROUND OF THE INVENTION

Elements of this invention are based upon different properties of a serial link. Various serial links for transmitting data and clock signals are well known.

One conventional serial link, used primarily for high-speed transmission of video data from a host processor (e.g., a personal computer) to a monitor, is known as a transition minimized differential signaling interface ("TMDS" link). The characteristics of a TMDS link include the following:

1. video data are encoded and then transmitted as encoded words (each 8-bit word of digital video data is converted to an encoded 10-bit word before transmission);
   a. the encoding determines a set of "in-band" words and a set of "out-of-band" words (the encoder can generate only "in-band" words in response to video data, although it can generate "out-of-band" words in response to control or sync signals. Each in-band word is an encoded word resulting from encoding of one input video data word. All words transmitted over the link that are not in-band words are "out-of-band" words);
   b. the encoding of video data is performed such that the in-band words are transition minimized (a sequence of in-band words has a reduced or minimized number of transitions);
   c. the encoding of video data is performed such that the in-band words are DC balanced (the encoding prevents each transmitted voltage waveform that is employed to transmit a sequence of in-band words from deviating by more than a predetermined threshold value from a reference potential. Specifically, the tenth bit of each "in-band" word indicates whether eight of the other nine bits thereof have been inverted during the encoding process to correct for an imbalance between running counts of ones and zeroes in the stream of previously encoded data bits);
2. the encoded video data and a video clock signal are transmitted as differential signals (the video clock and encoded video data are transmitted as differential signals over conductor pairs without the presence of a ground line);
3. three conductor pairs are employed to transmit the encoded video, and a fourth conductor pair is employed to transmit the video clock signal; and
4. signal transmission occurs in one direction, from a transmitter (typically associated with a desktop or portable computer, or other host) to a receiver (typically an element of a monitor or other display device).

A use of the TMDS serial link is the "Digital Video Interface" interface ("DVI" link) adopted by the Digital Display Working Group. It will be described with reference to FIG. 1. A DVI link can be implemented to include two TMDS links (which share a common conductor pair for transmitting a video clock signal) or one TMDS link, as well as additional control lines between the transmitter and receiver. The DVI link of FIG. 1 includes transmitter 1, receiver 3, and the following conductors between the transmitter and receiver: four conductor pairs (Channel 0, Channel 1, and Channel 2 for video data, and Channel C for a video clock signal), Display Data Channel ("DDC") lines for bidirectional communication between the transmitter and a monitor associated with the receiver in accordance with the conventional Display Data Channel standard (the Video Electronics Standard Association's "Display Data Channel Standard," Version 2, Rev. 0, dated Apr. 9, 1996), a Hot Plug Detect (HPD) line (on which the monitor transmits a signal that enables a processor associated with the transmitter to identify the monitor's presence), Analog lines (for transmitting analog video to the receiver), and Power lines (for providing DC power to the receiver and a monitor associated with the receiver). The Display Data Channel standard specifies a protocol for bidirectional communication between a transmitter and a monitor associated with a receiver, including transmission by the monitor of an Extended Display Identification ("EDID") message that specifies various characteristics of the monitor, and transmission by the transmitter of control signals for the monitor. Transmitter 1 includes three identical encoder/serializer units (units 2, 4, and 5) and additional circuitry (not shown). Receiver 3 includes three identical recovery/decoder units (units 8, 10, and 12) and inter-channel alignment circuitry 14 connected as shown, and additional circuitry (not shown).

As shown in FIG. 1, circuit 2 encodes the data to be transmitted over Channel 0, and serializes the encoded bits. Similarly, circuit 4 encodes the data to be transmitted over Channel 1 (and serializes the encoded bits), and circuit 6 encodes the data to be transmitted over Channel 2 (and serializes the encoded bits). Each of circuits 2, 4, and 6 responds to a control signal (an active high binary control signal referred to as a "data enable" or "DE" signal) by selectively encoding either digital video words (in response to DE having a high value) or a control or synchronization signal pair (in response to DE having a low value). Each of encoders 2, 4, and 6 receives a different pair of control or synchronization signals: encoder 2 receives horizontal and vertical synchronization signals (HSYNC and VSYNC); encoder 4 receives control bits CTL0 and CTL1; and encoder 6 receives control bits CTL2 and CTL3. Thus, each of encoders 2, 4, and 6 generates in-band words indicative of video data (in response to DE having a high value), encoder 2 generates out-of-band words indicative of the values of HSYNC and VSYNC (in response to DE having a low value), encoder 4 generates out-of-band words indicative of the values of CTL0 and CTL1 (in response to DE having a low value), and encoder 6 generates out-of-band words indicative of the values of CTL2 and CTL3 (in response to DE having a low value). In response to DE having a low value, each of encoders 4 and 6 generates one of four specific out-of-band words indicative of the values 00, 01, 10, or 11, respectively, of control bits CTL0 and CTL1 (or CTL2 and CTL3).

It has been proposed to encrypt video data transmitted over a TMDS-like link. For example, it has been proposed to use a cryptographic protocol known as "High-bandwidth Digital Content Protection" ("HDCP") to encrypt digital video to be transmitted over a DVI link and to decrypt the data at the DVI receiver. A DVI transmitter implementing HDCP outputs a 24-bit bus, known as cout[23:0], during the video active period (i.e. when DE is high). This 24-bit cout data is "Exclusive Ored" (in logic circuitry in the transmitter) with the 24-bit RGB video data input to the transmitter in order to encrypt the video data. The encrypted data is then encoded (according to the TMDS standard) for transmission. The same cout data is also generated in the receiver. After the encoded and encrypted data received at the receiver undergoes TMDS decoding, the cout data is processed together with the decoded video in logic circuitry in order to decrypt the decoded data and recover the original input video data.

Before the transmitter begins to transmit HDCP encrypted, encoded video data, the transmitter and receiver communicate bidirectionally with each other to execute an authentication protocol (to verify that the receiver is authorized to receive protected content, and to establish shared secret values for use in encryption of input data and decryption of transmitted encrypted data). After the receiver has been authenticated, the transmitter calculates the initial set of encryption keys (for encrypting the first line of input video data) in response to a control signal (identified as "ctl3" in FIG. 2) and sends the control signal ctl3 to the receiver (during each vertical blanking period, when DE is low) to cause the receiver to calculate an initial set of decryption keys (for decrypting the first received and decoded line of transmitted video data). As shown in the timing diagram of FIG. 2, the control signal "ctl3" is a single high-going pulse. The FIG. 3 circuit responds to each rising edge of control signal "ctl3" (which occurs during each vertical blanking interval). As also shown in the timing diagram of FIG. 2, following generation of the initial set of encryption/decryption keys, each of the transmitter and receiver performs a re-keying operation during each blanking (vertical or horizontal) interval to generate a new set of keys for encrypting (or decrypting) the next line of video data, and actual encryption of input video data (or decryption of received, decoded video data) is performed using the latest set of keys only when DE is high (not during the blanking intervals).

Each of the transmitter and receiver includes an HDCP cipher circuit (sometimes referred to herein as an "HDCP cipher") of the type shown in FIG. 3. The HDCP cipher includes linear feedback shift register (LFSR) module 80, block module 81 coupled to the output of LFSR module 80, and output module 82 coupled to an output of block module 81. LFSR module 80 is employed to re-key block module 81 in response to each assertion of an enable signal (the signal "ReKey" shown in FIG. 3), using a session key (Ks) and frame key (Ki). Block module 81 generates (and provides to module 80) the key Ks at the start of a session and generates (and applies to module 80) a new value of key Ki at the start of each frame of video data (in response to a rising edge of the control signal "ctl3," which occurs in the first vertical blanking interval of a frame) The signal "ReKey" is asserted to module 81 at each falling edge of the DE signal (i.e., at the start of each vertical and each horizontal blanking interval), and at the end of a brief initialization period (during which module 81 generates updated values of keys Ks and Ki) after each rising edge of signal "ctl3."

Module 80 consists of four linear feedback shift registers (having different lengths) and combining circuitry coupled to the shift registers and configured to assert a single output bit per clock interval to block module 81 during each of a fixed number of clock cycles (e.g., 56 cycles) commencing on each assertion of the signal "ReKey" when DE is high (i.e., at the start of each line of video data). This output bit stream is employed by block module 81 to re-key itself just prior to the start of each line of video data.

Block module 81 comprises two halves, "Round Function K" and "Round Function B," as shown in FIG. 4. Round Function K includes 28-bit registers Kx, Ky, and Kz, seven S-Boxes (each a 4 input bit by 4 output bit S-Box including a look-up table) collectively labeled "S-Box K" in FIG. 4, and linear transformation unit K, connected as shown. Round Function B includes 28-bit registers Bx, By, and Bz, seven S-Boxes (each a 4 input bit by 4 output bit S-Box including a look-up table) collectively labeled "S-Box B" in FIG. 4, and linear transformation unit B, connected as shown. Round Function K and Round Function B are similar in design, but Round Function K performs one round of a block cipher per clock cycle to assert a different pair of 28-bit round keys (Ky and Kz) each clock cycle in response to the output of LFSR module 80, and Round Function B performs one round of a block cipher per clock cycle, in response to each 28-bit round key Ky from Round Function K and the output of LFSR module 80, to assert a different pair of 28-bit round keys (By and Bz) each clock cycle. The transmitter generates value An at the start of the authentication protocol and the receiver responds to it during the authentication procedure. The value An is used to randomize the session key. Block module 81 operates in response to the authentication value (An) and an initialization value (Mi, also referred to as an integrity verification key) which is updated by output module 82 at the start of each frame (at each rising edge of the control signal "ctl3").

Each of linear transformation units K and B outputs 56 bits per clock cycle. These output bits are the combined outputs of eight diffusion networks in each transformation unit. Each diffusion network of linear transformation unit K produces seven output bits in response to seven of the current output bits of registers Ky and Kz. Each of four of the diffusion networks of linear transformation unit B produces seven output bits in response to seven of the current output bits of registers By, Bz, and Ky, and each of the four other diffusion networks of linear transformation unit B produces seven output bits in response to seven of the current output bits of registers By and Bz.

In Round Function K, one bit of register Ky takes its input from the bit stream asserted by module 80 when the ReKey signal is asserted. In Round Function B, one bit of register By takes its input from the bit stream asserted by module 80 when the ReKey signal is asserted.

Output module 82 performs a compression operation on the 28-bit keys (By, Bz, Ky and Kz) asserted to it (a total of 112 bits) by module 81 during each clock cycle, to generate one 24-bit block of pseudo-random bits cout[23:0] per clock cycle. Each of the 24 output bits of module 82 consists of the exclusive OR ("XOR") of nine terms as follows: (B0*K0)+(B1*K1)+(B2*K2)+(B3*K3)+(B4*K4)+(B5*K5)+(B6*K6)+(B7)+(K7), where "*" denotes a logical AND operation and "+" denotes a logical XOR operation. FIG. 5 specifies the input values B0-B7 and K0-K7 in the preceding expression for generating each of the 24 output bits of module 82. For example, FIG. 5 indicates that in order to generate output bit 0 (i.e., cout(0)), B0 is the seventeenth bit of register Bz, K0 is the third bit of register Kz, B1 is the twenty-sixth bit of register Bz, and so on.

In the transmitter, logic circuitry 83 (shown in FIG. 3) receives each 24-bit block of cout data and each input 24-bit RGB video data word, and performs a bitwise XOR operation thereon in order to encrypt the video data, thereby generating a word of the "data_encrypted" data indicated in FIG. 3. Typically, the encrypted data subsequently undergoes TMDS encoding before it is transmitted to a receiver. In the receiver, logic circuitry 83 (shown in FIG. 3) receives each 24-bit block of cout data and each recovered 24-bit RGB video data word (after the recovered data has undergone TMDS decoding), and performs a bitwise XOR operation thereon in order to decrypt the recovered video data.

Throughout the specification and in the claims the expression "TMDS-like link" will be used to denote a serial link, capable of transmitting digital video data (and a clock for the digital video data) from a transmitter to a receiver, and optionally also transmitting one or more additional signals (bidirectionally or unidirectionally) between the transmitter and receiver, that is or includes either a TMDS link or a link having some but not all of the characteristics of a TMDS link.

There are several conventional TMDS-like links. One type of TMDS-like link is the set of serial links known as Low Voltage Differential Signaling ("LVDS") links (e.g., "LDI," the LVDS Display Interface), each of which satisfies the TIA/EIA-644 standard or the IEEE-1596.3 standard. In each system including an LVDS link, the data are sent on a high speed differential link with a synchronous clock. There is a single clock line with a four to three duty cycle and several different combinations of data lines depending on the data rate and bit depth. An LVDS link is a serial and differential video link, but the video data transmitted over an LVDS link is not encoded.

Other TMDS-like links encode input video data and other data to be transmitted into encoded words comprising more bits than the incoming data using a coding algorithm other than the specific algorithm used in a TMDS link, and transmit the encoded video data as in-band characters and the other encoded data as out-of-band characters. The characters need not be classified as in-band or out-of-band characters based according to whether they satisfy transition minimization and DC balance criteria. Rather, other classification criteria could be used. An example of an encoding algorithm, other than that used in a TMDS link but which could be used in a TMDS-like link, is IBM 8b10b coding. The classification (between in-band and out-of-band characters) need not be based on just a high or low number of transitions. For example, the number of transitions of each of the in-band and out-of-band characters could (in some embodiments) be in a single range (e.g., a middle range defined by a minimum and a maximum number of transitions).

The data transmitted between the transmitter and receiver of a TMDS-like link can, but need not, be transmitted differentially (over a pair of conductors). Although the differential nature of TMDS is important in some applications, it is contemplated that some TMDS-like links will transmit data other than differential data. Also, although a TMDS link has four differential pairs (in the single pixel version), three for video data and the other for a video clock, a TMDS-like link could have a different number of conductors or conductor pairs.

The primary data transmitted by a TMDS link is video data. What is often significant about this is that the video data is not continuous, and instead has blanking intervals. These blanking intervals provide an opportunity (exploited in some embodiments of the present invention) for auxiliary data to be transported, and they represent unused bandwidth. However, many TMDS-like serial links do not transmit data having blanking intervals, and thus do not encode input data (for transmission) in response to a data enable signal. For example, the audio serial links known as 12S and S/PDIF transmit continuous data.

The expression "auxiliary data" is used in a broad sense herein to denote digital audio data or any other type of data other than video data and timing information for video data (e.g., a video clock). For example, timing information for audio data (e.g., a clock for recovering transmitted audio data) falls within the scope of "auxiliary data." Other examples of "auxiliary data" transmitted in accordance with the invention include computer keyboard signals, still image data (generated by a camera, for example), text data, control signals for a power supply, picture in picture data, monitor control information (audio volume, brightness, power state), control signals for indicator lights on a monitor or keyboard, non-audio or video control information, etc.

The term "stream" of data, as used herein, denotes that all the data are of the same type and is transmitted with the same clock frequency. The term "channel," as used herein, refers to that portion of a TMDS-like link that is employed to transmit data (e.g., a particular conductor or conductor pair between the transmitter and receiver over which the data are transmitted, and specific circuitry within the transmitter and/or receiver used for transmitting and/or recovery of the data) and to the technique employed to transmit the data over the link. Because it is desirable to transmit many different streams of auxiliary data in important applications of the invention, preferred embodiments of the invention provide multiple channels for transmission of auxiliary data, including channels for transmission of auxiliary data in both directions over the link (that is, with and against the direction of the video data). In some implementations, a channel is employed to transmit one stream of auxiliary data. In other implementations, a channel is employed to transmit more than one stream of auxiliary data.

SUMMARY OF THE INVENTION

In a class of embodiments, the invention is a communication system including a transmitter, a receiver, and a TMDS-like link, in which video data and auxiliary data (often including timing data associated with other auxiliary data) are transmitted from the transmitter to the receiver, or in which video data are transmitted over the link from the transmitter to the receiver, and auxiliary data (often including timing data associated with other auxiliary data) are transmitted from the receiver to the transmitter (or from the transmitter to the receiver and also from receiver to the transmitter). In typical embodiments the auxiliary data include one or more streams of audio data.

Other aspects of the invention are transmitters for use in such systems, receivers for use in such systems, and methods for sending auxiliary data and video data over a TMDS-like communication link, methods for transmitting and recovering clocks for auxiliary data transmitted over such a link, methods for synchronizing auxiliary data transmitted over such a link with video data transmitted over such a link, and methods for generating clocks having frequency closely matching the rate at which auxiliary data are transmitted over such a link.

In one embodiment of the inventive system, the transmitter transmits a video clock to the receiver over a video clock channel of a TMDS-like link, at least one of the transmitter and receiver transmits at least one stream of auxiliary data to the other one of the transmitter and the receiver over the link, and at least one of the transmitter and the receiver transmits over the video clock channel at least one auxiliary clock for the auxiliary data.

In another embodiment, the transmitter transmits auxiliary data and a video clock to the receiver over a TMDS-like link, and a frequency synthesizer including a dual-modulus frequency divider is employed to generate (from a recovered version of the video clock) an auxiliary clock for auxiliary data transmitted over the link.

In other embodiments, time stamp data (or frequency data) transmitted over a TMDS-like link are employed to recover a clock for auxiliary data transmitted over the link. The time stamp data are indicative of times at which packets of the auxiliary data are transmitted by the transmitter. The frequency data are indicative of the auxiliary data rate at which packets of the auxiliary data are transmitted by the transmitter.

In other embodiments, packets of the auxiliary data that have been transmitted over a TMDS-like link are received in a FIFO. The packets are clocked out of the FIFO at a clock frequency determined in response to a feedback signal, so that at any instant the FIFO is filled up to a level with a number of the packets. The feedback signal is indicative of such level or a rate of change of such level.

In other embodiments, video data and auxiliary data are transmitted from a transmitter to a receiver over a TMDS-like communication link, the receiver generates an auxiliary clock whose frequency closely matches the auxiliary data rate, and the receiver transmits the auxiliary clock back to the transmitter over a back channel of the link.

BRIEF DESCRIPTION OF THE DRAWINGS

FIG. 5 is a table of values employed by module 82 of FIG. 3 to operate on the values asserted thereto by module 81.

DETAILED DESCRIPTION OF THE PREFERRED EMBODIMENTS

Figure 1:
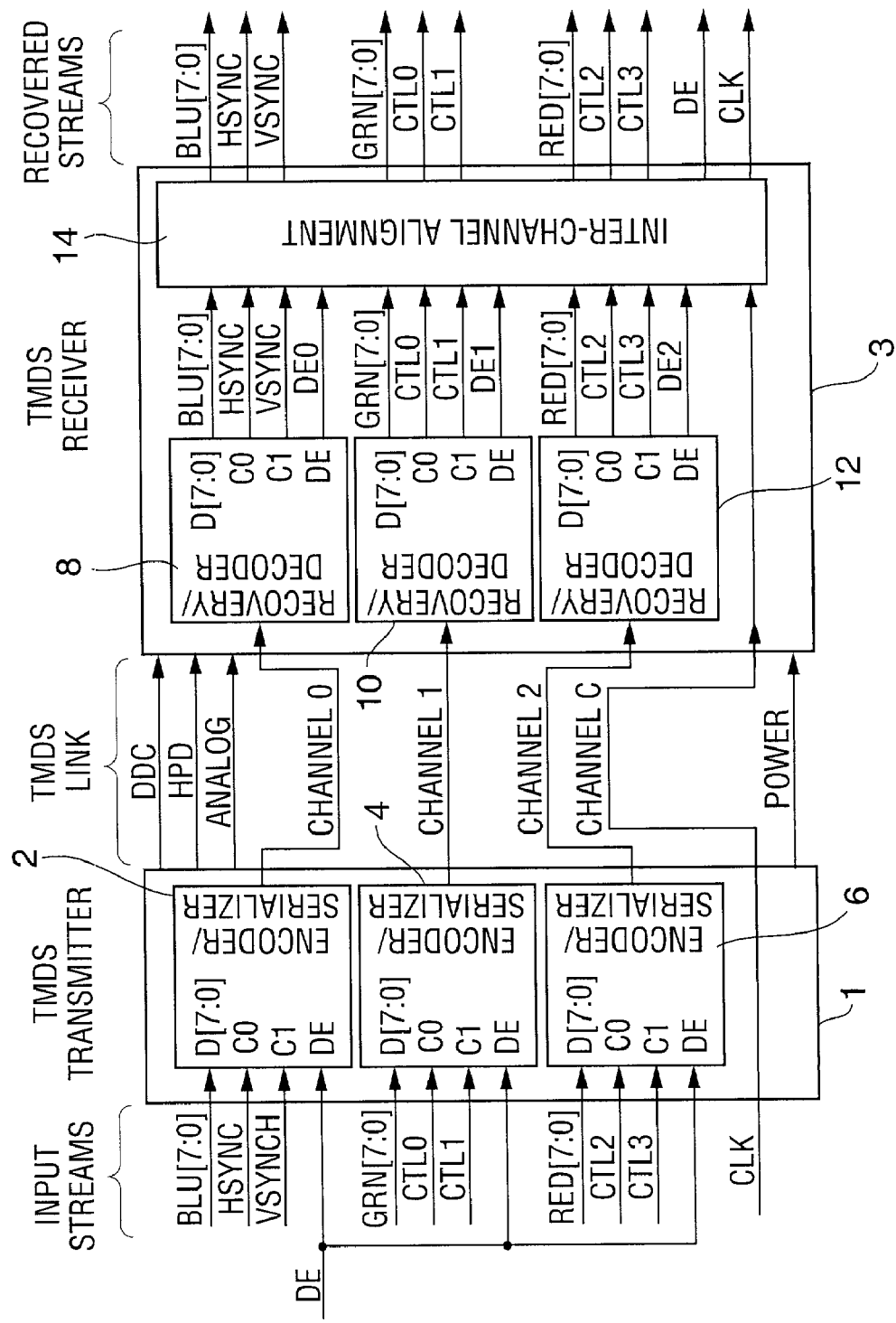
FIG. 1 is a block diagram of a conventional system including a Digital Video Interface ("DVI") link.

It should be appreciated that the term "transmitter" is used herein in a broad sense to denote any unit capable of transmitting data over a TMDS-like link (and optionally also encoding and/or encrypting the data to be transmitted), and the term "receiver" is used herein in a broad sense to denote any unit capable of receiving data that has been transmitted over a TMDS-like link (and optionally also decoding and/or decrypting the received data). For example, the term transmitter can denote a transceiver that performs the functions of a receiver as well as the functions of a transmitter. In a more specific example, the term transmitter (with reference to a unit that transmits non-audio auxiliary data over a TMDS-like link) can denote a transceiver that is configured to receive video data and audio data over the link and to transmit the non-audio auxiliary data over the link.

As noted above, the term "stream" of data (as used herein) denotes that all the data are of the same type and is transmitted with the same clock frequency, and the term "channel" (as used herein) refers to that portion of a TMDS-like link that is employed to transmit data (e.g., a particular conductor or conductor pair between the transmitter and receiver over which the data are transmitted, and specific circuitry within the transmitter and/or receiver used for transmitting and/or recovery of the data) and to the technique employed to transmit the data over the link.

When transmitting audio data via a TMDS-like link, is it often desired to transmit multiple streams of the audio data, and it is often valuable for multiple channels of the link to be available for transmission of the audio data. For example, there can be two audio streams (left and right streams of stereo audio), six streams (e.g., those of "5.1" surround sound), or up to eight streams (e.g., those of "7.1" surround sound). Alternatively, it may be desired to transmit even more streams of audio data with video, or to transmit streams of non-audio auxiliary data (for providing non-audio effects that are synchronized to the video) with audio and video. All such streams of auxiliary data are typically on the same time base, but alternatively there can be a need for some of the audio (or other auxiliary) data to be based upon another time base, or to have a different sampling rate. For example transmission of six streams of pulse code modulated (PCM) audio data over the link can be based upon one clock. Another two streams of compressed audio data, possibly a down-mix (for playback on a reduced number of speakers), might be transmitted with the video and PCM data as well.

Because of the preexistence of video systems without auxiliary data paths, preferred embodiments of the invention are compatible ("backwards compatible") with such preexisting systems. For example, preferred embodiments of the inventive transmitter are configured to transmit both video and auxiliary data over a TMDS-like link to a receiver capable of recovering both the video and auxiliary data, and to transmit only the video to a conventional receiver (incapable of recovering the auxiliary data) without interfering with the conventional operation of the latter receiver. More generally, operation of a system embodying the invention to transmit auxiliary data over a link (and recover the transmitted auxiliary data) preferably does not interfere with any of the conventional operations of the system (e.g., video data transmission) and vice versa.

I. Transmission and Recovery of a Clock for Audio (or other Auxiliary) Data Transmitted over a Link Clock regeneration is necessary for setting the output clock rate for the streams of audio (or other auxiliary) data transmitted over a TMDS-like link. The rate of the clock recovered at the receiver for each stream of auxiliary data (the "output clock rate" for the auxiliary data stream) can change over time and these rates will not necessarily be related for multiple streams of auxiliary data. In various embodiments of the invention, one, two, or more than two auxiliary streams are transmitted over each of one or more channels. For example, audio data transmitted in a channel can comprise one, two, or more than two streams (e.g., left and right channels of stereo audio, or five or six channels of home theater or "surround" audio).

For simplicity, many of the embodiments described herein are described with reference to transmission of "audio" data (and video data) over a TMDS-like link. It should be appreciated that variations on the described embodiments, in which non-audio auxiliary data (auxiliary data other than audio data) are transmitted rather than audio data, are within the scope of the invention.

Figure 6:
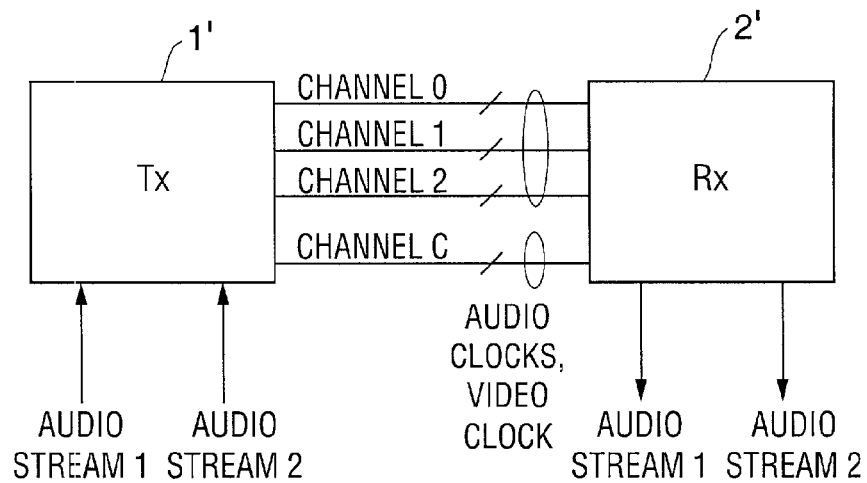
FIG. 6 is a block diagram of a first embodiment of the inventive system.

In a class of embodiments of the invention, a TMDS-like link (e.g., a DVI link) transmits auxiliary data and video data over one or more TMDS links (e.g., the TMDS link between transmitter 1' and receiver 2' of FIG. 6, whose DDC, HPD, Power, and Analog Video lines are not shown for simplicity). Each TMDS link that transmits a stream of the auxiliary data transmits a clock for the auxiliary data over a conductor pair (e.g., Channel C of the TMDS link of FIG. 6) over which it also transmits a video clock. For example, the auxiliary data (which can be audio data) is transmitted discontinuously (e.g., in the blanking periods of the video data) over a first set of conductor pairs of the link (e.g., one or more of Channels 0, 1, and 2 of the TMDS link of FIG. 6) while another conductor pair of the link (e.g., Channel C of FIG. 6) continuously transmits both a video clock (e.g., determined by the rising edges of a binary waveform) and a clock for the auxiliary data (e.g., by modulating the falling edges of the binary waveform). PCT International Application Publication Number WO 00/16525, published on Mar. 23, 2000 and assigned to the assignee of the present invention, discloses several techniques for modulating a binary signal transmitted over such a video clock channel to generate a modulated signal indicative of data as well as a video clock (as well as several techniques for extracting both the data and the video clock at a receiver following transmission of the modulated signal).

It is advantageous to send the auxiliary clock of the present invention on a continuous channel while transmitting auxiliary data (which can be easily buffered) on an intermittent channel (i.e., only during blanking intervals when a video data enable signal DE is low), to exploit the advantages of the properties of both the continuous and intermittent channels. For example, in the TMDS link of FIG. 6 (which is a "TMDS-like link" by definition), transmitter 1' transmits video data to receiver 2' over Channels 0, 1, and 2 (which are identical to the identically numbered channels of the FIG. 1 system) except during video blanking intervals, transmits two streams of audio data (e.g., left and right stereo signals) over Channels 0, 1, and 2 to receiver 2' during the video blanking intervals, and transmits both a video clock and an audio clock continuously over Channel C (which is identical to the identically identified channel of the FIG. 1 system). The video blanking intervals of a TMDS-like link (e.g., that of FIG. 6) provide a large bandwidth for sending audio data (but are not continuous), while the video clock channel of a TMDS-like link (e.g., Channel C of FIG. 6) is continuous and therefore better for sending timing information (such as a sampling clock for one or more streams of audio data or other auxiliary data, as well as a video clock).

Typically the clock for a stream of audio data has a much lower frequency than the pixel clock for a stream of video. However, in most applications the audio clock needs to be more accurate than the pixel clock, to reduce jitter. This is true since distortion in analog audio (that has been generated from digital audio data having jitter) is more easily discernible (to one experiencing the analog audio) than is the distortion in a displayed video program generated from digital video having the same amount of jitter.

In a class of embodiments in which a transmitted video clock (having frequency f1) is defined by the rising edges of a binary signal transmitted over Channel C of FIG. 6, transmitter 1' of FIG. 6 is configured in accordance with the invention to assert an "auxiliary clock" (a clock for one or more auxiliary data streams, e.g., the two streams of audio data asserted over Channel 0, 1, and 2) having frequency f2=f1/N, where N is an integer, by modulating the falling edges of the binary signal transmitted over Channel C. The falling edge modulation can be accomplished using a second clock having frequency f3 which is triple the video clock frequency (f3=3f1), or using a set of three phase-shifted versions of a square wave (each out of phase by ±120 degrees relative to the others) including a first square wave whose rising edges coincide with those of the video clock. Logic circuitry in transmitter 1' causes each falling edge of the video clock to coincide either with the first rising edge of the second clock after a video clock rising edge (or with a falling edge of one of the square waves having phase shifted by 120 degrees relative to that of the first square wave) to indicate an edge of the auxiliary clock, or with the second rising edge of the second clock after the video clock's rising edge (or with a falling edge of another one of the square waves, having phase shifted by 240 degrees relative to that of the first square wave) to indicate absence of an edge of the auxiliary clock. Receiver 2' is configured with logic circuitry for demodulating the binary signal received on channel C to extract both the video clock and auxiliary clock from it.

More generally, in a class of embodiments in which the transmitter of the inventive TMDS-like link sends a video clock defined by periodic edges (e.g., rising edges) or periodic pulses of a binary signal, the transmitter inserts a data structure in this binary signal just after each periodic pulse or edge (e.g., each rising edge) of the video clock. The data structure (sometimes referred to herein as a "packet") indicates one or more precise times following one of the video clock signal's periodic pulses or edges (e.g., rising edges), and thus can define a single auxiliary clock or multiple auxiliary clocks (such that the multiple auxiliary clocks do not collide). The information on the exact location of transitions of each of two or more clocks can be coded in such a packet, with a time reference based upon the location of a first transition in the packet (or another point in the packet). This can be appreciated by inspection of FIG. 7.

Figure 7:
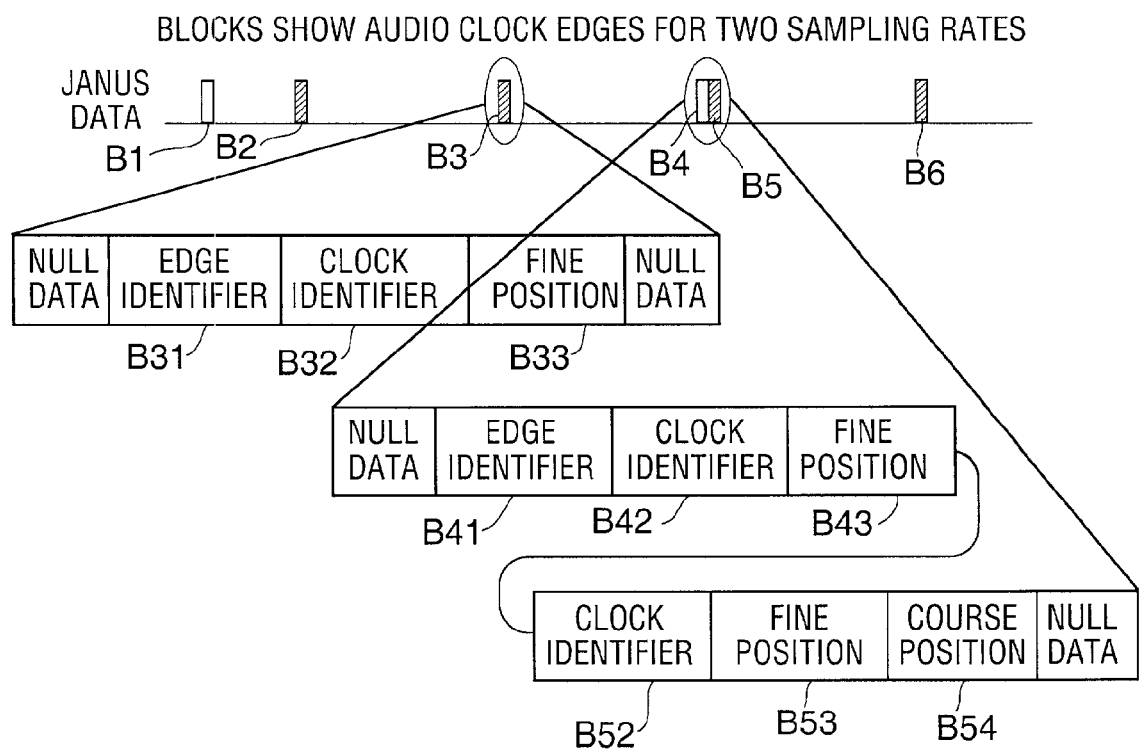
FIG. 7 is a diagram showing data packets transmitted over channel C during operation of an implementation of the FIG. 6 system.

FIG. 7 shows data packets transmitted over channel C during operation of an implementation of the system of FIG. 6. As noted above, the FIG. 6 system transmits auxiliary data (audio data) during the video blanking intervals (when DE is low) and transmits video data when DE is high, and continuously transmits a binary signal over Channel C (regardless of the state of signal DE.). In the implementation of FIG. 6 that is assumed by FIG. 7, the binary signal transmitted over Channel C defines two auxiliary clocks (having different frequencies) as well as a video clock (whose frequency is greater than that of either of the auxiliary clocks). FIG. 7 does not show the video clock (pixel clock) itself, which is defined by periodic pulses or edges (e.g., periodically occurring rising edges) of the signal transmitted over Channel C. Rather, FIG. 7 shows a sequence of data structures (e.g., those labeled B1, B2, B3, B4, B5, and B6), each transmitted over Channel C after one of the periodic pulses or edges that determine the video clock. These data structures determine the two auxiliary clocks: a first auxiliary clock (determined by data structures including those labeled B1 and B4, and having a relatively low clock rate), and a second auxiliary clock (determined by data structures including those labeled B2, B3, B5, and B6, and having a relatively high clock rate). Each data structure that pertains to a single one of the audio clocks (e.g., data structure B1 which pertains to the first auxiliary clock, or data structure B2 or B3, each of which pertains to the second auxiliary clock) is indicative of an edge identifier (B31), followed by a clock identifier (B32), followed by fine position data (B33). Each data structure that pertains to both auxiliary clocks (e.g., the combination of data structures B4 and B5, which occurs between consecutive ones of the rising edges that determine the video clock) is indicative of an edge identifier (B41), followed by a clock identifier (B42) identifying the first auxiliary clock, followed by fine position data (B43) for the first auxiliary clock, followed by a clock identifier (B52) identifying the second auxiliary clock, followed by fine position data (B53) for the second auxiliary clock, followed by coarse position data (B54). Null data precedes and follows each of data structures B1, B2, B3, B4, B5, and B6. Indeed, the intervals between most pairs of consecutive rising edges of the video clock on Channel C contain null data only, and block structures containing data other than null data are included in the intervals between only a relatively small number of the pairs of consecutive rising edges of the video clock.

Each edge identifier (e.g., B31 or B41) can be a single "1" bit or another signal distinguishable from null data. Each clock identifier (e.g., B32, B42, or B52) indicates which auxiliary data stream the clock edge is associated with. The fine position data (B33, B43, or B53) gives the position of the actual auxiliary clock edge with respect to the preceding pixel clock rising edge (or with respect to some well-defined point in the data structure) using a predetermined division of the pixel clock period (known to both the transmitter and receiver). The number of bits of the fine position data determines the precision with which the fine position data locates the auxiliary clock edge. For example if an 8× clock is used to sample the incoming auxiliary clock at the transmitter, then each word of fine position data (e.g., B33, B43 or B53) is typically a three-bit word, but if the incoming auxiliary clock at the transmitter is sampled with even higher frequency, then each word of fine position data (e.g., B33, B43 or B53) is typically an M-bit word (where M is greater than three) so that it provides enough resolution to position the auxiliary clock edge within the clock cycle.

In the case of overlapping data structures (e.g., packets B4 and B5 in FIG. 7, both of which occur between a single pair of consecutive rising edges of the pixel clock), coarse position data (e.g., B54) can be provided to identify the reference position within the pixel clock cycle (i.e., within the data structure that contains the coarse position data) relative to which the preceding fine position data indicates the location of an auxiliary clock edge.

In variations on any of the embodiments in which an auxiliary data clock (or auxiliary data itself) is determined by locations of rising (or falling) edges of a binary signal having periodic falling (or rising) edges, the auxiliary data clock (or the auxiliary data or both the auxiliary data and auxiliary data clock) is transmitted over the link in the direction opposite to that of video data transmission. In other variations on any of such embodiments, one such auxiliary data clock (or one stream of auxiliary data or both an auxiliary data clock and a stream of auxiliary data) is transmitted over the link in the direction of video data transmission and another such auxiliary data clock (or another stream of auxiliary data, or another auxiliary data clock and another stream of auxiliary data) is transmitted over the link in the direction opposite to that of video data transmission. Above-referenced PCT International Application Publication Number WO 00/16525, published on Mar. 23, 2000, discloses several techniques for modulating such a binary signal (whose periodically occurring rising (or falling) edges determine a video clock) to generate a modulated signal indicative of data as well as the video clock.

The receiver of a TMDS-like link typically generates multiple, phase-shifted versions of a clock having the frequency of the transmitted data to be recovered. For example, such receivers usually employ a PLL or DLL (for data recovery) which generates such multiple, phase-shifted versions of a clock having the frequency of the data to be recovered. In typical implementations of the invention, the "fine position" data sent to the receiver (with each data structure for determining an auxiliary clock) determines the phase, within one clock cycle, of one of such phase-shifted clocks.

In embodiments of the invention in which audio data (or other auxiliary data) as well as video data are transmitted over a TMDS-like link, the output clock frequency for the transmitted audio (auxiliary) data is typically smaller than and will not necessarily divide evenly into the input (or output) video clock frequency (sometimes referred to as the video dot clock frequency). Furthermore, the ratio of output audio clock and input video clock frequencies is not constant but varying according to the condition of the audio data (e.g., audio format, sampling rate, and so on) and the video mode. Therefore, in some embodiments of the inventive TMDS-like link, the receiver employs a "fractional-N" frequency synthesizer of the type shown in FIG. 8 to generate, from a recovered video clock, a recovered audio clock whose frequency is not an integer multiple of the video clock frequency. Such a frequency synthesizer uses a dual-modulus frequency divider (18) at the output of a voltage controlled oscillator (VCO 16) in a phase locked loop (PLL) of the type shown in FIG. 8. The frequency synthesizer includes frequency divider 10 (which receives the recovered video clock having frequency $f_{dck}$ and outputs a clock having frequency $f_{dck}/M$ in response thereto), phase detector 12 (which receives the outputs of frequency dividers 10 and 18, and generates in response a signal indicative of their relative phase), loop filter 14 (which receives and low-pass filters the output of phase detector 12 to generate an error signal indicative of the relative phase of the outputs of dividers 10 and 18), and VCO 16 which asserts an output clock (having frequency $f_{au}$, where subscript "au" denotes "auxiliary") in response to the error signal from filter 14. Frequency divider 18 receives the output clock and outputs a clock having frequency $f_{au}/N$ or $f_{au}/N+1$ in response thereto. With divider 18 operating cyclically with both moduli (modulus N, followed by modulus N+1, followed by modulus N, and so on), control of the duty cycle with which divider 18 operates with modulus N and the duty cycle with which divider 18 operates with modulus N+1 results in the following time-averaged value of the output clock frequency $f_{au}$:

$f_{au}=N'/M*f_{dck}$, with $N<N'<(N+1)$.

For example, if divider 18 operates cyclically as a divide-by-N divider for "A" pulses of the output clock (where A is a positive integer) and then as a divide-by-(N+1) divider for the next "B" pulses of the output clock (where B is a positive integer), then the parameter N' has the value: N'=(A+B)/(A/N+B/(N+1)), which does satisfy N<N'<N+1. The control signal asserted to divider 18 (to determine divider 18's modulus) can be produced as a result of monitoring the input and output data rate, or from the behavior of a FIFO pointer, or from a time stamp check in each received audio data packet, or by any other technique that determines the ratio of input video dot clock frequency and output audio clock frequency. Several of these techniques are described elsewhere in this disclosure. The control signal should provide smooth change or small phase jump so the jitter of the output clock is kept minimal.

Figure 8:
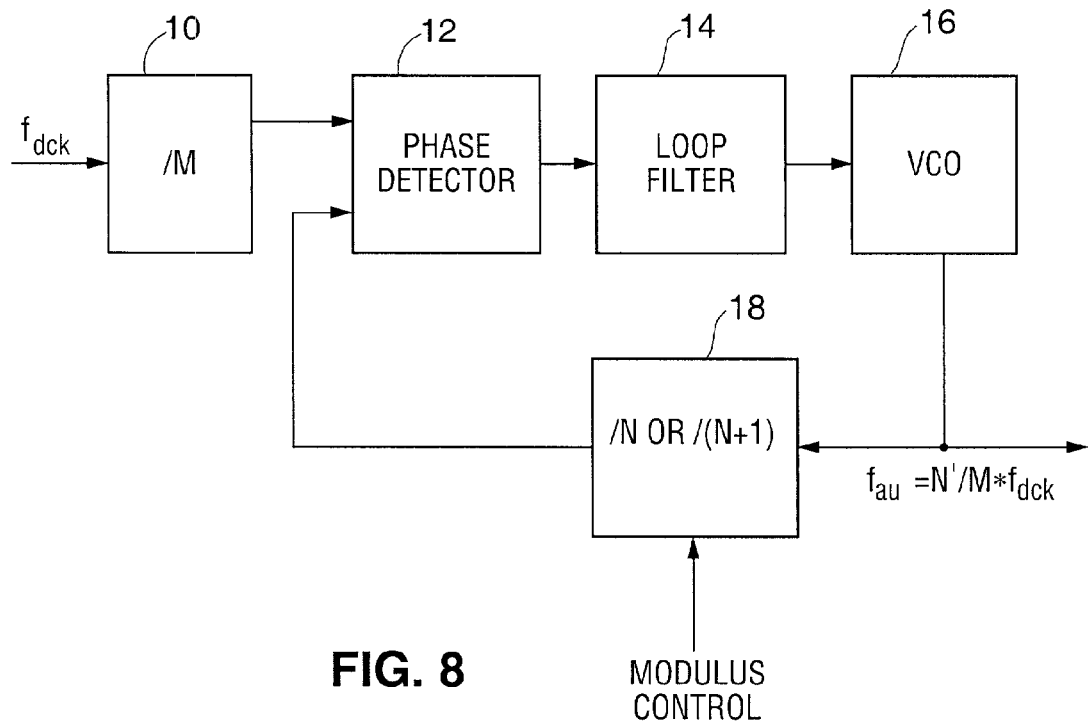
FIG. 8 is a block diagram of a "fractional-N" frequency synthesizer employed in a class of embodiments of the invention to generate a recovered audio clock from a recovered video clock.

Regeneration of an audio clock (for audio data that has been transmitted over a TMDS-like link) from a recovered video clock is a different application than the conventional RF applications of fractional-N frequency synthesizers, in several respects including the following: the input reference clock in RF applications is from a very stable source such as a crystal oscillator, while the frequency of a recovered video clock itself varies by a large factor in this application because it is recovered from a variable video dot clock; the step size of the frequency of the regenerated audio clock does not have to be regular or small enough as in RF applications, and instead the main concern is to minimize the frequency offset of a regenerated audio clock; and the input reference frequency is usually much smaller than the output frequency in RF applications (so that use of a frequency divider such as circuit 10 of FIG. 8 is not necessary in typical RF applications) but in recovering an audio clock for transmitted audio data, the recovered audio clock frequency is usually smaller than the frequency of the recovered video clock (from which the audio clock is regenerated) so that a frequency divider such as circuit 10 of FIG. 8 is necessary.

Frequency divider 10 of FIG. 8 provides one more degree of freedom in frequency synthesis than would be present in a variation on the FIG. 8 system in which divider 10 were replaced by a short circuit.

Figure 9:
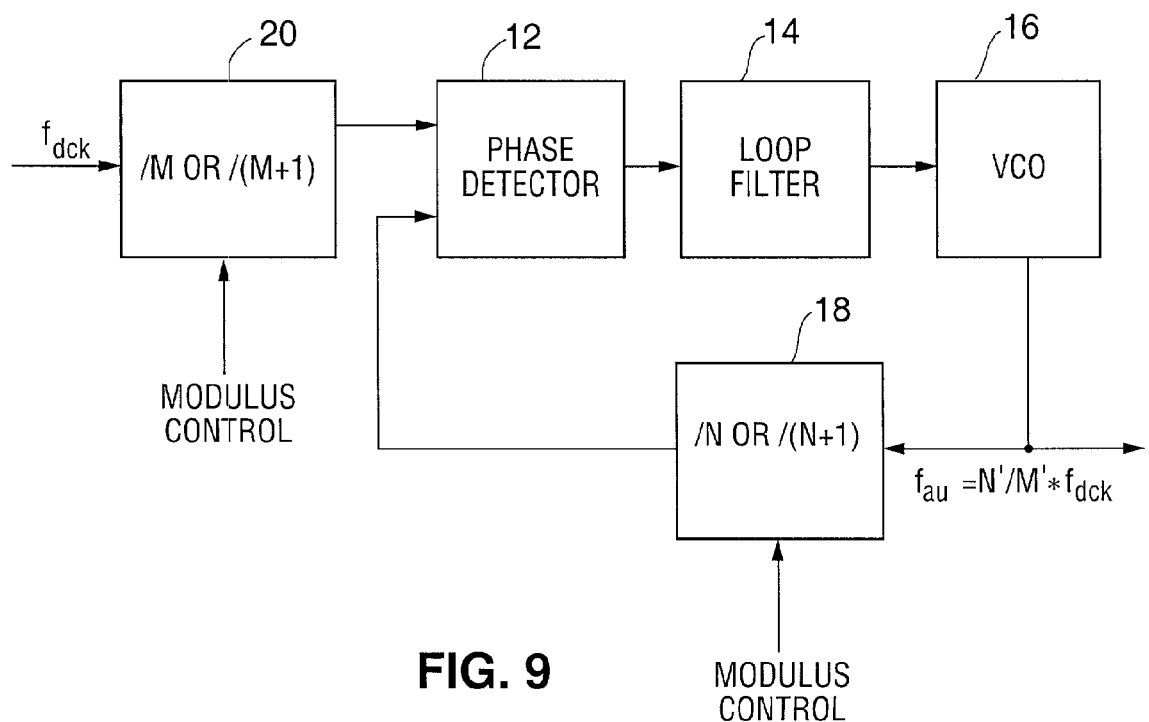
FIG. 9 is a block diagram of a variation on the circuit of FIG. 8.

Next, with reference to FIG. 9 we describe a variation on the FIG. 8 circuit, in which frequency divider 10 is replaced by dual-modulus frequency divider 20. By controlling the modulus of frequency divider 20 as well as the modulus of frequency divider 18, the audio clock recovery circuit of FIG. 9 produces an output audio clock having the frequency:

$f_{au}=N'/M'*f_{dck}$, where $N<N'<(N+1)$ and $M<M'<(M+1)$.

For example, if divider 20 operates cyclically as a divide-by-M divider for "A" pulses of the output clock (where A is a positive integer) and then as a divide-by-(M+1) divider for the next "B" pulses of the output clock (where B is a positive integer), then the parameter M' has the value: M'=(A+B)/(A/M+B/(M+1)), which satisfies M<M'<M+1. Since both N' and M' are already fractional numbers, the FIG. 9 circuit provides finer control over output clock frequency $f_{au}$ than does the FIG. 8 circuit, and thus the FIG. 9 circuit can provide smaller frequency error on output clock frequency $f_{au}$ than can the FIG. 8 circuit.

In typical implementations of TMDS links, a phase-locked loop employed to recover the video clock includes a multi-stage VCO which generates a set of clock signals each offset in phase from the others. If such a multi-phase video clock is available, the audio clock recovery circuitry of the present invention can be implemented (e.g., as in FIG. 10) to use it in order to provide a fractional division ratio at the input side without a dual modulus divider at the input side. The audio clock recovery circuit of FIG. 10 differs from the FIG. 8 circuit only in that the FIG. 10 circuit includes edge combining fractional divider 30 which receives a multi-phase video clock from a multi-stage VCO (not shown) in place of frequency divider 10 of FIG. 8 which receives a single-phase recovered video clock. The multi-phase clock signal received by divider 30 is a set of L clocks, each having the frequency $f_{dck}$ of the recovered video clock but each having a different phase $\phi=\phi_0+2\pi(k/L)$, where the parameter "k" is a non-negative integer in the range $\{0, \ldots, L-1\}$. The particular value of parameter "k" at any time during operation of the FIG. 10 circuit is determined by a modulus control signal asserted to edge-combining fractional divider 30. The output clock frequency ($f_{au}$) produced by the FIG. 10 circuit is:

$f_{au}=N'/(M+k/L)*f_{dck}$, for $N<N'<(N+1)$, where divider 30 is configured to assert (to phase detector 12) a clock having frequency $f_{dck}/M$ in response to a clock (at its input) having frequency $f_{dck}$ and phase $\phi=\phi_0$.

Figure 10:
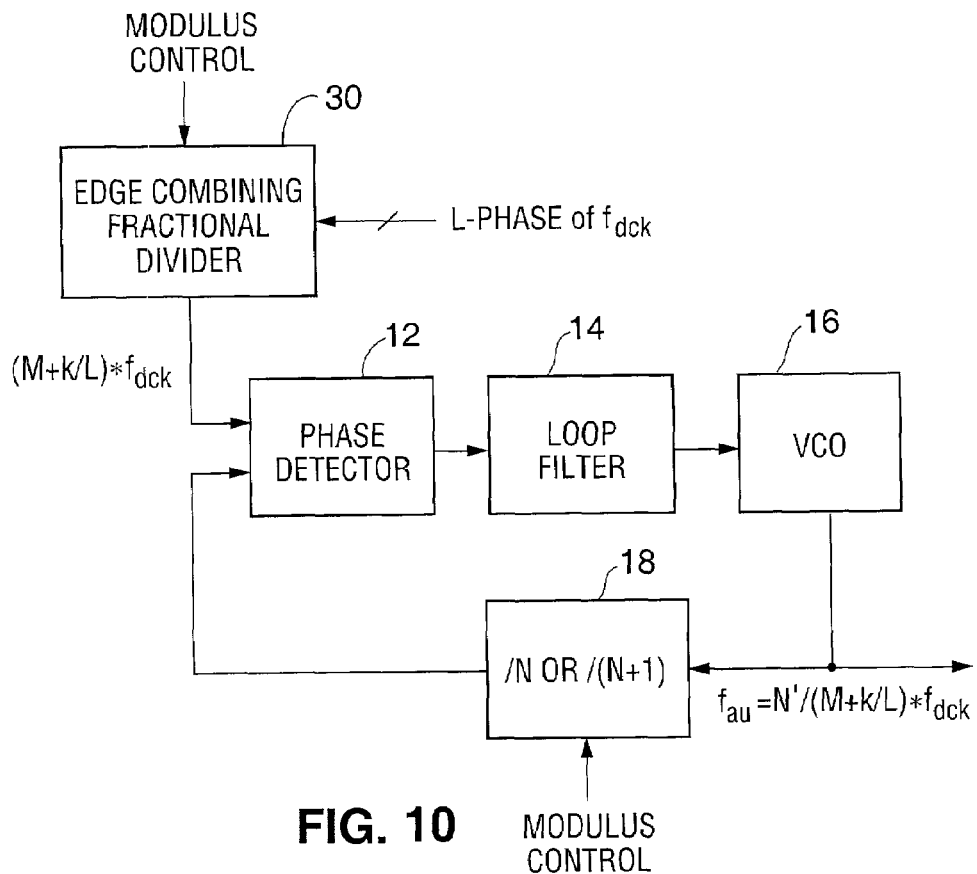
FIG. 10 is a block diagram of another variation on the circuit of FIG. 8.
Figure 11:
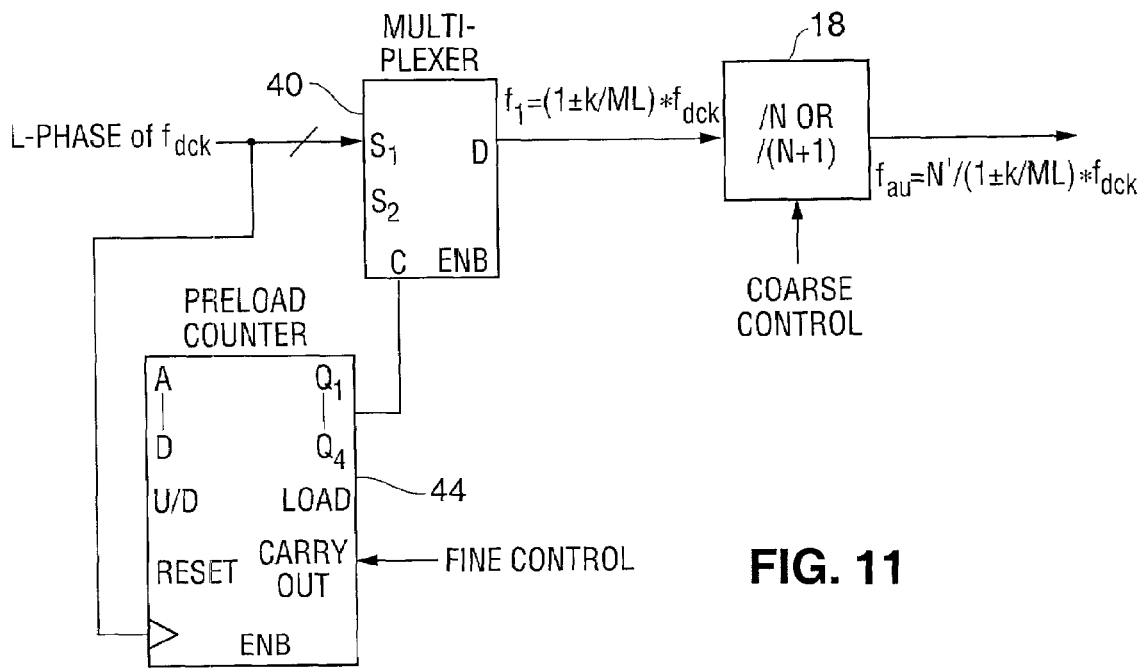
FIG. 11 is a block diagram of a variation on the circuit of FIG. 10.

Next, with reference to FIG. 11, we describe a variation on the embodiment of FIG. 10 which also receives a multi-phase clock signal (which is a set of L clocks, each having the frequency $f_{dck}$ of a recovered video clock but each having a different phase $\phi=\phi_0+2\pi(m/L)$, where the parameter "m" is a non-negative integer in the range $\{0, \ldots, L-1\}$), but which regenerates an audio clock (having frequency $f_{au}$) without using an additional PLL. The FIG. 11 circuit includes multiplexer 40 and preload counter 44 (each coupled to receive the input multi-phase clock signal), and dual-modulus frequency divider 18 (identical to divider 18 of FIG. 8 or FIG. 9). To minimize the cycle-to-cycle jitter, fine control is done by selecting one of the L input clocks (coarse control is implemented by controlling the duty cycle with which divider 18 operates with modulus N, where divider 18 operates cyclically with modulus N, followed by modulus N+1, followed by modulus N, followed by modulus N+1, and so on). Specifically, preload counter 44 asserts a control signal to multiplexer 40 to cause multiplexer 40 to select that one of the L input clocks that in turn causes the frequency of the output of multiplexer 40 to be $$f_1 = (1 \pm k/ML) * f_{dck}.$$

Thus, in response to the output of multiplexer 40, the frequency of the clock signal output from divider 18 is:

$$f_{au} = (A+B)/(A/N + B/(N+1))/(1 \pm k/ML) * f_{dck}.$$

assuming that divider 18 operates cyclically as a divide-by-N divider for "A" pulses of the output clock $f_{au}$ (where A is a positive integer) and then as a divide-by-(N+1) divider for the next "B" pulses of the output clock (where B is a positive integer). The minimum phase jump when the fine control (asserted from counter 44 to multiplexer 40) changes will be $1/(L*f_{dck})$, and this phase jump can be further reduced if phase interpolation is done at multiplexer 40.

Digital audio data values are typically generated (e.g., in an analog-to-digital converter) at a regular (periodic) rate, and it is important to retain that rate information with a high degree of accuracy during transmission of digital audio data over a link and during recovery of the transmitted audio data at a receiver.

Data transmission over TMDS-like links typically occurs with delays that vary over time, and this makes it difficult to reproduce the necessary timing relationships at the receiver. This is especially true in cases where data are stored for a time (in a memory structure for example) and then transmitted in blocks or "packets" over the link. While the exact timing of data might be distorted at the receiver, periodic signals (e.g., streams of audio or video data words transmitted at the rate of one word, or a fixed number of words, per clock pulse) transmitted over a TMDS-like are recovered at an "average" data rate in the receiver that matches the average data rate at which they were transmitted by the original source (the transmitter). A variety of techniques that use this idea to regenerate (at a receiver) a stream of transmitted auxiliary data at a data rate that closely matches the data rate at which the auxiliary data was transmitted at the transmitter.

An "average rate" is often a fractional value. However, digital logic prefers integer values, and does not handle fractional values as easily or efficiently as integer values. Therefore, preferred embodiments of the invention implementing clock recovery for an auxiliary data stream (of a type requiring determination of an average data rate of the recovered data) are implemented in a manner that yields the necessary accuracy but does not require digital logic to process fractional values.

A number of different embodiments of the invention employ different mechanisms for determining the average rate at which packets of auxiliary data flow into a receiver, and then matching such rate to the rate at which they flow out of the receiver. Most such mechanisms assume that the rate at which the packets flow into the receiver is fairly constant (i.e., varies over time only within specific constraints) and thus require that the rate at which the packets flow out of receiver remains fairly constant (i.e., varies over time only within the same constraints).

The methods described in the following sections use either mathematical techniques (calculation) or feedback techniques (ongoing approximation) to find the average data rate of interest. Filtering techniques are used to make sure that the average rate determined in accordance with the invention cannot vary by more than the allowed amount from one moment to the next. Typical embodiments of the invention are implemented with essentially digital circuitry (hence the desire to avoid fractional values). Nonetheless, it is within the scope of the invention to employ analog techniques or methods to achieve the same or similar results. Indeed, analog circuit elements are used in some embodiments instead of or in addition to the digital elements. For example, the variable, voltage-controlled oscillator (VCO) employed in some of the embodiments described herein can be an analog VCO or it can have a digital counter based structure. Also, the low pass filter employed in some embodiments described herein can be analog or digital.

In a first class of embodiments, the rate at which auxiliary data are transmitted over the TMDS-like link is measured directly (in the transmitter), and the measurement is transmitted to the receiver for use in generating (in the receiver) a stream of recovered data having the same data rate. Perhaps the simplest method to regenerate a clock is simply to measure it at the transmitter, and then recreate it at the receiver using that measurement. By its nature, this technique requires either a common time-base at both the transmitter and receiver, or a well-defined conversion between one time-base at the transmitter and another time-base at the receiver to supply the requisite measurement "standard".

Using a separate crystal-controlled (or other high accuracy) oscillator in both the transmitter and receiver will generally not (by itself) provide a common time-base at the transmitter and receiver because the oscillators' frequencies will have minor variations (both in their center frequencies and their response to differing environmental conditions). Even if such frequency variations have magnitude of on the order of only a few parts per million, they can cause phase errors to accumulate to a degree that will eventually cause the receiver to experience overflow or underflow errors. It would be necessary to detect such an error before it occurs and introduce corrections. One way to achieve a common time-base is to use a pixel clock, which is a common frequency at each side of the link. When working properly this will not allow phase errors to accumulate, but it will have jitter, and this must be added to the overall jitter of the regenerated clock. In either case, and indeed in most of the techniques described below, when the clock is regenerated digitally its minimum jitter will be essentially equal to the period of the clock used by the regeneration state machine, added to all the other jitter sources in the system. That clock period should be minimized, and hence the clock frequency should be maximized.

One preferred embodiment of the invention uses a memory structure in the receiver to queue up packets of transmitted auxiliary data to be processed, and a technique known as "time stamp amortization" to accomplish clock regeneration. There is typically a FIFO or other memory structure in the receiver of a TMDS-like link which is used to queue up received packets of auxiliary data to be processed. This provides a built-in mechanism for observing the current packet and the ones that follow. If the receiver is configured in accordance with the present invention to process time stamps (where each time stamp is a data value, typically an integer, transmitted with a packet to indicate the time at which the packet was transmitted or asserted to the transmitter) to measure the difference in transmission time across several packets (as in the embodiments described with reference to FIG. 12), the clock employed to transmit the data can be recovered with an effective error for each packet that is less than one clock period.

Figure 12:
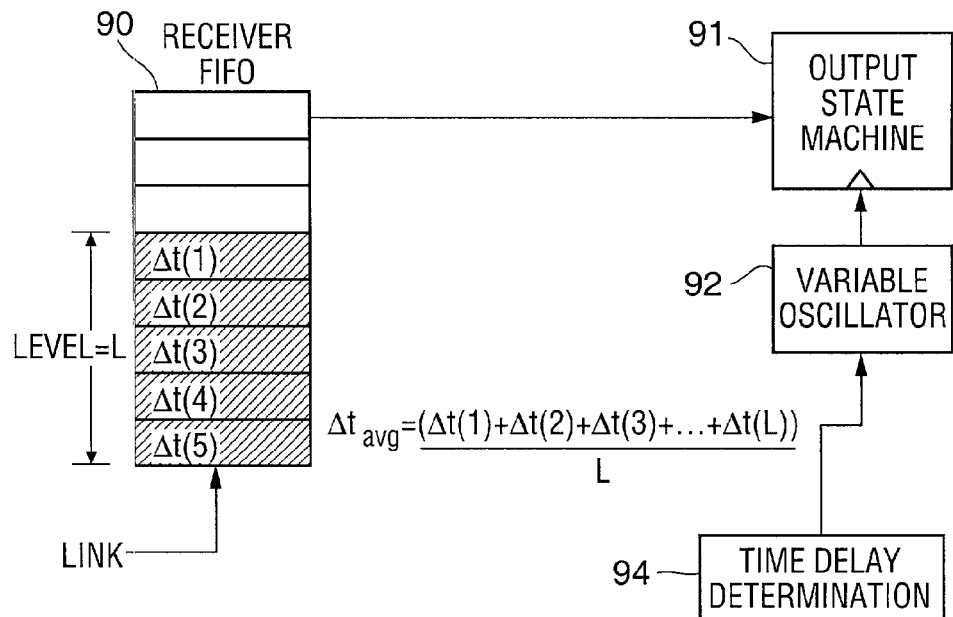
FIG. 12 is a block diagram of circuitry of an embodiment of the inventive receiver.

In a class of embodiments, the inventive receiver includes the FIG. 12 circuitry. FIFO register 90 of FIG. 12 can hold as many as M sequentially received packets of auxiliary data (each packet can be a word of auxiliary data) and one such packet is asserted to output state machine 91 (which is coupled to the output of FIFO 90) during each cycle of the clock asserted at the output of variable oscillator 92. Output state machine 91 of FIG. 12 is coupled to receive and process a sequence of packets output from FIFO 90 in response to the clock signal asserted at the output of variable oscillator 92. The receiver is configured to generate data (for each packet in FIFO 90) indicative of the time difference, $\Delta t(n)$, between the arrival time at FIFO 90 of the data in the "n-th" packet and the arrival time at FIFO 90 of the data in the "(n−1)th" packet (where the "arrival time" associated with n=0 is some initial time value). The receiver includes time delay signal generation unit 94, which is coupled to receive the time difference data and configured to generate (preferably with hardware but alternatively with software) a signal indicative of the average time delay ($\Delta t_{avg}$) of each packet in a sequence of L of the packets (where L is an integer less than or equal to M) as $\Delta t_{avg}=((\Delta t(1)+\Delta t(2)+ \ldots +\Delta t(L))/L)$. Unit 94 asserts this average time delay signal to variable oscillator 92, to control oscillator 92 so that the frequency of the clock signal asserted at oscillator 92's output matches the data rate at which the packets were transmitted by the transmitter. The average amount of jitter (time delay error) per clock cycle in the corrected recovered clock signal (asserted at oscillator 92's output) is approximately A/L, where A is the average amount of jitter that would exist in the corrected recovered clock signal in the case that L=1. This assumes that summation of the $\Delta t(x)$ values does not allow errors to accumulate. It also assumes that none of variable oscillator 92, output state machine 91, and the unit which computes the average time delay of L of the packets, actually performs a division by the value L in a way that allows errors to accumulate. Generally the latter restriction means each unit that performs division by L must accumulate remainders (least-significant bits of the sum) from the division, and carry them along into the next calculation.

If L is a power of 2 then the division by L reduces to a "right-shift" operation, and is therefore greatly simplified. The value of L can in fact be chosen to accomplish this, by ignoring any packets in FIFO 90 (for the purposes of this calculation) that exceed a desired pointer value. For example, the receiver can be implemented so that L=4, and so that the receiver always performs the time delay average over the topmost four packets in FIFO 90. As long as FIFO 90 always contains at least as many packets as the chosen value of L, the described implementation will work well. Other feedback methods (such as those described below) can be used to establish and maintain the desired FIFO depth.

In variations on the above-described implementation of FIG. 12, each packet of auxiliary data transmitted to the receiver (and asserted to FIFO 90) includes a time stamp indicative of the time difference, $\Delta t(n)$, between the arrival time at the transmitter of the data in the "n-th" packet and the arrival time at the transmitter of the data in the "(n−1)th" packet (where the "arrival time" associated with n=0 is some initial time value). In such variations, a variation on time delay signal generation unit 94 is configured to generate (using hardware and/or software) a signal indicative of the average time delay ($\Delta t_{avg}$) of L of the packets (where L is an integer less than or equal to M) using these time stamp values, where $\Delta t_{avg}=((\Delta t(1)+\Delta t(2)+ \ldots +\Delta t(L))/L)$.

In variations on the embodiments of the previous paragraph, each packet of auxiliary data transmitted to the receiver (and asserted to FIFO 90) includes a time stamp indicative of a time (typically the time at which the data in the packet arrived at the transmitter from its original source) rather than a relative time (the time difference between the arrival time of the data in the packet at the transmitter and the arrival time at the transmitter of an initial quantity of data). Each such time stamp "Timestamp(n)" is indicative of the arrival time at the transmitter of the data in the packet in the "n-th" level of FIFO 90. A variation on time delay signal generation unit 94 is configured to generate (using hardware and/or software) a signal indicative of the average time delay ($\Delta t_{avg}$) of L of the packets in FIFO 90 (where L is an integer less then M) using the time stamps, where $\Delta t_{avg}=$ (Timestamp(L)−Timestamp(1)/L. This average time delay signal is employed to control variable oscillator 92 (or otherwise to control generation of an output clock for transmitted auxiliary data). It does not matter whether each time stamp marks the beginning or end of the packet, or any point in between. The average time delay computation will be accurate as long as the relative point remains consistent from packet to packet. In real world implementations, the time stamp values will typically roll-over (revert to an initial value) after reaching a maximum value, and so a correction for this phenomenon will be necessary.

Figure 13:
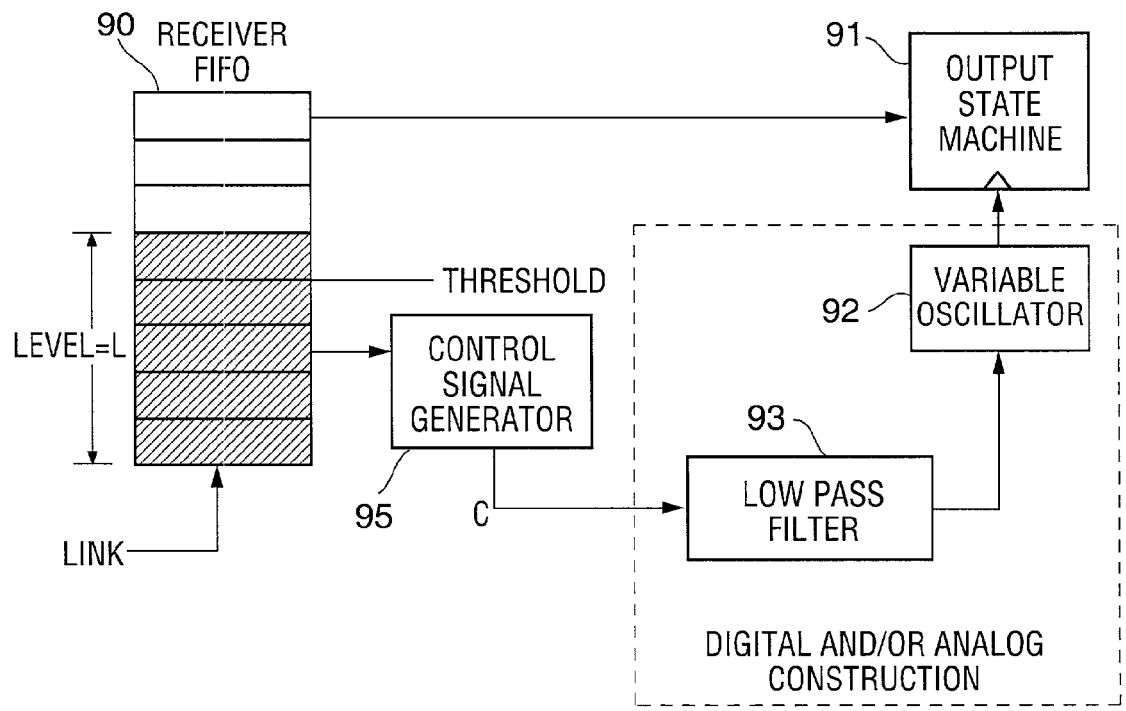
FIG. 13 is a block diagram of circuitry of another embodiment of the inventive receiver.

Another method of regenerating a clock for a stream of auxiliary data transmitted to the receiver starts with the assumption that if received packets of the auxiliary data enter a FIFO, and the packets are clocked out of the FIFO at the same average rate that they enter the FIFO, then the average FIFO level (the number of levels of the FIFO that contain packets during each clock cycle, averaged over many clock cycles) should remain essentially constant. Therefore a feedback mechanism that monitors the FIFO level and uses it speed up or slow down the output clock (e.g., the clock asserted from variable oscillator 92 to output state machine 91 of FIG. 12) should servo in to the correct clock rate for the output state machine. FIG. 13 is a block diagram for such a feedback mechanism.

Those elements of FIG. 13 that are identical to corresponding elements of FIG. 12 are numbered identically in both figures. FIG. 13 implements a feedback loop in which control signal generation unit 95 compares a measured value "L" (indicative of the level of FIFO 90 at any instant) to a pre-determined threshold level ("Threshold") to generate a signal (identified as signal "C" in FIG. 13) indicative of the difference ("L-Threshold") between L and Threshold (or the sign of such difference, and optionally also whether the difference has zero magnitude). The output of unit 95 is asserted through low pass filter 93 to variable oscillator 92 (to function as a control signal for variable oscillator 92). In a preferred implementation, if the FIFO level (L) is higher than the threshold level (FIFO 90 is more full than desired) then oscillator 92 is controlled to speed up the output clock (asserted to state machine 91) in order to bring the FIFO level back down to the desired level, and if the FIFO level (L) is lower than the threshold level (FIFO 90 is less full than desired) then oscillator 92 is controlled to slow down the output clock in order to bring the FIFO level back up to the desired level. Low pass filter 93 ensures that the frequency of the output clock remains suitably constant and does not vary so much as to cause instability. Filter 93 can be implemented in a digital, analog, or hybrid manner. Regardless of the manner in which filter 93 is implemented, its bandwidth is a critical parameter. If the cutoff frequency of filter 93 is too low (the criterion for passing the instantaneous value "L-Threshold" is too stringent, so that there is too much filtering), then it will introduce too much phase delay and the loop will never be able to "lock" (it will instead oscillate). If the cutoff frequency of filter 93 is too high (the criterion for passing the value "L-Threshold" is too lenient, so that there is not enough filtering) then the loop will lock easily, but the output clock rate will not be sufficiently constant for optimal performance (because it will respond too easily to FIFO level variations).

In preferred implementations of the FIG. 13 embodiment, the output clock rate will not change if the FIFO level exactly equals the pre-determined threshold. For example, filter 93 asserts a control signal having a first nonzero value when the value of L-Threshold is positive (and is passed by filter 93), filter 93 asserts a control signal having a second nonzero value when L-Threshold is negative (and is passed by filter 93), filter 93 asserts a control signal having the value zero when L-Threshold is zero (or when filter 93 does not pass the instantaneous value of L-Threshold), variable oscillator 92 is configured to increase the output clock rate in response to the control signal having the first nonzero value, variable oscillator 92 is configured to reduce the output clock rate in response to the control signal having the second nonzero value, and variable oscillator 92 is configured to maintain the output clock rate unchanged in response to the control signal having the value zero. Such an implementation improves stability in some applications, but it is not required. For example, in a class of alternative embodiments, the feedback loop causes variable oscillator always to either speed up or slow down the output clock rate while low pass filter 93 provides the necessary frequency smoothing. In an example of the latter embodiment, filter 93 asserts a control signal having a first nonzero value when L-Threshold is positive or zero (and is passed by filter 93), filter 93 asserts a control signal having a second nonzero value when L-Threshold is negative (and is passed by filter 93), filter 93 asserts a control signal having the value zero when filter 93 does not pass the instantaneous value of L-Threshold, variable oscillator 92 is configured to increase the output clock rate in response to the control signal having the first nonzero value, variable oscillator 92 is configured to reduce the output clock rate in response to the control signal having the second nonzero value, and variable oscillator 92 is configured to maintain the output clock rate unchanged in response to the control signal having the value zero.

In another class of embodiments, the receiver of a TMDS-like link is equipped with a feedback mechanism that uses multiple FIFO thresholds (rather than a single FIFO threshold as in the above-described implementations of FIG. 13) to servo a regenerated auxiliary data clock to the correct frequency. In some cases, use of multiple thresholds provides better response and stability than does use of a single threshold. The overall approach is similar to that in the single threshold case, except that in embodiments using multiple FIFO thresholds, there is a central range in which the FIFO level can vary while the output clock frequency (the frequency of the recovered clock) is allowed to remain constant. The effect is to reduce the amount of filtering required, and hence to improve the overall loop response (because phase delay in the feedback loop is also minimized. Some embodiments in this class are implementations of FIG. 13 in which control signal generation unit 95 compares a measured value "L" (indicative of the level of FIFO 90 at any instant) to each of a first pre-determined threshold level ("Threshold1") and a second pre-determined threshold level ("Threshold2") greater than Threshold1, to generate a signal (identified as signal C) indicative of the difference between L and Threshold1 and the difference between L and Threshold2 (or the sign of each such difference, and optionally also whether each such difference has zero magnitude). Filter 93 asserts a control signal having a first nonzero value when the value of L-Threshold2 is positive (and is passed by filter 93), filter 93 asserts a control signal having a second nonzero value when L-Threshold1 is negative (and is passed by filter 93), filter 93 asserts a control signal having the value zero when (L-Threshold2) is negative and (L-Threshold1) is positive (or when filter 93 does not pass the instantaneous value of L-Threshold), variable oscillator 92 is configured to increase the output clock rate in response to the control signal having the first nonzero value, variable oscillator 92 is configured to reduce the output clock rate in response to the control signal having the second nonzero value, and variable oscillator 92 is configured to maintain the output clock rate unchanged in response to the control signal having the value zero.

A variation on the latter approach is to define more than three "zones" of the FIFO level, using a corresponding number of pre-determined threshold values of the FIFO level. This allows the definition of essentially a non-linear response curve for controlling the output clock frequency. When the FIFO level is at or near the ideal level, then the variable oscillator (e.g., oscillator 92) could be controlled to change the output clock frequency slowly or not at all. When the FIFO level is far from the ideal level, then the response would typically be more dramatic. This approach can improve stability even further than in the "two threshold" case described in the previous paragraph, while offering better control of the FIFO level and a reduced likelihood of overflow or underflow errors.

Yet another class of embodiments (which are variations on the above-described implementations of FIG. 13) employ a "gravity" feedback mechanism to control the output clock frequency. A "gravity" mechanism provides feedback based on some function of the distance between the current FIFO level and a pre-determined threshold. Generally, the greater the distance then the stronger the push back toward the threshold. The response curve could be linear, or it could be non-linear (a "parabolic" response, which is a function of the square of the distance, would be one example of a non-linear response). Some embodiments in this class are implementations of FIG. 13 in which control signal generation unit 95 generates a control signal (identified as signal C) indicative of a value which is a function of the difference between a measured value "L" (indicative of the level of FIFO 90 at any instant) and a pre-determined threshold level ("Threshold"). In some implementations, filter 93 asserts a control signal indicative of a nonzero value in a first range when the value of L-Threshold is positive (and is passed by filter 93), filter 93 asserts a control signal having a nonzero value in a second range when L-Threshold is negative (and is passed by filter 93), filter 93 asserts a control signal having the value zero when (L-Threshold)=0 (or when filter 93 does not pass the instantaneous value of the signal C), variable oscillator 92 is configured to increase the output clock rate in response to the control signal being indicative of a value in the first range (to a degree determined by the magnitude of such value), variable oscillator 92 is configured to reduce the output clock rate in response to the control signal being indicative of a value in the second range nonzero value (to a degree determined by the magnitude of such value), and variable oscillator 92 is configured to maintain the output clock rate unchanged in response to the control signal having the value zero. The approach of this class of embodiments is essentially the culmination of the multi-zone method described in the previous paragraph, except that in the multi-zone case the response curve is piecewise-linear, and in this class of embodiments it is continuous.

As mentioned previously, where the receiver of a TMDS-like link includes a FIFO for receiving packets of auxiliary data that have been transmitted over the link, the packets will typically not be delivered to the FIFO at a constant rate. While the average rate will normally be essentially constant, the average FIFO level itself will jump up and down as more or fewer packets are delivered in any given time frame. Further, the granularity at the packet level is rather large. By the time the FIFO level moves appreciably (when measured in packets), then there has already been a significant delay. This delay detracts from the stability of the feedback loop employed to recover a clock for the auxiliary data. Therefore, it is desirable to implement the feedback loop to allow for some variation in FIFO levels, and also to use as fine a granularity as possible (perhaps descending to the individual byte or even bit levels). In another class of embodiments of the invention, the receiver is configured to calculate or measure the derivative (rate of change) of the FIFO level per unit time. This measured or calculated value will of course change from one moment to the next too, but if the instantaneous values are filtered then this provides a useful feedback mechanism. Some embodiments in this class are implementations of FIG. 13 in which control signal generation unit 95 generates a control signal (identified as signal C) indicative of the derivative with respect to time (i.e., the rate of change) of the level of FIFO 90 per unit time (without reference to any pre-determined threshold level of FIFO 90). In such embodiments, the feedback loop will remain stable and provide a suitably constant rate, even if the actual FIFO level wanders appreciably. Note that it in some implementations, the receiver (e.g., unit 95 of the receiver) determines only whether the rate of change of the FIFO level is greater than zero or less than zero (at each instant of interest). This greatly simplifies the calculation, so that unit 95 could perform the calculation using only a small number of simple counters and a comparator.

The approaches described above for operating a receiver of a TMDS-like link to control the frequency of an output clock (for a stream of auxiliary data) are not mutually exclusive, and in some applications the best performance will be achieved when using some combination of these approaches. For example, one measurement technique can be used for coarse control of a variable oscillator which generates the output clock (to cause the variable oscillator to generate an output clock with approximately the correct frequency and to respond quickly to changes in the sampling rate). Then a multiple threshold scheme can be used for fine control of the output clock rate (in response to small changes in FIFO level) to bring the FIFO level (and the corresponding output clock frequency) into a suitable operating range and keep it there. Finally, a rate-sensitive technique can be used to achieve the best possible stability while in the operating range set by the multiple threshold scheme.

Whether the average packet rate is calculated mathematically, or derived experimentally (using feedback), the circuitry employed for clock regeneration can have an analog or digital or hybrid implementation. In a digital implementation it is typically necessary to perform a variety of functions with very high accuracies ("analog" accuracies) using only simple state machines or integer math. We next describe a variety of techniques for accomplishing this. Various embodiments of the inventive receiver and the inventive auxiliary data clock regeneration methods implement all or some of these techniques.

First, we describe digital implementations of the above-discussed low pass filters (e.g., low pass filter 93 of FIG. 13). Typically, it is expensive to implement such low pass filters in the digital realm using DSP or other mathematical techniques. In most of the above-discussed implementations, the low pass filter must process data values that are essentially indicative of the results of Boolean operations. These can be reduced to a small number of yes or no questions, such as "is the FIFO level above a certain threshold?," "is it between two thresholds?," and "is the variable oscillator too fast (or too slow)?" To perform "low pass" filtering on the data values received by the low pass filter is effectively to ask (for each such question): in the recent past, was the answer to the question "Yes" more often than "No?" Finding an answer to this question does not require complex math. It merely requires a short term memory for recent events and the ability to count, which is easy to implement in digital hardware.

Figure 14:
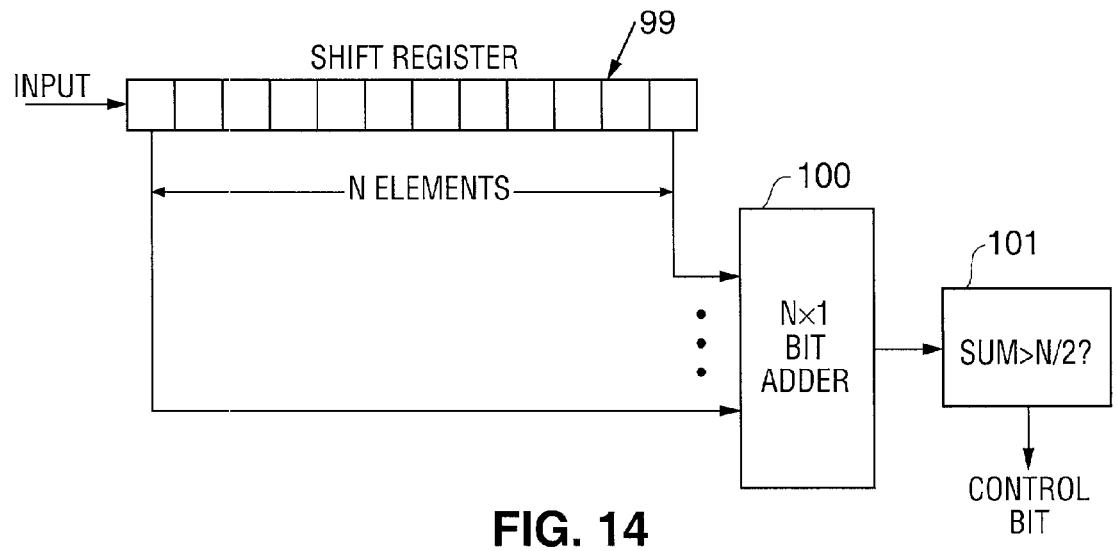
FIG. 14 is a block diagram of a low pass filter for auxiliary data clock recovery in accordance with the invention.

One implementation of such key component (of a low pass filter for use in clock recovery in accordance with the invention) is shown in FIG. 14. Shift register 99 of FIG. 14 contains the N most recent data values input to the low pass filter. Each of the data values is a single binary bit. Each of the data values in register 99 is asserted to a different bit of adder 100 (which is an N×1 bit adder). Periodically (e.g., once per clock cycle), adder 100 counts the data values at its inputs and asserts the sum to logic circuit 101. If the sum asserted to circuit 101 is greater than N/2, indicating that there are more data values in register 99 that are indicative of a logical '1' than data values indicative of a logical '0', then the output of circuit 101 is a control bit whose value is '1' Otherwise, the output of circuit 101 is a control bit whose value is '0'. The output of circuit 101 (typically together with other similarly generated control bits) determines whether to pass (or not pass) a data value received at the input of the low pass filter to the low pass filter's output.

The effective "bandwidth" of a filter of the type shown in FIG. 14 is a function both of the length of shift register 99, and the shift frequency. The bandwidth can be tuned to different values to elicit different response characteristics from the feedback loop.

Variations on the circuit of FIG. 14 can be implemented, especially if the length of shift register 99 is short. For example, adder 100 and circuit 101 can be replaced by other logic circuitry (or by a look-up table in a ROM or other device). Such other circuitry can be implemented so as to give different weights to different ones of the bits in register 99. More recent bits can be given greater weight than less recent bits, for example.

If a clock rate measurement or time stamp technique is used to implement auxiliary data clock recovery in accordance with the invention, then it will be necessary to implement a rate conversion if the two sides of the TMDS-like link use different clock frequencies or time-bases. Generally, such a conversion will include at least one multiplication by the ratio of an transmitter clock frequency and a receiver clock frequency. In general, this ratio will not be a simple integer. Indeed, it might be a fraction, in which case the conversion requires a multiplication (by the numerator) and a division (by the denominator). While multiplication is not overly difficult to implement, division is more difficult to implement. Division also results in a loss of precision if the final result must remain an integer.

Therefore a technique is necessary both for finding the appropriate clock frequency ratio (expressed as an integer fraction), and for simplifying the necessary math involved. The circuit shown in FIG. 15 accomplishes this.

Figure 15:
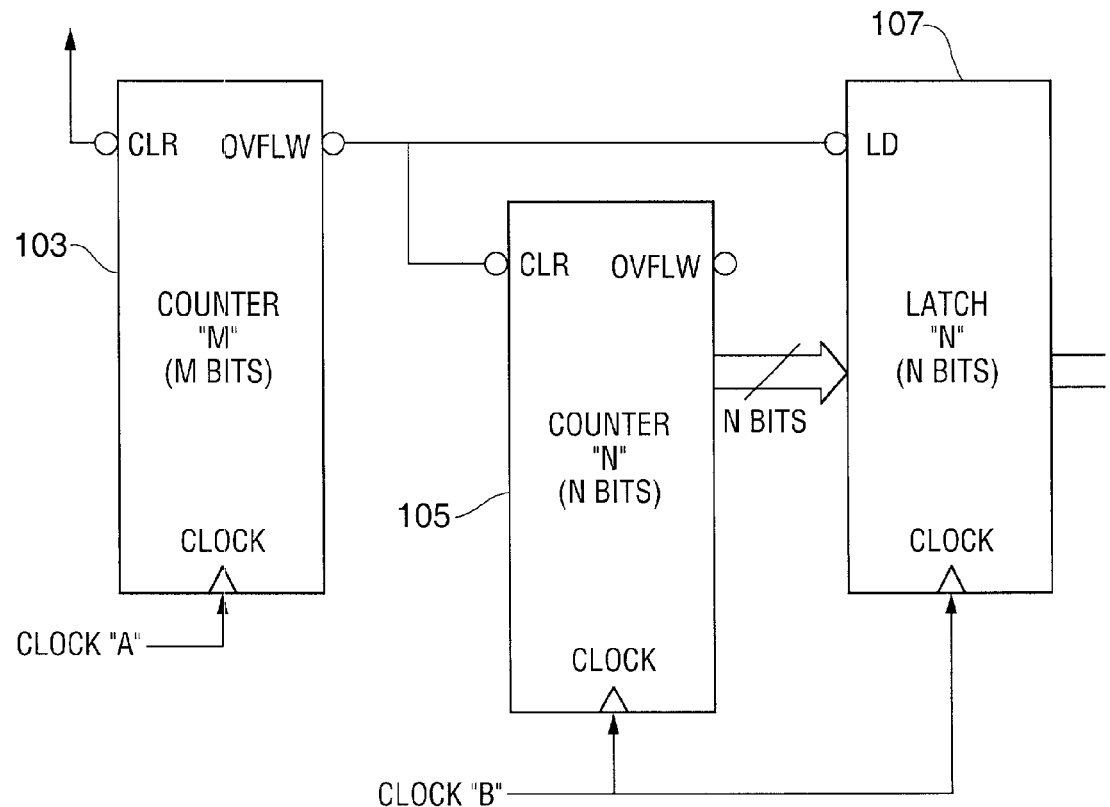
FIG. 15 is a block diagram of a circuit for determining a ratio of clock frequencies, which is useful for auxiliary data clock recovery in accordance with the invention.

In the FIG. 15 circuit, counter 103 operates in a separate clock domain than the clock domain in which counter 105 operates. Counter 103 is M bits wide, and operates in response to clock "A". Counter 105 is N bits wide, and operates in response to clock "B". The FIG. 15 circuit is designed so that counter 103 is allowed to free-run, and to repeatedly count off $2^m$ cycles of clock "A." Thus, the output of counter 103 provides a constant base for the measurement. Counter 105 resets to zero at the start of each measurement interval, and at the end of each measurement interval the value (called "Count") in counter 105 is loaded into latch 107. The ratio of the frequency of clock B to the frequency of clock A is therefore $Count/2^m$. This is an integer fraction. Moreover, the denominator is expressed as a power of 2, and hence the requisite division (for multiplying any value by the fraction "$Count/2^m$") is a simple shift operation. The precision of the fraction "$Count/2^m$" is a function of the counter length. If the ratio of the frequencies of the two clocks "A" and "B" is effectively constant, long measurement intervals can be used to maximize the precision obtained. In some implementations of the FIG. 15 circuit, synchronizers between the domains of clocks "A" and "B" may be necessary, but such synchronizers are not shown in FIG. 15 for simplicity.

Figure 16:
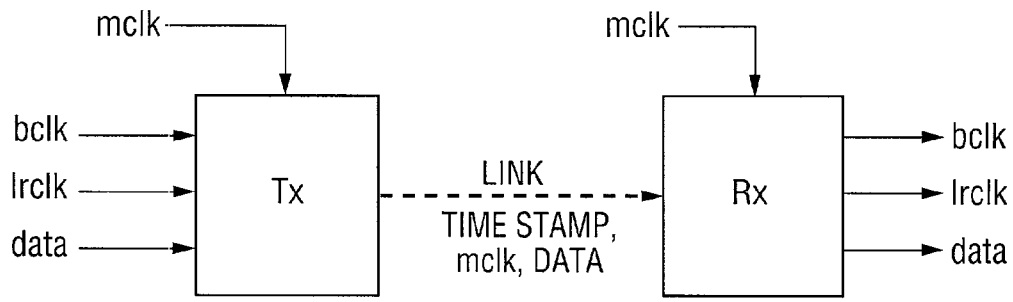
FIG. 16 is a block diagram of another embodiment of the inventive system.
Figure 17:
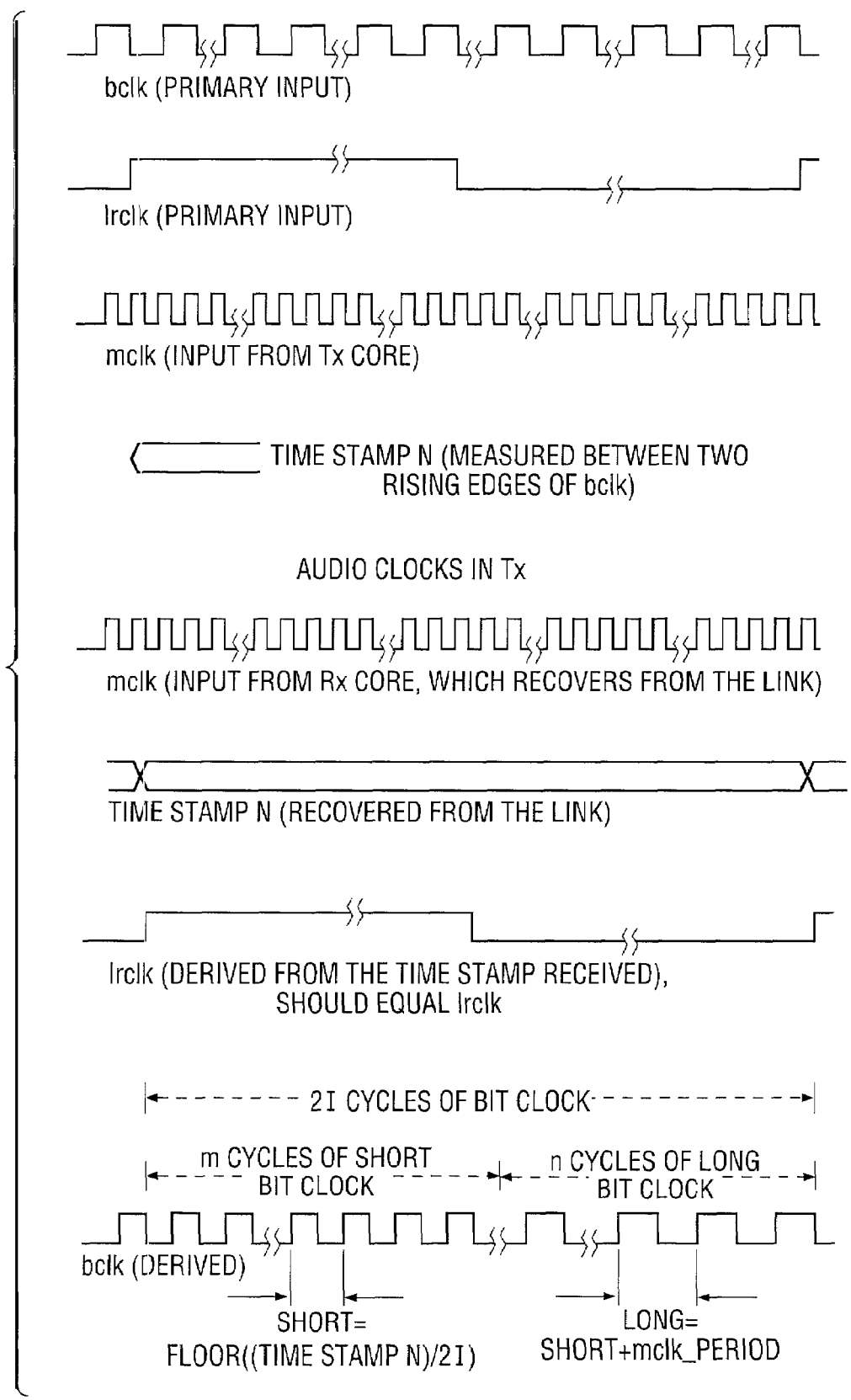
FIG. 17 is a timing diagram of signals asserted in operation of the FIG. 16 system.

In another embodiment, signals indicative of the following information are transmitted over a TMDS-like link: words (having controllable width) of time-division-multiplexed streams of digital audio data (right and left channels of a stereo audio program), a right/left clock (lrclk) indicative of whether corresponding audio data bits belong to the right or left stereo channel, a counter clock (mclk), and time stamp data. The audio data are clocked into the transmitter using an audio bit clock (bclk). It is the receiver's responsibility to recover the right/left clock and generate a clock identical to the audio bit clock. The left/right clock recovered in the receiver must be identical to the left/right clock transmitted by the transmitter in order to play the recovered audio correctly. Generation of the audio bit clock, bclk, and recovery of the audio clock, lrclk, is accomplished using the transmitted time stamp data. FIG. 16 shows the transmitter (Tx), receiver (Rx), and the relevant signals input thereto and output therefrom. FIG. 17 is a timing diagram of relevant signals asserted during operation of the FIG. 16 system.

In transmitter Tx, a time stamp counter counts at a high frequency in response to counter clock mclk. Typically, the frequency of mclk is greater than 100 MHz. The counter value is reset to zero at each rising edge of the transmitted right/left clock lrclk. The counter value immediately before each reset is saved as a time stamp to be transmitted to the receiver.

The time stamp values and the counter clock are transmitted to the receiver over the TMDS-like link. The counter clock (mclk) is recovered by receiver Rx using an analog PLL within the Rx core.

At any instant, the period of left/right clock being recovered in the receiver should equal the corresponding received time stamp value, to assure that the audio symbol rate at the transmitter's input matches the symbol rate of the recovered audio data driven out from the receiver. If the receiver output audio stream requires 2I bits of audio data per lrclk, the bit clock bclk generated in the receiver will consist of a repeating sequence of m cycles of a "short" bit clock with period SHORT followed by n cycles of "long" bit clock with period LONG (with m cycles of the "short" bit clock and n cycles of the "long" bit clock determining each cycle of lrclk), where:

n=reminder(time_stamp_value/2I)
m=2I−n
SHORT=floor(time_stamp_value/2I)
LONG=SHORT+mclk_period Assuming that the frequency of mclk is greater than 100 MHz, its period, mclk_period is less than 10 ns. Thus, the audio bit clock jitter is less than 10 ns.

Figure 18:
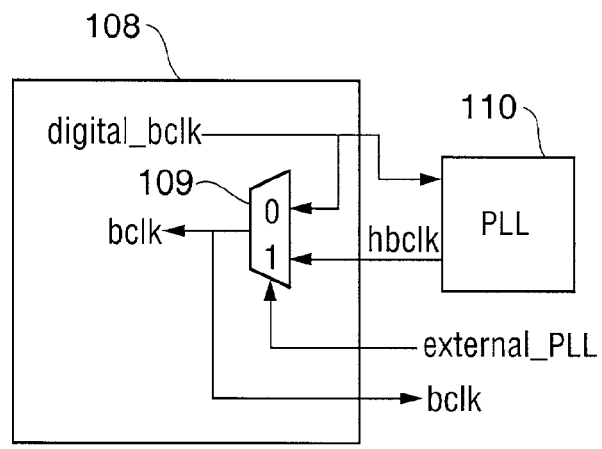
FIG. 18 is a block diagram of circuitry employed to implement a variation on the receiver of FIG. 16.

The audio clock recovery/generation method described with reference to FIG. 17 yields an audio bit clock that exhibits clock jitter equal to the clock period of the counter clock mclk, which is preferably of on the order of 10 ns or less. If it is required that the receiver generate an audio bit clock with higher precision, the receiver (typically implemented as an integrated circuit) can be used with an external PLL (e.g., PLL 110 of FIG. 18). For example, as shown in FIG. 18, receiver 108 generates audio bit clock "digital_b-clk," which is identical to audio bit clock "bclk" of FIG. 17 and is generated in the same manner that "bclk" is generated. Audio bit clock "digital_bclk" is asserted as an input to external PLL 110. In response, PLL 110 asserts at its output a higher precision audio bit clock "hbclk" (having less jitter than "digital_bclk"). Receiver 108 includes multiplexer 109 (connected as shown to the input and output of PLL 110) which enters a first state in response to external control signal "external_pll," in which the signal "digital_bclk" is passed through multiplexer 109 and employed as the final audio bit clock during recovery of the audio data bits. Multiplexer 109 can also enter a second state in response to another value of control signal "external_pll," in which the signal "hbclk" (asserted at the output of PLL 110) is passed through multiplexer 109 and employed as the final audio bit clock during recovery of the audio data bits.

In embodiments of the invention in which transmitted time stamps are used during regeneration of an auxiliary data clock, several sequentially transmitted time stamps (indicative of an average data rate) are preferably employed during auxiliary data clock regeneration (in place of just one transmitted time stamp) to reduce or eliminate jitter in the regenerated clock.

Rather than transmitting time stamps, the auxiliary data rate itself as determined at the input side (i.e., the rate at which the auxiliary data are clocked into the transmitter) can be transmitted for use in regenerating the auxiliary data clock. Codes can be used to indicate standard auxiliary data frequencies.

Transmission of time stamps (or data indicative of the auxiliary data rate) can increase the speed at which the receiver responds to sudden changes in the auxiliary data rate, relative to the speed at which a receiver employing a phase-locked loop to recover a transmitted auxiliary clock can typically respond to sudden changes in the frequency of the transmitted auxiliary clock.

Figure 19:
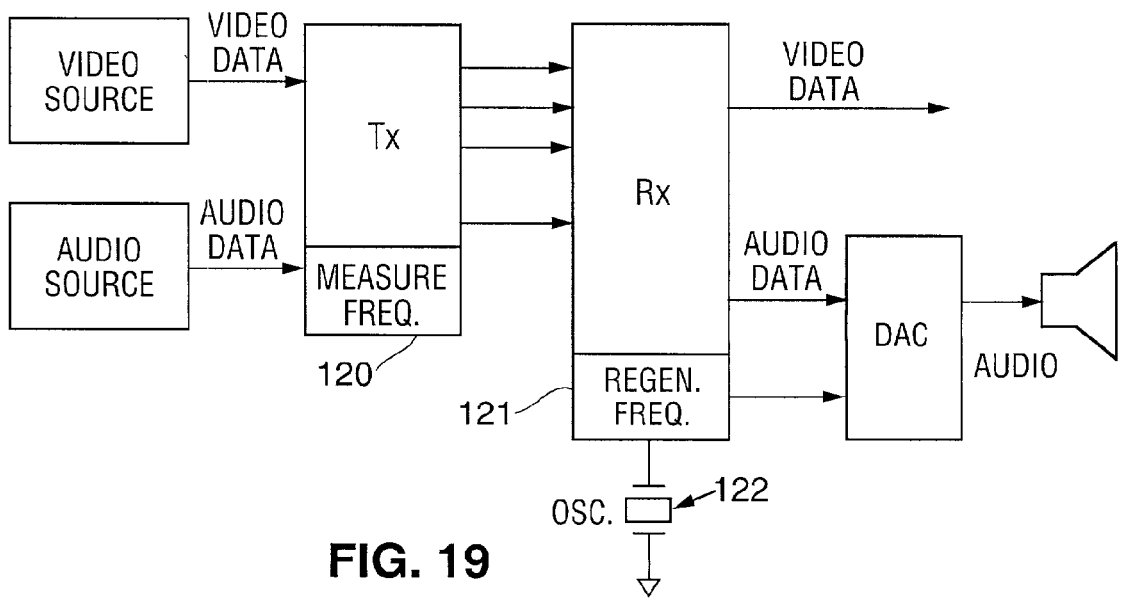
FIG. 19 is a block diagram of another embodiment of the inventive system.

Transmission of time stamps (or data indicative of the auxiliary data rate), typically combined with an additional feedback (e.g., from a FIFO read pointer in the receiver as described above), allows implementations of the invention that do not require an exact clock connecting the transmitter and the receiver (e.g., implementations that do not require use of a transmitted clock to recover an auxiliary data clock). For example in some embodiments in which auxiliary data and video are transmitted to a receiver, crystal oscillators having the same crystal frequency (or having known ratio of frequencies) are provided in both the transmitter and receiver, and the receiver uses transmitted time stamps (or transmitted data rate values) with the output of the receiver's crystal oscillator, but without using any transmitted clock, to recover the auxiliary data clock. For example, in FIG. 19, circuitry 120 in the transmitter measures the frequency at which the audio data are clocked into the transmitter, and the transmitter transmits this measured audio clock frequency (in addition to transmitting the audio data itself, and video data and a pixel clock for the video data). In the receiver, circuitry 121 (coupled to crystal oscillator 122) responds to the transmitted data indicative of measured audio data clock frequency by controlling the output of oscillator 122 to generate an audio clock having the measured audio data clock frequency. The audio clock generated in the receiver is sent (with the received audio data) to a DAC which recovers the original analog program.

In some embodiments of the invention in which the link has an available back channel, a clock for one or more streams of audio data (or other auxiliary data) is generated or recovered in the receiver (or in circuitry coupled to the receiver) and then transmitted back to the transmitter. This feedback to the transmitter is especially useful in embodiments (such as that of FIG. 20) in which audio data are transmitted over a TMDS-like link to the receiver, and the receiver (e.g., receiver 129 of FIG. 20) includes or is coupled to an audio digital-to-analog converter (e.g., audio DAC 130 of FIG. 20) that includes an oscillator (oscillator 131 of FIG. 20) which provides a sampling clock as an output. This clock is fed back to the data source (e.g., audio data source 127 of FIG. 20) to control the data rate at which the audio data are asserted to the transmitter (e.g., transmitter 128 of FIG. 20). Transmission of oscillator 131's clock from the output side to the data source on the input side allows the data source to operate in a manner avoiding problems associated with jitter generated in transmission of the data over the link, thereby eliminating the need for a buffer and a PLL in the receiver to even out the data rate into the audio DAC on the output side.

Figure 20:
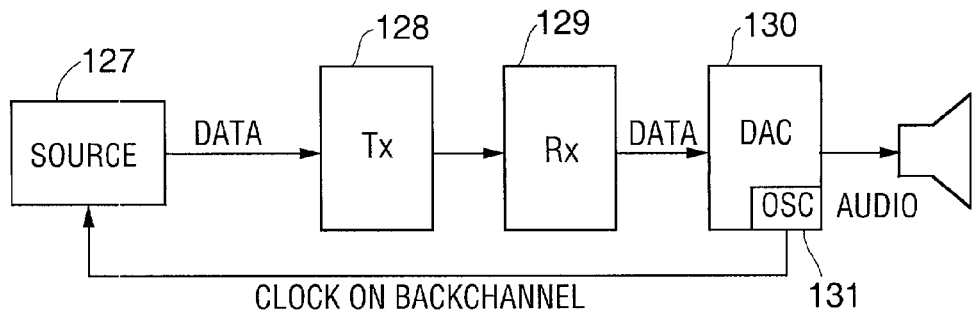
FIG. 20 is a block diagram of another embodiment of the inventive system.

If the sampling clock were not fed back from oscillator 131 to source 127 of FIG. 20 and a clock for the audio data were instead transmitted over the link (as well as the audio data itself) from transmitter 128 to receiver 129, the receiver would need to include circuitry for buffering the received audio data and maintaining the data flow to DAC 130 at the average input rate. Otherwise, the jitter in the data and clock transmitted from source 127 to the output side would introduce variation in the rate at which recovered audio data are clocked into DAC 130. Such variation would translate into variation (possibly to an unacceptable degree) in the frequency of the analog audio asserted at the output of DAC 130. Thus, the FIG. 20 embodiment eliminates the need for buffering and jitter reduction circuitry in receiver 129 by feeding back the sampling clock generated by DAC 130's oscillator 131 to audio data source 127 over a back channel of the link.

Figure 21:
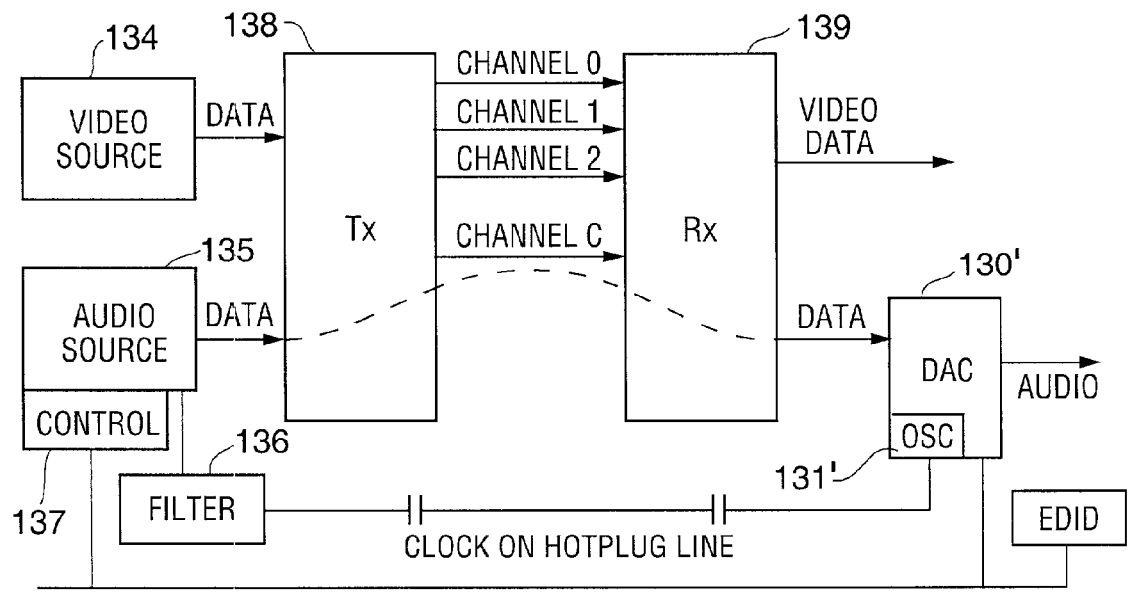
FIG. 21 is a block diagram of another embodiment of the inventive system.

FIG. 21 is an example of a DVI link that feeds back to its transmitter an audio clock generated in its receiver (or in circuitry coupled to the receiver). In the FIG. 21 system, video data are transmitted from transmitter 138 to receiver 139 over Channels 0, 1, 2 (which correspond to the identically labeled channels of FIG. 6), and audio data are transmitted (with the video pixel clock) from transmitter 138 to receiver 139 over Channel C (with periodically occurring rising edges of a binary signal on channel C determining the video pixel clock, and data indicative of modulated falling edges of the binary signal determining the audio data). The recovered audio data are asserted to DAC 130' (which can be identical to DAC 130 of FIG. 20). The sampling clock asserted by oscillator 131' of DAC 130' is fed back to audio data source 135 as a low level modulation on the Hot Plug Detect line. Because there are a limited number of possible values for the sampling clock frequency, the backchannel signal is preferably filtered (in bandpass filter 136) to prevent interference, and the filtered backchannel signal is asserted to source 135. The frequency of the sampling clock is optionally set by asserting a control signal to DAC 130' on the same DDC line employed by the transmitter to access the EDID data associated with the receiver.

For audio clock regeneration, a noise-shaping technique can be applied in accordance with the invention to reduce the jitter of the regenerated audio clock. One such noise-shaping technique is that used in conventional "fractional-N" frequency synthesizers in RF receivers, to suppress side band tones in case that the reference frequency and output frequency are not integer multiples.

In auxiliary data clock generation (or recovery) in accordance with the invention, it can be advantageous to multiply the input pixel clock (or the transmitted pixel clock) to obtain a higher sampling frequency. This allows a more accurate timing of the input auxiliary timing to be passed to the receiver from the transmitter.

II. Channels and Channel Combinations for Transmission of Auxiliary Data and Optionally also a Clock for the Auxiliary Data Any of a number of signals, conductors, and channels available in conventional DVI links or other TMDS-like links (which transmit video, but not also audio or other auxiliary data) can be employed in accordance with the invention for new uses, such as for transmitting audio or other auxiliary data (or a clock for auxiliary data). Each available conductor or channel can be employed to transmit auxiliary data (or a clock therefor) either in addition to or instead of each conventional function for which it is employed in a conventional TMDS-like link. The function of each conductor or channel can change depending on the configuration, or the specific point in time during operation of the link. Or the new functions can be implemented in ways that do not interfere with the conventional functions performed in a conventional TMDS-like link.

For example, the signals, conductors, and channels in a conventional DVI link (described above with reference to FIG. 1) that are used to send auxiliary data (and/or a clock for auxiliary data) in accordance with the invention include: the Hot Plug Detect ("HPD") line (on which the receiver, which is typically a monitor, transmits a signal that enables a processor associated with the transmitter to identify the receiver's presence), the Display Data Channel ("DDC") lines, the (mostly) unused conductors of the second set of four conductor pairs (in a DVI link including two TMDS links), the conductor pairs (Channel 0, Channel 1, and Channel 2 for video data, and Channel C for a video clock signal) of each TMDS link in the DVI link (e.g., at times otherwise reserved for sending control signals over such conductor pairs), the analog lines (for transmitting analog video to the receiver), and the power lines (for providing DC power to the receiver and/or a monitor associated with the receiver).

A Hot Plug Detect ("HPD") line (such as the one shown in FIG. 1) is conventionally used in a DVI link to indicate to the transmitter that a monitor or other "downstream" device has been plugged into the link. The HPD line is conventionally pulled up to a DC value by the downstream device, and so carries very little information in a conventional DVI link. Some embodiments of the invention transmit auxiliary data (e.g., audio data) to the receiver over the HPD line, either after the transmitter has received an HPD signal over the HPD line from the receiver (and the transmitter has identified the receiver) or in such a manner as not to interfere with transmission of an HPD signal over the HPD line to the transmitter.

Some embodiments of the invention transmit auxiliary data to the receiver over all or some of the DDC lines of a DVI link. The DDC interface provides a serial bus for bidirectional communication between the transmitter and a monitor associated with the receiver in accordance with the conventional Display Data Channel standard, including transmission by the monitor of an Extended Display Identification ("EDID") message that specifies various characteristics of the monitor. The DDC interface is also employed to initialize and authenticate an HDCP link. The DDC lines include a line for a single-ended data signal, a line for a single-ended clock signal, and power lines (voltage and ground wires). The clock and data connections have a data rate of 400 Kilobits per second or less. A DDC interface provides power to a DC power supply in the receiver, but such power supply is generally not needed when the receiver has been turned on (the primary purpose of the DC power supply is to enable operation of an EDID PROM in the receiver when the receiver has been turned off).

Some embodiments of the invention transmit auxiliary data to the receiver over all or some of the conductor pairs (Channel 0, Channel 1, and Channel 2 for video data, and Channel C for a video clock signal) of one or more TMDS links in a DVI link. In the past, the "dual-link" implementation of the DVI link (including two TMDS links) was used primary in applications in which the required number of video pixels to be transferred and/or the required refresh rate resulted in a requirement for video transmission with a pixel frequency above the typical 165 MHz maximum for a single-link implementation of a DVI link (an implementation having a single TMDS link). Such applications were uncommon, and it is expected that future technological improvements to single-link implementations of DVI (making possible the transmission of video with pixel frequency greater than 165 MHz) will make dual-link implementations of DVI mostly or completely unnecessary to achieve sufficiently rapid video transmission. Use of the conductor pairs of the second TMDS link of a "dual-link" implementation of DVI for auxiliary data transmission (rather than video transmission) has a number of advantages including the following: such conductor pairs are designed to support very high bandwidth signals, and the differential signaling allowed by such conductor pairs is robust and reliable over even relatively long distances.

Some embodiments of the invention transmit auxiliary data over all or some of the conductor pairs (Channel 0, Channel 1, and Channel 2) used conventionally for transmitting video data over a TMDS link (such as a TMDS link in a DVI link), at times (i.e., during blanking intervals) conventionally reserved for transmission of out-of-band words indicative of control bits CTL0, CTL1, CTL2 and CTL3. For example, the conventional out-of-band words indicative of such control bits can themselves indicate the auxiliary data (e.g., one such out-of-band word, such as that indicative of CTL1, can indicate a logical "zero" of auxiliary data and another such out-of-band word, such as that indicative of CTL2, can indicate a logical "one" of auxiliary data) or the auxiliary data can be transmitted in place of the out-of-band characters. The pre-reserved time slots allocated (by the specifications of the conventional DVI link) for transmission of out-of-band words indicative of control bits CTL0, CTL1, CTL2 and CTL3 allow data transmitted in these slots to be used to accomplish synchronization within a video frame.

In choosing which encoded words (e.g., which out-of-band, TMDS-encoded words) to employ to transmit auxiliary data in accordance with the invention, it is important to consider that some bits (of multi-bit encoded words) present greater risks of error than other such bits. For example, when using TMDS-encoded words to transmit auxiliary data (e.g., with each of two different TMDS-encoded words being treated as a different binary bit of auxiliary data), the DC balancing bits and transition control bits (e.g., bits Q[9] and E[8] discussed below with reference to the DC disparity channel used in some embodiments of the invention) present greater error risks than do the other bits. Any bit error occurring during processing of the DC balancing and transition control bits can affect other bits of the multi-bit encoded words. Hence a one-bit error in one of the critical bit is translated into a burst error.

One way to prevent this is to use an encoding scheme consisting of only robust encoded words to accomplish auxiliary data transmission. For example, one can use an encoding scheme in which clusters of encoded words (each cluster consisting of a first word and all words "similar" to the first word, i.e., all words likely to result from bit errors in the first word) map into the same decoded words. For example, one can use an encoding scheme in which each cluster of TMDS-encoded 10-bit words which differ from each other only in the values of their DC balancing bits and transition control bits map to the same decoded auxiliary data bit. In the latter example, the system essentially sacrifices two bits per clock cycle for additional robustness during auxiliary data transmission.

There are 256 independent code groups in TMDS code space that are distinct in their eight LSBs. The groups can be grouped again into pairs with four identical members each. There are two pairs whose sums are 0xff. There are two pairs that differ only in LSB. As a result, there are 64 TMDS code word clusters, each of which can be used to indicate a different auxiliary data value. To recover a unique decoded auxiliary data value from each of the eight possible TMDS codes, the receiver can ignore the DC balancing and transition control bits of the encoded words being used to transmit auxiliary data (these can be set to default values), and decode each received encoded word (or a version thereof in which the DC balancing and transition control bits have been set to default values) using a conventional TMDS decoder. In a preferred embodiment, the receiver decodes each TMDS code word by stripping its LSB, toggling the remaining bits (replacing all ones with zeroes, and vice versa) if the MSB is set, and then shifting the remaining bits (which may have been toggled) to the right by one bit. In this way, the receiver will determine one of the 64 code word clusters.

On the transmitter side, the redundancy in the TMDS-encoded words (when they are used to indicate auxiliary data values) can be exploited in several ways. For example, the redundancy can be used to control run length (e.g., to ensure that a stream of the encoded words does not include more than a predetermined number of consecutive "zero" bits or more than a predetermined number of consecutive "one" bits.

In other embodiments of the invention, the transmitter of a TMDS-like link sends TMDS-encoded data, and (for each of a subset of the transmitted TMDS-encoded words) sends an auxiliary data bit in the place where the transition control bit of the TMDS-encoded word would conventionally occur. In TMDS encoding, an 8-bit binary word is encoded as a 10-bit word including a transition control bit that indicates whether the other bits of the word satisfy a transition minimization criterion or a transition maximization criterion. Video data is encoded using only 10-bit words that satisfy the transition minimization criterion, but four specific encoded words that satisfy the transition maximization criterion are used as control words (transmitted only in blanking intervals, when DE is low).

Since the receiver of a TMDS link determines that DE is low only when a detected code word exactly matches one of the four special words (that satisfy the transition maximization criterion), it is possible to use the space conventionally used for the transition control bit of each encoded word to send auxiliary data through the channels of a TMDS link conventional used to transmit video data. The decoder of a conventional TMDS receiver typically does not actually check whether a received encoded word is actually transition minimized or not. Even if the decoder does perform such a check, even those transition minimized words that contain an auxiliary data bit whose value normally indicates a transition maximized word will be successfully decoded without any modification of the receiver.

To transmit auxiliary data bits (in place of bits conventionally used as transition control bits), the transition control bit of an encoded word (a transition minimized word) shouldn't be modified where the resulting modified word is a transition maximized code that matches with the four above-noted special words (in cases in which the modified word would cause or be likely to cause the receiver to make an unintended identification of a blanking interval). For example, the encoder can be implemented so as not to modify such a word, and the decoder in the receiver can be implemented so as to ignore (and not treat as auxiliary data) that bit of such unmodified word which is transmitted in the transition control bit slot. Also, the system should be implemented so as to avoid unintended identification of a blanking interval by the receiver, such as in the case that a sequence of encoded video words, transmitted when DE is high with transition control bits replaced by auxiliary data bits, happens to define a sequence of two or three occurrences of any of the four special words which, when recognized by the decoder in the receiver, are considered to indicate that DE is low. An unintended identification of a blanking interval by the decoder could cause the byte boundary to be realigned to the wrong boundary, with the undesirable result that all subsequent data are lost until the next real byte boundary matching is accomplished.

In a preferred implementation of a TMDS link, a byte boundary is realigned only in response to the occurrence of three consecutive ones of the above-mentioned special characters (which are transition maximized words). Thus, in such implementation of a TMDS link, encoding and decoding of words (with auxiliary data bits transmitted in the slots conventionally used to transmit transition control bits) is desirably accomplished as follows: if two consecutive ones of the encoded video words have auxiliary bits (in their transition control bit slots) that indicate that these words are transition maximized words, the encoder transmits the next encoded video word without an auxiliary data bit (and instead with a bit in the transition control bit slot indicating that the word is a transition minimized word). The decoder ignores a bit in a the transition control bit slot (i.e., does not treat such bit as an auxiliary data bit occupying the space of a transition control bit) of each received encoded word where such bit indicates that the word is a transition minimized word, but only if the two previously received encoded words had bits in their transition control bit slots (actually auxiliary data bits occupying the spaces of transition control bits) indicating that those words were transition maximized words. In embodiments in which the encoding is accomplished (in the transmitter) in such a manner that the transmitter never transmits a sequence of three encoded video words that are likely to trigger unintended identification by the decoder of a blanking interval (such as if the signal transmitted is Manchester encoded), the decoder does not need to be configured to have the described capability (of ignoring the third transition control bit of the described sequence).

Consistent with the previous paragraph, it should be appreciated that the decoder can be implemented to determine whether it will treat a transition control bit as an auxiliary data bit either from the form of the single received word including such transition control bit or from a short past history of the data words received at the decoder. For an example, the decoder can examine a short past history of the data words received at the decoder by examining the DC balancing bits of each of the N of the most recently received data words, to determine whether the transition control bit of the next data word should be treated as an auxiliary data bit.

Since the auxiliary data rate is not guaranteed in several of the embodiments described in the preceding several paragraphs, each of the transmitter and the receiver in each of such embodiments should include a FIFO to prevent underrun and overrun of the auxiliary data stream. In a pseudo random signal stream, the auxiliary signal bandwidth provided is large since the transmitter can send almost 1 auxiliary data bit per clock cycle in the described way per channel.

If the fabrication technology permits far more complicated implementation of this invention, it is possible to exploit this further more to increase the bandwidth for auxiliary data transmission. Instead of blindly skipping every third auxiliary data bit (under the noted circumstance in which two bits of the transition maximizing type are followed by a bit of the transition minimizing type), the decoder can check whether the pattern determined by each word the actually matches one of the four special character patterns, and if it does not match, it can simply treat the transition control bit as an auxiliary data bit.

The described encoding method for transmitting auxiliary data in the place of transition control bits is compatible with existing TMDS receivers. It can be implemented even in TMDS receivers that are configured to perform pseudo pixel error detection (as described in U.S. patent application Ser. No. 09/905,615, filed on Jul. 13, 2001, and assigned to the assignee of the present invention). Since one does not need to check the pseudo pixel error rate, when such error detection is used, the transmitter either stops sending auxiliary bits or sends the auxiliary data bits in a pattern known to the error detector in the receiver, so that the error detector in the receiver knows what to expect. The latter embodiment is preferred over the former one because the known pattern of auxiliary data bits can cause the receiver to stop checking the pseudo error pattern.

In other embodiments of the invention, the transmitter of a TMDS-like link sends auxiliary data over all or some of the analog lines (e.g., the lines labeled "Analog" in FIG. 1) conventionally used for transmitting analog video to the receiver). For example, such "analog" lines can be used to transmit auxiliary data (e.g., audio data related to digital video data) in systems in which analog video is not actually transmitted over the analog lines. Alternatively, the auxiliary data can be transmitted in the blanking intervals of analog video being transmitted over the analog lines.

In other embodiments of the invention, the transmitter of a TMDS-like link sends auxiliary data over all or some of the power lines (e.g., the lines labeled "Power" in FIG. 1) conventionally used for providing DC power to the receiver and a monitor associated with the receiver. In some implementations, the auxiliary data is AC coupled onto the power lines (e.g., while the power lines are coupled to a power supply). In other implementations, the power lines are disconnected from the power supply to allow auxiliary data to be transmitted over them, and the power lines are reconnected to the power supply after transmission of the auxiliary data.

In variations on the embodiments described herein, the auxiliary data are transmitted from the receiver to the transmitter of a TMDS-like link using any of the described channels and techniques (with the required auxiliary data and auxiliary clock transmission circuitry in the receiver and the required auxiliary data and auxiliary clock recovery circuitry in the transmitter) or variations on such channels and techniques. In other variations, two or more channels and/or techniques are used (simultaneously or sequentially) to transmit auxiliary data in either direction between the transmitter and receiver of a TMDS-like link. For example, the auxiliary data and clock signals can be switched from one channel or function to another, or transmission thereof can be switched on and off over time (e.g., time-division-multiplexing can be used to send auxiliary data and video data at different times over a single channel). Or auxiliary data or auxiliary clock signals can be multiplexed onto one or more existing power, clock, or data paths, using either frequencies or modulation levels to split them back out at the far end.

In another class of embodiments, video data are transmitted over a TMDS link, or another TMDS-like link that encodes transmitted data in a manner such that the receiver can generate a "DC disparity value" indicative of accumulated DC disparity of a transmitted quantity of encoded data. In the embodiments in this class, auxiliary data or a clock therefor is transmitted by transmitting encoded data values (indicative of input video data) that modulate the "DC disparity value" of a transmitted quantity of the encoded data. E.g., the instantaneous "DC disparity value" can be interpreted as a "zero" bit of auxiliary data if the instantaneous "DC disparity value" is positive, or as a "one" bit of auxiliary data if the instantaneous "DC disparity value" is negative.

We first describe a transmitter (e.g., transmitter 1' of FIG. 6) that is modified in accordance with the invention to transmit auxiliary data over a TMDS link by this type of "DC disparity value" modulation technique. The encoding employed in transmitting video over a TMDS link maps 8 bit binary signal space onto 10 bit binary space. Each 8-bit quantity of input video data (D[7:0]) is first mapped to a 9-bit value (E[8:0]) in a "transition minimized" region of 9 bit binary signal space, and each 9-bit value in the transition minimized region is then mapped to a 10-bit value (Q[9:0]) in DC balanced 10 bit signal space. Current implementations of TMDS transmitters count the accumulated difference between the number of "one" bits of each 9-bit value E[8:0] and the number of "zero" bits of such values, and generates the next value of Q[8:0] by either inverting or not inverting the most recently generated value E[8:0]. The tenth bit Q[9] indicates whether or not the other nine bits Q[8:0] are an inverted or non-inverted version of the corresponding value E[8:0]. Conventionally, the coding is performed so that the accumulated DC value of a stream of the encoded video data words Q[9:0] is close to zero (i.e., less than a positive threshold and greater than the inverse of such positive threshold). Thus, if the voltage on the conductors employed to transmit the encoded data is integrated over time, the integrated voltage will be close to ground potential (or some other DC reference potential). Specifically, if the transmitter determines that the accumulated DC disparity is negative, then the next word of video data is encoded as a word having positive DC disparity (to raise the next value of accumulated DC disparity upward toward zero.

In accordance with the invention, a conventional encoding algorithm is modified to replace the conventional DC balancing rule with a loosened rule. The video data encoded in accordance with the invention can have a DC disparity which deviates significantly from zero (although it preferably averages to zero in the long run), and the instantaneous level of its DC disparity is indicative of the auxiliary data (or clock information) to be transferred. The receiver of the inventive system is configured to process the tenth bits Q[9] of a stream of encoded video data words Q[9:0], which have been encoded according the inventive encoding algorithm (having the above-noted "loosened" DC balancing rule), to generate one DC disparity value (per encoded video word) indicative of the accumulated DC disparity of the data. This DC disparity value as a function of time (and/or the difference between successively determined ones of the DC disparity values) determines the auxiliary data (or clock information) that has been transmitted over the link. For example, the occurrence of a positive DC disparity value for video word M and a greater positive DC disparity value for the next video word (M+1) can be interpreted as a "zero" auxiliary data bit; the occurrence of a positive DC disparity value for video word M and a smaller DC disparity value for the next video word (M+1) can be interpreted as a "one" auxiliary data bit; the occurrence of a negative DC disparity value for video word M and a more negative DC disparity value for the next video word (M+1) can be interpreted as a "zero" auxiliary data bit; and the occurrence of a negative DC disparity value for video word M and a less negative DC disparity value for the next video word (M+1) can be interpreted as a "one" auxiliary data bit.

The simplest way of sending auxiliary bits over a DC disparity channel is to set multiple DC disparity thresholds, which typically define N ranges (where N is greater than or equal to two) of positive DC disparity values and N ranges of negative DC disparity values, and to use each such range of DC disparity values (and/or variations in DC disparity value from clock cycle to clock cycle in each such range) to indicate a different auxiliary data value. Consider an example in which there are two thresholds of positive DC disparity values and two thresholds of negative DC disparity values. We shall denote the low and high thresholds of the positive DC disparity as +A and +B, respectively, and the low and high thresholds of the negative DC disparity as −A and −B, respectively. Such thresholds divide the DC disparity space into five disjoint zones: Zone I comprising disparity values between −A and +A; Zone II comprising disparity values between +A and +B; Zone III comprising disparity values between −A and −B; Zone IV comprising disparity values greater than +B; and Zone V comprising disparity values less than −B. When the accumulated DC disparity is in Zone I, the value of one auxiliary data bit per clock cycle can be determined by either violating or not violating the DC disparity rule (e.g., by producing an increased or decreased DC disparity value for cycle M+1 in response to occurrence of a positive DC disparity value for cycle M). This technique can also be employed when the DC disparity is within Zone II or Zone III. However, when the DC disparity is in Zone IV or V, the corresponding auxiliary data bit can be deemed invalid, and a DC balancing encoding rule followed until the accumulated DC disparity returns to some other zone (e.g., to Zone I).

In typical implementations, the DC disparity is reset once per cycle of the data enable (DE) signal, e.g., once during each DE low period. If so, the current value of DC disparity is always precisely traceable using circuitry in either the transmitter or receiver. Hence, by tracing the behavior of DC disparity it is easy to determine the accumulated DC disparity in the receiver side at any time. Hence the receiver can track in which zone the current DC disparity lies and decode correctly the auxiliary data determined by the described DC disparity channel. The available bandwidth of the DC disparity channel depends on the code sequence and the set values of thresholds.

In the described threshold-setting example (which defines DC Disparity Zones 1-V), the DC Disparity level is bounded. In another example, the DC Disparity frequency is kept as high as possible (and the DC Disparity level is not bounded). DC balancing is typically required in systems with AC coupling. Since the coupling capacitance and the line impedance in such systems are finite, some but not all implementations of the inventive technique (use of a DC disparity channel for auxiliary data transmission) would be practical in a system with AC coupling. For this reason, it is expected that embodiments of the inventive method and system (for auxiliary data transmission over a DC disparity channel) that require a bounded DC disparity level are likely to be useful in more contexts than embodiments in which the DC Disparity level is not bounded. The former embodiments will likely be preferable to the latter embodiments even in the context of DC coupled systems, since if the cable is long, DC wander (in the cables which transmit the encoded video data) becomes a problem and auxiliary data transmission that actually increases DC level wandering makes the data eye smaller.

In order to keep the DC disparity control frequency high enough for transmission over a link employing AC coupling, it will typically be necessary to monitor the signal frequency of the DC disparity and encode video data in such a way as to violate the DC disparity minimization rule until the monitored frequency reaches the limit needed for signal transmission. It is also useful to monitor the run length of the periods in which the DC disparity channel is used for auxiliary data transmission. At times when the DC disparity channel cannot be used, another channel is employed for auxiliary data transmission.

In another class of embodiments, auxiliary data are transmitted over a TMDS link as the tenth bit Q[9] of each ten bit TMDS-encoded word for which the DC disparity has been determined to be zero. This bit Q[9] is conventionally used to indicate whether or not the other nine bits Q[8:0] have been inverted during the encoding process. If the encoder determines that the DC disparity of a word is zero, the choice of the value of Q[9] is arbitrary for purposes of decoding the nine bits Q[8:0]. This is because the receiver can readily determine that the DC disparity is zero for the recovered version of the word, and thus assume that the other nine bits Q[8:0] have not been inverted during the encoding process.

Thus, if the encoder determines that the DC disparity of a word is zero, it can use the tenth bit Q[9] of the word to indicate one bit of binary auxiliary data. The receiver will check DC disparity for each recovered word in the conventional manner. If the receiver determines that the DC disparity of a recovered word is zero, it assumes that the tenth bit Q[9] of the recovered word is an auxiliary data bit and treats it accordingly.

Analog audio signals (or other analog auxiliary signals) can be transmitted in accordance with the invention in DC disparity channels of a TMDS-like link. In each DC disparity channel, as the accumulated DC disparity changes, the maximum allowed DC disparity value (beyond which the DC disparity channel cannot be used) can be dynamically changed, so that the envelope of the DC disparity wander can itself be considered an analog signal indicative of the auxiliary information to be transmitted (e.g., an analog audio signal which can be amplified at the receiver side and then used to drive a loudspeaker). This is especially useful if the information to be transferred is in analog form, because the receiver can be easily implemented to reconstruct the original analog information transmitted over a DC disparity channel.

Figure 23:
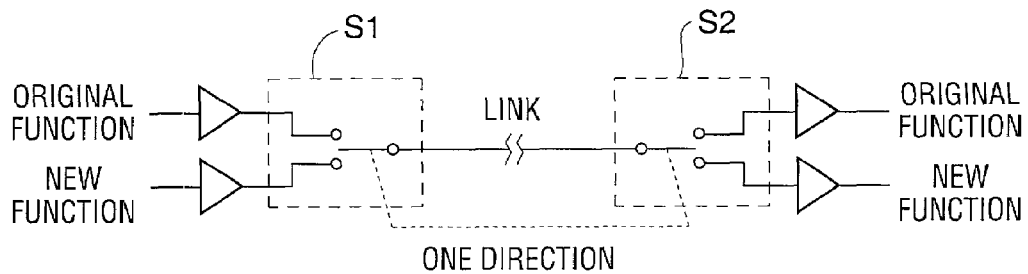
FIG. 23 is a block diagram of a portion of another embodiment of the inventive system.
Figure 24:
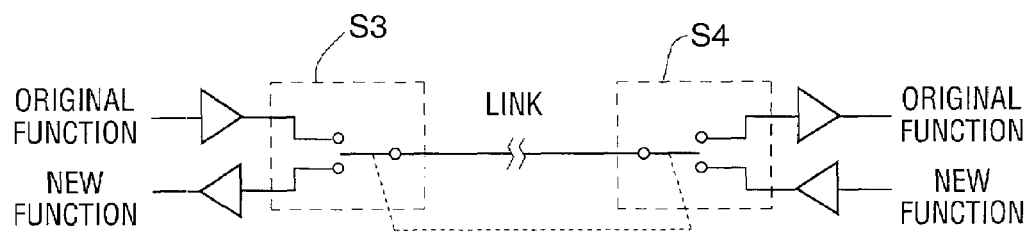
FIG. 24 is a block diagram of a portion of another embodiment of the inventive system.

We next consider another class of embodiments of the invention. One of the simplest ways of re-using a channel of a TMDS-like link (e.g., to transmit auxiliary data or a clock therefor in one direction over the channel, and some other signal in another direction over the same channel) is to provide a switch at each end of the channel, as in FIGS. 23 and 24. In both FIG. 23 and FIG. 24, one channel of a TMDS-like link extends between first circuitry on the left side (one of a transmitter and a receiver) and second circuitry on the right side (the other of the transmitter and the receiver). In FIG. 23, the first circuitry is configured to transmit one or more conventional signals (labeled "Original Function") and one or more auxiliary signals (labeled "New Function") over the link to the second circuitry, and the second circuitry is configured to recover each transmitted conventional signal and auxiliary signal. In FIG. 24, the first circuitry is configured to transmit one or more conventional signals (labeled "Original Function") over the link to the second circuitry, the second circuitry is configured to transmit one or more auxiliary signals (labeled "New Function") over the link to the first circuitry, the second circuitry is configured to recover each transmitted conventional signal, and the first circuitry is configured to recover each auxiliary signal. In FIG. 23, switch S1 in the first circuitry and switch S2 in the second circuitry are controlled by a common control signal to pass either the conventional signal(s) or the auxiliary signal(s) from the first circuitry to the second circuitry. In FIG. 24, switch S3 in the first circuitry and switch S4 in the second circuitry are controlled by a common control signal to pass either the conventional signal(s) from the first circuitry to the second circuitry or the auxiliary signal(s) from the second circuitry to the first circuitry. Each of switches S1-S4 can be implemented as a digital or analog selector or multiplexer, or as a more complicated state machine which performs "routing" or sorting functions and optionally also other functions.

The described switching can occur at any of many different times. For example, it can occur early in a session (e.g., immediately after the Original Function accomplishes a setup operation). Or it can occur at different times (e.g., at regular intervals) during a session.

Consider a specific example of the system of FIG. 23 (or 24) in which the TMDS-like link is a DVI link, the first circuitry is the receiver and the second circuitry is the transmitter of the DVI link, the "Original Function" is a conventional Hot Plug signal (of the type mentioned above), and the "New Function" is a stream of audio data (or other auxiliary data). The Hot Plug signal is conventionally a DC level. The FIG. 23 link can be implemented so that switches S1 and S2 pass the Hot Plug signal only at the start of a session (or when new peripheral equipment is coupled to the first circuitry) and switches S1 and S2 otherwise pass the auxiliary data. The FIG. 24 link can be implemented so that switches S3 and S4 pass the Hot Plug signal from the receiver to the transmitter only at the start of a session (or when new peripheral equipment is coupled to the first circuitry) and switches S3 and S4 otherwise pass the auxiliary data from the transmitter to the receiver. Thus, a single channel of the link can transmit the Hot Plug status information, as well as great deal of new information (auxiliary data). Note that in this example the system should be designed to enable the switching functionality only if the transmitter (receiver) is configured to send and the receiver (transmitter) is configured to receive auxiliary data. Otherwise (to ensure backward compatibility), the system should operate in a default mode in which the switches (S1 and S2, or S3 and S4) are in a state in which they pass only the Hot Plug signal.

Consider another example of the system of FIG. 23 (or 24) in which the TMDS-like link is a DVI link, the first circuitry is the transmitter and the second circuitry is the receiver of the DVI link, the "New Function" is a stream of audio data (or other auxiliary data), and the "Original Function" is a voltage between power and ground lines of the conventional Display Data Channel ("DDC") of a DVI link. In a conventional DVI link, this voltage is asserted over the DDC channel to provide very low power to a monitor (coupled to the receiver) so that the monitor's EDID data is available even when it is in a sleep mode (or other mode in which it draws reduced power). Such provision of power over the DDC channel is usually not needed when the downstream device is in a fully active mode (in which it draws full power from a source other than the DDC channel). In accordance with the invention, the transmitter is configured to determine when it is not necessary to provide power over the DDC channel (e.g., by measuring the downstream device's current consumption, or by a priori knowledge of the downstream device's design and present state), and to send (or receive) the auxiliary data over the power and/or ground lines of the DDC channel at times when it is unnecessary to provide power over these lines. Specifically, the FIG. 23 link can be implemented so that switches S1 and S2 pass the voltage when it is needed by the downstream device and switches S1 and S2 otherwise pass the auxiliary data from the transmitter to the receiver, and the FIG. 24 link can be implemented so that switches S3 and S4 pass the voltage when it is needed by the downstream device and switches S3 and S4 otherwise pass the auxiliary data from the receiver to the transmitter.

Figure 25:
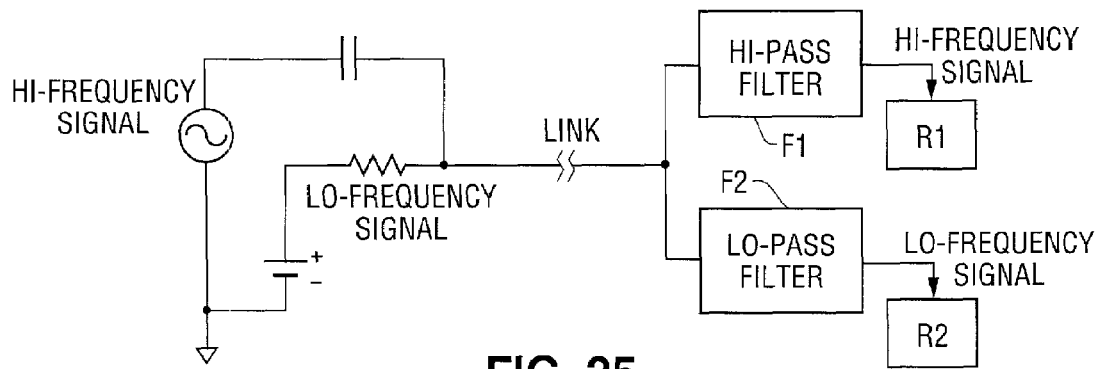
FIG. 25 is a block diagram of a portion of another embodiment of the inventive system.

Another way of re-using an existing channel of a TMDS-like link (to send auxiliary data in accordance with the invention) is to superimpose the auxiliary data on the voltage or signal conventionally asserted over the channel. For example, frequency multiplication can be used as shown in FIG. 25. In FIG. 25, one channel of a TMDS-like link extends between first circuitry on the left side (one of the link's transmitter and receiver) and second circuitry on the right side (the other of the transmitter and the receiver). The first circuitry is configured to transmit one or more conventional signals over the channel as a "Hi-Frequency Signal" in a first wavelength band (or a "Lo-Frequency Signal" in a second wavelength band lower than the first wavelength band) and one or more auxiliary signals as a "Lo-Frequency Signal" in the second wavelength band (or as a "Hi-Frequency Signal" in the first wavelength band, if the conventional signal(s) are transmitted in the second wavelength band) to the second circuitry. In the second circuitry, the signals transmitted over the channel pass through high pass filter F1 (configured to pass the first wavelength band but not the second wavelength band) and low pass filter F2 (configured to pass the second wavelength band but not the first wavelength band), the output of filter F1 is coupled to circuitry R1 configured to recover each transmitted conventional signal, and the output of filter F2 is coupled to circuitry R2 configured to recover each transmitted auxiliary signal. In the FIG. 25 embodiment, two different signals with different base frequencies are mixed onto a single channel (e.g., a pair of conductors) of a TMDS-like link. There is no fundamental limit to the number of signals that can be multiplexed using this technique. While only two signals are multiplexed in typical implementations of the FIG. 25 system, many more than two could share the channel in practice (each being transmitted in a different wavelength band than all the others). Conventional communications systems routinely carry hundreds and even thousands of signals in this fashion, and the techniques employed in such systems can be used to implement embodiments of the present invention.

The frequency multiplexing technique is particularly applicable to a channel (of a TMDS-like line) whose conventional function is to deliver DC power to a receiver. Since a DC power supply is a very low frequency signal, bypass capacitors in the receiver can implement low pass filter F2. Note that the presence of high-frequency components of a signal transmitted over a single channel often would not interfere with a conventional receiver configured to draw DC power only from the channel when each conductor of the channel is maintained at a DC level. Thus, the frequency multiplexing approach is expected to have good backwards compatibility.

We next consider a specific example of the FIG. 25 embodiment, in which the TMDS-like link is a DVI link, the first circuitry is the transmitter and the second circuitry is the receiver of the DVI link, the "Hi-Frequency Signal" is a stream of audio data (or other auxiliary data), and the "Lo-Frequency Signal" is a voltage between power and ground lines (sometimes referred to as an EDID power line) of the conventional Display Data Channel ("DDC") of a DVI link. Imposition of high frequency, low amplitude auxiliary data on the EDID power line (by either the transmitter or the receiver) would not affect the transmitter's ability to deliver DC power to the receiver if the receiver includes a suitable implementation of low pass filter R2. The frequency of the high frequency "carrier" for the auxiliary data should be sufficiently high that it can be easily separated from normal DC power supply noise, and so that distributed inductance in the system will provide the necessary impedance necessary to get the best signal through.

The frequency multiplexing technique described with reference to FIG. 25 can be implemented to transmit auxiliary data from either the receiver or the transmitter side of the TMDS-like link to the other side of the link. The frequency multiplexing technique can even be used bi-directionally, either to transmit auxiliary data successively from the transmitter to the receiver and from the receiver to the transmitter (half-duplex), or to transmit auxiliary data simultaneously from the transmitter to the receiver and from the receiver to the transmitter (full-duplex) by using different carrier frequencies.

For example, in a variation on the FIG. 25 embodiment, the TMDS-like link is a DVI link, the transmitter of the DVI link transmits to the receiver (over a Hot Plug Detect line of the link) a "Hi-Frequency Signal" that is a stream of auxiliary data, and the receiver simultaneously transmits to the transmitter over the same line a "Lo-Frequency Signal" that is a Hot Plug signal.

For another example, in a variation on the FIG. 25 embodiment, the TMDS-like link is a DVI link, the transmitter of the DVI link transmits to the receiver (over the DDC channel of the link) a "Hi-Frequency Signal" that is a stream of auxiliary data, and the receiver simultaneously transmits to the transmitter over the DDC channel a "Lo-Frequency Signal" that is an EDID message.

Figure 26:
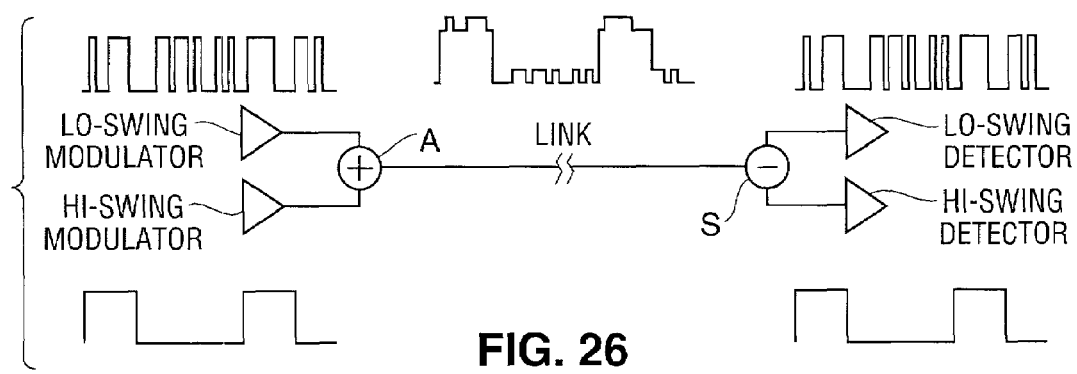
FIG. 26 is a block diagram of a portion of another embodiment of the inventive system.

Threshold level multiplexing is another technique for combining two or more signals (e.g., auxiliary data and a conventional signal) on a single channel of a TMDS-like link. The concept will be described with reference to FIG. 26. In FIG. 26, two signals are combined (in either the transmitter or receiver of a TMDS-like link): a first signal (generated by a "low swing modulator" and indicative of a first data stream) whose level varies with time between small values (each differing from a reference level by less than a threshold value), and a second signal (generated by a "high swing modulator" and indicative of a second data stream) whose level varies with time between the reference level and one or more large values (each of which differs from the reference level by more than the threshold value). In the FIG. 26 implementation, the first signal is superimposed on the second signal (by adding the two together in adder A), and the combined signal is transmitted over a single channel of the TMDS-like link to the other side of the link (either the receiver or the transmitter) where separation circuit S separates the transmitted signal is separated into two components (a low swing component whose level varies with time between the reference level and values which differ from the reference level by less than the threshold value; and a high swing component whose level varies with time between the reference level and values which differ from the reference level by more than the threshold value). The low swing component that is output from separation circuit S is asserted to a low-swing detector ("Lo-swing detector") which recovers the first data stream therefrom. The high swing component that is output from separation circuit S is asserted to a high-swing detector ("Hi-swing detector") which recovers the second data stream therefrom. The high-swing detector can be implemented simply if the low swing component's peak-to-peak amplitude is less than the minimum noise margins of the high swing detector. If the first data stream is auxiliary data transmitted in accordance with the invention and the second data stream is video data (or other binary data transmitted in a conventional version of the link which lacks the low swing modulator, separation circuit S, and the low-swing detector), the high swing detector can be identical to the circuitry employed in the conventional version of the link to recover the transmitted video data (or other conventional binary data). Thus, backwards compatibility is ensured.

To separate out the low swing component accurately, separation circuit S must be implemented to distinguish between the low swing component and noise associated with the high swing component (as well as the high swing component itself). Any of a variety of techniques can be employed to simplify implementation of separation circuit S. For example, the high swing and low swing components can be frequency multiplexed (each transmitted in a frequency band distinct that of the other). It will sometimes be sufficient to guarantee that the edge rates of the high swing component are long with respect to those of the low swing component. In the latter case, separation circuit S can be implemented as a relatively simple filter.

Alternatively, the low swing modulator and high swing modulator can be implemented using a state machine to ensure that the low swing component never transitions (or always transitions) at the same time the high swing component does. In this case, separation circuit S can be replaced by a short circuit and outputs of the low swing detector and the high swing detector can be processed in the digital domain to separate the low swing component from the high swing component.

The low swing and high swing modulation technique can be used bi-directionally, either to transmit auxiliary data successively from the transmitter to the receiver and from the receiver to the transmitter (half-duplex), or to transmit auxiliary data simultaneously from the transmitter to the receiver and auxiliary data (or other data) from the receiver to the transmitter (full-duplex) by using high swing components to transmit one type of data and low swing components to transmit the other type of data. For example, in a variation on the FIG. 26 system, the TMDS-like link is a DVI link, a Lo-Swing modulator in the transmitter sends a stream of auxiliary data over the Hot Plug Detect line of the link, and a High-Swing modulator in the receiver simultaneously transmits to the transmitter over the same line a Hot Plug signal.

With reference again to FIG. 26, in one implementation of the FIG. 26 system, the TMDS-like link is a DVI link whose Display Data Channel lines ("DDC" lines or "DDC bus") are the channel over which the combined signal output from adder A is transmitted. The DDC bus conventionally transmits both a clock and a data signal. These signals are generally at TTL levels (greater than about 3 Volts), their bandwidth is less than 400 KHz, and the DDC bus is infrequently used during a session. Further, the DDC bus is designed for "open-collector" or "open-drain" usage. Thus, low-amplitude auxiliary data can easily be superimposed on either or both of the clock line and the data line of the DDC bus in accordance with the invention. Preferably, the auxiliary data (determined by the output of the low swing modulator) is transmitted in a frequency band that is significantly higher than the nominal bandwidth of the DDC signals transmitted over the DDC bus. Optionally, simple collision detection circuitry is coupled to the low swing modulator and high swing modulator. The collision detection circuitry momentarily shuts off the low swing modulator in response to each transition on the DDC bus transition (as indicated by the output of the high swing modulator). In some implementations, the collision detection circuitry is omitted (e.g., because the open-drain structure and distributed capacitance of the DDC bus guarantees edge rates that are sufficiently slow so that collision detection circuitry is unnecessary).

The DDC bus can retain its existing function without any kind of modification, and thus a transmitter or receiver implementing the circuitry on the left side (or the right side) of FIG. 26 is fully backward compatible with a conventional DVI receiver or transmitter. Since a conventional DDC bus is bidirectional, two of the FIG. 26 circuits can be included in an embodiment of the invention (one with the circuitry on the left side of FIG. 26 in the transmitter and the other with the circuitry on the right side of FIG. 26 in the transmitter) to allow bidirectional transmission of the auxiliary data as well as the DDC signals. One auxiliary data stream is carried on the forward-propagating DDC signal; the other auxiliary data stream is carried on the reverse-propagating DDC signal.

In all embodiments of the invention in which auxiliary data are transmitted over a DDC bus, the auxiliary data can be transmitted in accordance with the invention using much greater bandwidth than that conventionally used to transmit DDC signals over a DDC bus, and the DDC bus can be implemented with much longer length than is typical for a conventional DDC bus. Each transmitter and receiver that incorporates a DDC interface (modified in accordance with the invention) is preferably implemented to have backward compatibility with legacy devices (transmitters or receivers that incorporate a conventional DDC interface).

Clearly, many combinations of the described auxiliary data (and clock) transmission strategies (and variations thereon) are possible. For example, switching can be combined with frequency or level multiplexing schemes to change either the direction of auxiliary data transmission, or to eliminate conflicts or interference with conventional functions. As mentioned above, frequency and threshold multiplexing can be used together to both simplify the filtering function at the far end of the link, and to maximize backwards compatibility.

Auxiliary data transmitted over one channel of a TMDS-like link can be used to negotiate operational parameters on another channel of the link. For example, the auxiliary data can include information about modes supported or modes in use, or it can include information that improves performance or extends use beyond a standardized norm.

A number of methods and modes for re-using existing channels of a TMDS-like link (to carry auxiliary data) have been discussed above. Implicit in this re-use is the need to determine the methods and modes for auxiliary data transmission that can be used in any particular configuration. There are a number of mechanisms for doing this. These include direct control of both sides of the link by a smart agent on one side, and a number of decision scenarios. Some of the mechanisms assume that some channel has already been established for transmission over the link, and can be used to initialize, test, or configure another channel.

For example, the receiver of a DVI link can be configured to send an "auxiliary data capability" signal to the transmitter over the DDC bus, such as by a supplement to a conventional Extended Display Identification ("EDID") information. The conventional EDID information specifies various characteristics of a monitor coupled to the receiver. The auxiliary data capability signal would indicate the capability of the receiver to send and/or receive one or more specified types of auxiliary data on one or more specified channels of the link. More generally, one or both of the transmitter and receiver of a TMDS-like link can be configured in accordance with the invention to send an "auxiliary data capability" signal (to the other one of the receiver and transmitter) over one or more channels of the link (either singly or in combination) to indicate its capability to send and/or receive one or more specified types of auxiliary data on one or more specified channels of the link. For example, the transmitter and receiver of a TMDS link can be configured to negotiate (over a video clock channel, such as channel C of FIG. 1) a protocol for auxiliary data transmission, during which negotiation the transmitter receives an auxiliary data capability signal indicative of the receiver's capability to receive the auxiliary data.

The recipient of the "auxiliary data capability" signal (e.g., the transmitter of a TMDS-like link) responds to such signal by entering an operating mode compatible with the auxiliary data transmission and reception capabilities of the signal's sender (e.g., the receiver of the link). For example, in one such mode, the transmitter does not send auxiliary data to the receiver (where the "auxiliary data capability" signal has indicated that the receiver is incapable of receiving auxiliary data). For another example, when the "auxiliary data capability" signal indicates the location within each video blanking interval at which the transmitter sends audio data, the receiver operates in a mode in which it recovers audio data present at the specified locations in the blanking intervals. The "auxiliary data capability" signal can also specify the frequency of a stream of audio data to be transmitted, so that the receiver can respond by appropriately setting a clock rate for recovering the transmitted audio data. The "auxiliary data capability" signal can also specify the format of a stream of audio (or other auxiliary) data to be transmitted.

Some implementations employ single-sided control, in which a smart agent (e.g., a software driver or firmware) on one side of the link has direct control over auxiliary data transmission and reception operating modes for both sides of the link. For example, where the receiver and transmitter include control registers for asserting selected control signals to switches S1 and S2 of FIG. 23 (or switches S3 and S4 of FIG. 24) to determine whether auxiliary data or conventional signals are transmitted over the link, a smart agent in the transmitter can respond to an auxiliary data capability signal from the receiver by determining which control signals are asserted by the control registers (and at what times or in which time intervals they are asserted). Alternatively, a single control register (in either the transmitter or receiver) is employed to assert selected control signals to the switches on both sides of the link, and the smart agent on one side of the link determines which control signals are asserted by the control register.

Other implementations employ dual-sided control in which a separate smart agent on each side is responsible for controlling the mode on that side only. The two agents can coordinate their efforts or they can work entirely independently. In order for the two agents to coordinate their efforts most effectively, a bi-directional data path is needed between them. One way to implement such a bi-directional data path is with "mailbox" registers on one or both sides of the link: one register for data transmission from the transmitter to the receiver; the other for data transmission from the receiver to the transmitter. The registers can be accessible over the DDC bus of a DVI link, but they can alternatively be implemented on any data channel (of a TMDS-like link) that has bi-directional capability. Some embodiments would also include one or more "status" registers that indicate when a mailbox register (mailbox) is full, and conversely when the mailbox has been emptied. A higher level protocol would define the structure and the meaning of the messages (and the responses) that are passed back and forth over the link to or from the mailboxes. To use the mailboxes, the receiver or transmitter must know when there is a message waiting for it. One mailbox could reside on each side of the link and provide a local interrupt when it is full. An interrupt can be propagated from the receiver side to the transmitter side using any of the techniques discussed above for sending auxiliary data (as well as conventional data) over a channel of a TMDS-like link. For example, a high frequency, low amplitude pulse can be sent from the receiver to the transmitter on one or both power lines of a DDC bus to signal that the receiver needs some attention. A full mailbox could be one of the conditions indicated by the interrupt, but there could be others as well. When the transmitter receives an interrupt pulse it could propagate the interrupt to an upstream device, and the appropriate driver or other agent could then interrogate the receiver's status register to determine the exact condition present.

Regardless of whether a single- or dual-sided control strategy is used, a variety of decision mechanisms are possible. These break down into essentially two categories: unilateral decisions and negotiated decisions.

Unilateral decisions are those made entirely by one side of the link. They include testing for presence, testing for success, and testing for failure.

Testing for presence is a technique for determining whether or not an advanced mode (an auxiliary data transmission or reception mode) can be supported. It works by actually testing to see whether auxiliary data are being transmitted over one channel in accordance with a first advanced mode, and if so, causing additional auxiliary data to be transmitted over another channel in accordance with a second advanced mode (which can be identical to or different from the first advanced mode). The technique assumes that transmission of auxiliary data over the other channel according to the second advanced mode will not interfere significantly with conventional signal transmission over such other channel (either in general or at the specific moment that the test is conducted). For example, if the first advanced mode transmits auxiliary data using a high frequency carrier superimposed on another signal in a first channel, the intended target could test for the presence of this carrier in the first channel and use the information resulting from the test to decide whether or not to initiate auxiliary data transmission in a second channel in accordance with a second advanced mode.

Testing for success is another technique that can be used to determine whether auxiliary data can be transmitted (in accordance with an "advanced" mode) over a channel of a TMDS-like link. This technique can be used where a test for proper operation can be devised, and the test can be accomplished without untoward risk to the link or its operation. More specifically, the technique works as follows: a temporary (tentative) attempt is made to transmit auxiliary data over the channel in accordance with the advanced mode; the system is then checked for a specific expected result; if the expected result does not occur, then no further attempt is made to transmit auxiliary data over the channel in accordance with the advanced mode; and if the expected result does occur, transmission of auxiliary data over the channel in accordance with the advanced mode continues. Such attempts can be performed periodically, only after a change in system configuration is noted, or only once (at installation time, for example).

The expected result can take any of several forms. In some cases any response to a message is considered an "expected" result. In other cases the response must include a CRC (cyclic-redundancy check), some other calculated value, a data structure, a digital signature, or another verifiable element to be considered an "expected" result.

Testing for failure is another technique that can be used to determine whether auxiliary data can be transmitted (in accordance with an "advanced" mode) over a channel of a TMDS-like link. This technique is particularly useful where a transmitter capable of transmitting auxiliary data in accordance with the advanced mode is not fully backward compatible with a receiver that is capable only of receiving conventional signals over the channel, and where the receiver could behave erratically in response to an attempt to transmit auxiliary data to it over the channel. There is a subtle but important difference between this strategy and the "test for success" strategy discussed previously. In the case of a "test for success," the test is benign and does not harm the system in any appreciable way. In the case of a "test for failure," the test can cause a failure and may require subsequent intervention. A "test for failure" includes the following steps: a temporary (tentative) attempt is made to transmit auxiliary data over the channel in accordance with the advanced mode and the resulting behavior of the system is observed or explicitly tested; if the system fails, no further attempt is made to transmit auxiliary data over the channel in accordance with the advanced mode, the system is restarted if necessary (or other action is taken to cause the system to recover from the failure) and the system is thereafter operated only in a conventional mode in which conventional signals are transmitted over the channel; and if the system does not fail, transmission of auxiliary data continues over the channel in accordance with the advanced mode. The temporary attempts to transmit auxiliary data can be retried periodically, only after a change in configuration is noted, or only one such attempt can be made (at installation time, for example).

To be useful, a "test for failure" must not cause any catastrophic system failure from which the system cannot recover. In variations on the described "test for failure" technique, a test or "ping" methodology is used to perform a check for some characteristic condition (e.g., an error), in response to an attempt to transmit auxiliary data, without causing a system failure. If the possible errors (or characteristic conditions) are transient or very rare, then a scheme for intentionally degrading the system's performance during the test can be implemented, in an effort to increase the certainty and validity of the check. For example, in one such "test for error," auxiliary audio data are transmitted (in accordance with an advanced mode) by modulating the trailing edge of a video clock (while video data are transmitted in another channel) and the test determines whether operation in the advanced mode causes audio and/or video bit-error rates to exceed acceptable limits. Such bit errors can be exceedingly rare and can be dependent on slowly changing environmental factors. Therefore some other parameter in the transmitter or receiver can be intentionally degraded during the test, and the measured error rates then extrapolated to calculate estimated error rates in the "nominal" (non-degraded) system.

We have discussed several methods for making essentially unilateral decisions (by either the transmitter or receiver) as to whether a TMDS-like link should be operated in an advanced mode in which auxiliary data are transmitted over some specific channel. In some of these methods, some decisions can be made on both sides of the link, but they are not coordinated to any great degree. It is also possible for both sides of the link to coordinate more closely in making mode selection decisions to reach negotiated decisions. A negotiated decision does not necessarily imply a smart agent on each side of the link. Rather, a single smart agent on one side can arbitrate on behalf of both the transmitter and receiver. However, the system must be configured for bi-directional communication between the transmitter and receiver. In essence, both sides share information about who they are and what they can do. Then this information is analyzed, and an intelligent decision made to select the best mode or behavior for the overall system. Finally, the decision is communicated and implemented.

In general, the transmitter asks the receiver (or the receiver asks the transmitter) to indicate its capabilities for sending and/or receiving auxiliary data over a specific channel. If the response indicates that the interrogated side does not have capability to do so (or if there is no valid response to the inquiry), the interrogator causes use of the channel to be limited to transmission of conventional data. If a valid response is received indicating that the interrogated side has capability to send or receive auxiliary data over the channel, the interrogator analyzes the response, chooses the best mode for both sides for auxiliary data transmission over the channel, communicates the choice to the interrogated side, and causes both sides to enter the selected mode. For example, where the link is a DVI link and the receiver stores information about its capabilities (for auxiliary data transmission and reception over each of a set of channels) in either the EDID prom or dedicated registers in the DDC space, the transmitter is implemented to include a smart agent which interrogates these capabilities over the DVI bus, matches those of the transmitter to those of the receiver, and then instructs the receiver on how to configure itself for auxiliary data transmission over a selected one of the set of channels.

In typical implementations of the invention, there are likely to be multiple modes for auxiliary data transmission and multiple decisions will be necessary about how to use these modes. Some combination of the previously discussed strategies might be required in a "staged" or bootstrapping manner to get the system to enter a suitable mode for auxiliary data transmission. For example, a suitable mode for auxiliary data transmission over a first channel can be determined, a suitable mode for auxiliary data transmission over a second channel can then be selected or set as a result of communication over the first channel, and then a suitable mode for auxiliary data transmission over a third channel can be selected or set as a result of communication over the first and second channels. There are many other scenarios possible as well.

Typically, it is assumed at the outset that only conventional channels are available for communication between the transmitter and receiver. Some combination of these are used to determine a proper mode (if any exists) for auxiliary data transmission over a first channel. Given such a mode, the first channel is then used to either select or set a proper mode (if any exists) for auxiliary data transmission over a second channel, and so on. In some embodiments, the operations would work in the following manner. First some tests are performed to determine that auxiliary data can be transmitted to the receiver over a clock channel by modulating the falling edge of the clock signal. Having established this, the transmitter could attempt to send a message to the receiver and ask it to enable a back channel (for auxiliary data transmission from the receiver to the transmitter). If the receiver is capable of understanding the message and complying with it, then the system enters into a negotiation phase using the clock channel and back channel. The result of this negotiation can be selection of optimum modulation levels for any of the channels, and/or selection of a specific preferred audio or color space format, and so on.

Another channel for sending auxiliary data over a link in accordance with the invention is to transmit the auxiliary data in the blanking periods of video data that is also being transmitted. This can be done in several ways. The major issue is to identify what is the video data and what is the auxiliary data. This can be done by prior agreement, by a negotiated timing at the time of initiating the communication, or by use of separate data enable (DE) signals for each of the data pairs. To the extent that the receiver lists its capabilities for auxiliary data reception and transmission, and the transmitter can conform to one or more of these, the bandwidth may be shared in an optimum way to send one or more types of data on the same physical connections.

In the specific case of a channel conventionally used for video data transmission, auxiliary data as well as video data can be sent over the channel in one or both directions using the same physical layer protocol of in-band and out-of-band characters, while at the same time using a macro layer to pack data in various protocols onto the same lines. For example, TMDS-encoded video data can be sent using in-band characters to indicate the pixel data. Using the same physical interconnect and either the same or a different in-band/out-of-band character scheme, auxiliary data can also be sent. If the auxiliary data are sent using the same physical encoding (for example the in-band characters in a TMDS-like link), then the receiver side must be able to distinguish between the normal and auxiliary data and separate them from the stream.

If the capabilities of the link are negotiated a priori, then the receiver can expect to receive auxiliary and video data according to a specifically defined set of protocols. As long as these protocols are within the set of its defined capabilities, then the receiver can utilize the information in all components of the stream.

Further, a receiver which senses information within the stream that is not expected can be made to reject or ignore that data without disrupting the integrity of the remaining information in familiar protocols. For example, a receiver which itself is capable of receiving, distinguishing and decoding a mixture of video and audio data can elect to ignore the audio data. This would be the case of such a receiver used in a peripheral which does not explicitly indicate its ability to receive audio data, yet which receives such data from a transmitter. For legacy reasons the transmitter, in the best case, should be prohibited from sending data that the receiver does not explicitly indicate it may use. However, if the peripheral must limit its use of auxiliary data it may do so by using a receiver device which can reject auxiliary data automatically.

A specific example would be the use of relatively short in-band character strings in a TMDS-like link to hold the auxiliary data, and relatively long in-band character strings in a TMDS-like link to hold the video data. The transmitter sends auxiliary data using the shorter DE high times. Within this DE high time are a number of clock periods, each carrying encoded TMDS-like data. The transmitter sends normal (video) data during the longer DE high times. A receiver can be made to reject or ignore DE high periods which are shorter than a specified limit. All normal video information will be transmitted in DE high periods longer than this minimum. All shorter DE high times will be ignored unless the receiver is explicitly connected to a system which can utilize the auxiliary information.

The specific mechanism used for the negotiation of capabilities is not critical to the invention. In the case of standardized digital video interfaces, the VESA DDC channel may be used, either by reading additional bits or fields from an EDID extension, or by reading from the register space of the receiver itself. The latter is similar to the mechanism used in the HDCP specification. Other methods may be used as outlined elsewhere in this invention.

Other channels for sending auxiliary data over a link in accordance with the invention include:

reversing one video data transmission channel, or two or more video data transmission channels, during blanking periods (to send auxiliary data from the receiver of the video data to the transmitter of the video data);

implementing common mode modulation (sometimes referred to herein as use of "phantoms") on any of the conductor pairs employed for transmission of differential video data or differential control signals ("single ended" common mode modulation) or on any two pair of conductors employed for transmission of differential video data or differential control signals (i.e., "differential" common mode modulation, in which the difference between the modulated common mode levels of the two pairs determines the auxiliary data), as either a forward or backward channel of a TMDS-like link;

changing from transition minimized coding to transition maximized coding to indicate a binary bit (e.g., "zero") of auxiliary data and changing from transition maximized coding to transition minimized coding to indicate the complementary binary bit (e.g., "one"). This would typically be a slow channel;

modulating the DC disparity of a stream of encoded video data bits, which would effectively implement an analog (or digital) auxiliary data channel of a TMDS-like link. Here a range of operation would be set and the bias encoding would be adjusted to set the "DC" level. This can provide a channel for a single stream of audio (or other auxiliary) data.

if the DC disparity is 0 then the choice of a bit to adjust the DC disparity is arbitrary. In TMDS link, the least significant bit of each video data word is used for this purpose. Auxiliary data can be transmitted using the bit that would otherwise be used only for adjusting the DC disparity of a stream of encoded video data bits having zero disparity;

auxiliary data can be sent by modulating the DDC ($I^2C$) line of a DVI link below the level specified for the signal or at higher frequencies than specified by the DDC ($I^2C$) channel. Alternatively, the DDC power supply and/or ground line could be so modulated; and when it is not in use for receiving EDID data, any two of the DDC ($I^2C$) line, DDC power line, and DDC ground line of a DVI link can be used as an additional pair for transmission of auxiliary data (e.g., as differential data) either in the forward or reverse direction.

Except for modulation of DC disparity, the described channels for auxiliary data transmission can be used to transmit auxiliary data in either direction over a TMDS-like link.

In a class of embodiments, auxiliary data is sent over one or more channels of a TMDS-like link at times when each such channel would otherwise be idle, e.g. while waiting for a PLL in the receiver to lock. In any digital data link that transmits a clock from the transmitter to the receiver, the data rate can typically change at any moment. When the data rate changes due to an input side clock frequency change, the clock recovery mechanism in the receiver has to lock onto the new frequency and phase of the incoming clock. While the clock locking process is being carried out, the data channels normally used to transmit the data being clocked cannot send any useful information. This is also true in a TMDS link.

The inventors have recognized that, while the PLL in the receiver is being locked to the video clock (e.g., that transmitted over Channel C of FIG. 6), auxiliary data can be transmitted over the video data channels (e.g., Channels 0, 1, and 2 of FIG. 6), to the transmitter from the receiver, or from the transmitter to the receiver. Each of the six conductors that comprise Channels 0, 1, and 2 of FIG. 6 can be used as separate channel to transmit auxiliary data in single-ended fashion (or they can be used in pairs to transmit three streams of differential auxiliary data). Alternatively, one of the six conductors can be used as a data strobe for five streams of auxiliary data transmitted in single-ended fashion over the other five conductors. If one conductor is used as a data strobe, the receiver does not need to depend on the incoming video clock to generate a clock for recovering the auxiliary data.

The receiver can be implemented to interrogate the transmitter to determine whether the transmitter is capable of receiving auxiliary data in this way (or the receiver can otherwise determine such capability of the transmitter), and the transmitter can be implemented to respond to such interrogation. The transmitter can respond to such interrogation as follows. A TMDS transmitter can be implemented so that, regardless of whether the encoder is receiving its appropriate data input, if the PLL in the transmitter toggles, the output of the transmitter will toggle as well. If the receiver pulls the lines up, it can monitor the activity of the transmitter outputs. The transmitter can be implemented in accordance with the present invention with the capability to power down its data output for a predetermined period (in response to a change in the input video data rate) if it is capable of receiving auxiliary data from the receiver over the channels normally reserved for video data transmission, and the receiver side can be implemented to watch the activity of the transmitter outputs (after pulling up the relevant lines of the TMDS link) in response to a change in the video data rate. If so, the receiver can easily determine if the transmitter is capable of receiving auxiliary data over the described reverse direction data channel during locking of the PLL in the receiver.

This type of auxiliary data transaction can always be initiated by the transmitter by shutting off the video clock. The auxiliary data transmitted from the receiver to the transmitter can be EDID data (of the type mentioned above). The transmitter can trigger transmission of such EDID data from the receiver over the video data channels by sending the video clock to the receiver and then shutting off the video clock. In this way, this invention can eliminate the need for special purpose conductors between the transmitter and receiver for transmission of EDID data (identifying the receiver's capabilities) to the transmitter. However the invention typically cannot eliminate the need for all special conductors that are conventionally used for bi-directional communication between the transmitter and receiver if the system also implements the HDCP protocol, because HDCP requires bi-directional communication between the transmitter and receiver even when active video is being transferred to the receiver.

In any of the embodiments of the invention, error detection and optionally also error correction can be performed on the recovered auxiliary data.

In sending TMDS-encoded video data over a TMDS-like link, the TMDS-encoded video data tends not to toggle quickly, and it is possible to construct heavy digital filtering to make such data robust against a substantial amount of randomly scattered noise. However, since an auxiliary data stream can be (or resemble) a random or pseudo random data stream, its transmission over a TMDS-like link creates a completely different set of problems than those encountered in sending TMDS-encoded video data over the link. TMDS receivers typically perform resynchronization to search for a more refined sampling point and a correct byte framing point during video blanking intervals when the above-discussed four special (out-of-band) characters are sent over the video data channels. Due to the nature of the resynchronization, it is possible to lose one word of data (received during a single clock cycle) or the same amount of data can be duplicated depending on the operation of the digital PLL employed.

When auxiliary data are transmitted over a video channel of a TMDS link in the blanking intervals, repetition coding of the auxiliary data is necessary to recover the auxiliary data reliably in spite of the typical operation of the digital PLL employed for resynchronization during video data recovery. To avoid duplicating or losing the amount of auxiliary data received in one clock cycle, the minimum repetition ratio is preferably three. Any repetition level greater than three can be used, but would consume more data bandwidth to provide the same effective data bandwidth achievable using a repetition ratio of three.

With triple repetition coding (a repetition rate of three) that repeats the same auxiliary data word for three consecutive clocks, auxiliary data transmitted in the blanking intervals can be recovered reliably, e.g. using the same techniques employed conventionally in the video channels of TMDS links to identify the blanking intervals (i.e., to identify the special out-of-band words that define the blanking intervals). However, even with such triple repetition coding of auxiliary data, it is still possible to get a glitch due to the signal conditioning. The inventors have appreciated that such a glitch can typically be corrected by implementing a "bubble correction" error correction scheme in the auxiliary data decoder.

Bubble correction is simply the removal and replacement of a suspect data value (having a single clock width) with reference to its neighboring data values. Assuming that one auxiliary data bit is transmitted per clock cycle (and that triple repetition coding has been employed), if the decoder recognizes any two auxiliary data bits separated by a different bit, it replaces the center bit with its inverse to accomplish bubble correction.

After bubble correction has been performed, a sampling point for the auxiliary data being recovered can be determined in essentially the same manner that is performed conventionally by a digital PLL of a TMDS receiver to identify blanking intervals of a TMDS-encoded stream of video data. However, the circuitry for determining the sampling point for the auxiliary data typically will not need to operate as fast as the digital PLL of a TMDS receiver during identification of blanking intervals of a TMDS-encoded video data stream. However, it is not necessary to employ a digital PLL to select optimum sampling points during recovery of such auxiliary data. Rather, the inventors have recognized that it is typically adequate simply to select the second sample (of auxiliary data) after any transition (e.g., the start of a blanking interval) and every third sample thereafter until the next transition.

It is within the scope of the invention to employ combinations of channels for transmitting auxiliary data (and/or auxiliary data clocks or timing information) in either or both directions over a TMDS-like link. Many such combinations are contemplated. For example, a clock and control information for two or more audio data streams can be sent (in the forward direction) on a conductor pair that is also used to transmit a video clock, the audio data can be sent (in the forward direction) on other conductor pairs that are used for video data transmission (but only in the blanking periods), and another conductor pair can be employed at the same time as a back channel for sending additional auxiliary data in the direction opposite to the audio data transmission direction. Or, audio data can be sent in a forward direction on the video clock conductor pair to a DAC and then to speakers, while the "phantom" modulation technique is used to send another audio stream in the reverse direction (on either the same or a different conductor pair) from a microphone back to a personal computer (or other device) coupled to the transmitter.

Figure 29:
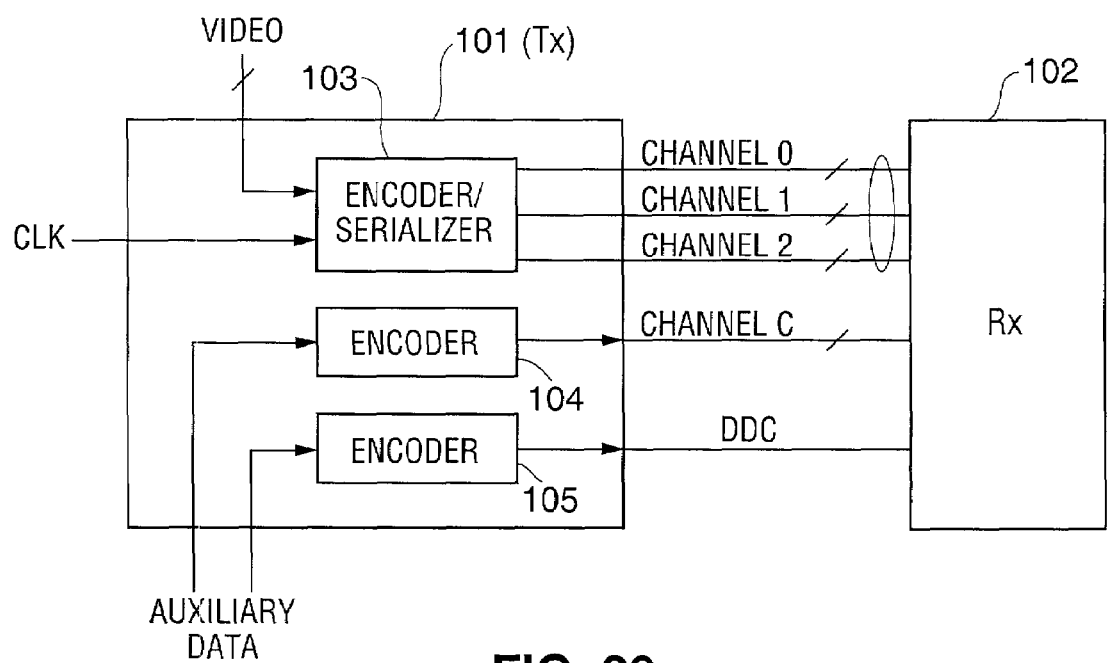
FIG. 29 is a block diagram of another embodiment of the inventive system.

Consider the system of FIG. 29, which is just one of many of the possible embodiments of the invention in which combinations of channels are employed for transmitting auxiliary data over a TMDS-like link. Transmitter 101 of FIG. 29 is a modified version of transmitter 1' of FIG. 6, transmitter 102 of FIG. 29 is a modified version of receiver 2' of FIG. 6, and transmitter 101 and receiver 102 communicate over a TMDS-like link (e.g., a DVI link) whose HPD, Power, and Analog Video lines are not shown for simplicity. Circuit 103 of transmitter 101 encodes digital video data and transmits it to receiver 102 over channels 0, 1, and 2 of the link. Circuit 104 of transmitter 101 transmits a video clock over channel C of the link. Circuit 104 is also configured to receive a stream of auxiliary data (e.g., digital audio data determining the right channel of a stereo audio signal), encode this auxiliary data, and transmit a stream of the encoded auxiliary data (from an output of transmitter 101) over channel C. For example, one implementation of circuit 104 modulates falling edges of a binary signal asserted over channel C to assert the encoded auxiliary data, where the rising edges of the binary signal determine the video clock. Circuit 105 of transmitter 101 is configured to receive another stream of auxiliary data (e.g., digital audio data determining the left channel of a stereo audio signal), encode this auxiliary data, and transmit a stream of the encoded auxiliary data (from another output of transmitter 101) over the DDC channel of the link. Receiver 102 is configured to receive and recover both streams of auxiliary data, as well as to receive and recover the digital video data.

Combinations of auxiliary data (and clock) transmission channels are necessary because of the need for attaching a variety of devices to either end of the link. The addition of peripherals to a video system increases the need for bandwidth. This bandwidth cannot be supplied simply by increasing the total bandwidth of the system. One reason is that some required data typically must be transported over the link in the direction opposite to the video transmission direction. Another reason is that the interfacing of separate devices typically requires separate channels for communication. Otherwise, the interactions between multiple auxiliary data streams on a single channel will often cause the channel to fail under a situation of high load.

The use of a combination of auxiliary data (and/or clock) channels presents several issues. There is the complexity added to a design by adding another transmission method. Interaction between channels may degrade performance. Combination of channels can be desirable to keep an embodiment of the invention compatible with existing industry standards. Content of a stream may dictate which combination of channels is most appropriate. The latency and direction of the channels further determine how they can be combined.

Interactions between channels can degrade one or both of the channels. This in general will be due to crosstalk between channels. When lines having conventional uses are used for additional or alternative uses there is a very direct interaction, such as when a pair of DDC lines is used conventionally at the beginning of a session and then later used as a back channel of auxiliary data transmission in accordance with the invention. Working with a combination of channels raises the question of compatibility with preexisting standards. One channel, for example a TMDS link in a DVI system, can be defined without allocating room in the specification for extra channels (but the specification may not prohibit such extra channels). In the example of a DVI system, there is a forward TMDS channel and a bi-directional DDC channel. An additional channel for audio data can be added consistent with the DVI specification by using modulation of the falling edges of the binary signal whose rising edges define the video clock. Another example is transmission of auxiliary data using "Phantom" modulation (common mode modulation) of a conductor pair that is also used for differential video data transmission in a TMDS link. In the latter example, the modulation of the common mode level would need to be within the allowed specification for video data transmission over the TMDS link and yet large enough that the auxiliary data are transmitted without significant errors.

One stream of auxiliary data can be transmitted by using a combination of different channels. These different channels can be used to send data, control and timing information. For example, the clock and control information for multiple audio streams can be sent using modulation of the falling edges of the binary signal whose rising edges define the video clock, and the audio data itself can be sent (in the forward direction) on other conductor pairs that are used for video data transmission (but only in the blanking periods), and another conductor pair can be employed at the same time as a back channel for sending additional auxiliary data in the direction opposite to the audio data transmission direction. In order to implement duplex communication channels of the same nature can be paired in both directions. Two pairs of conductor pairs can send data forward while another pair of conductor pairs sends data in the reverse direction for a bidirectional stream.

Figure 22:
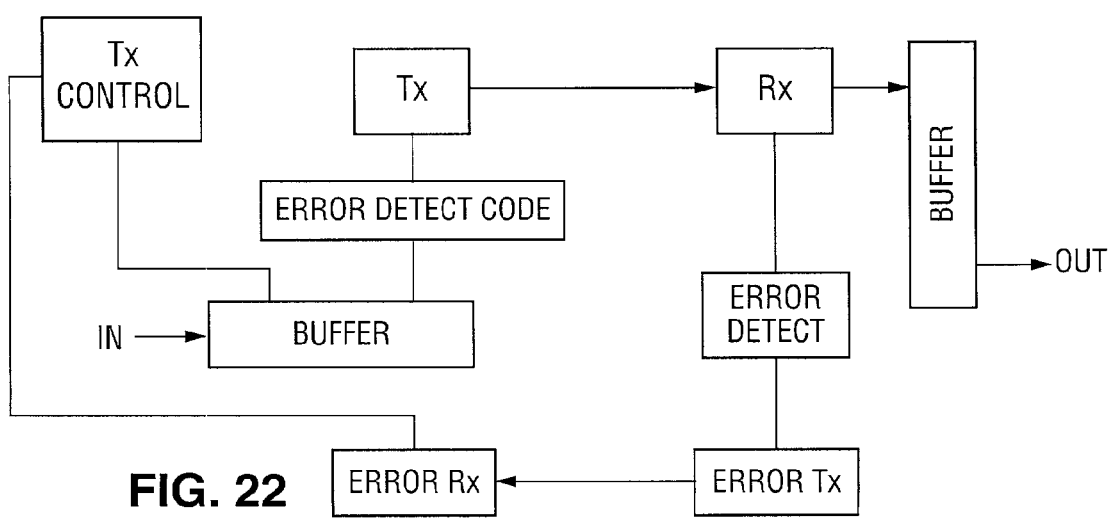
FIG. 22 is a block diagram of another embodiment of the inventive system.

The matching of streams to channels is preferably based upon the relative needs for bandwidth, latency and method of transmission. High bandwidth side channels would be needed to carry large amounts of data, such as multiple streams of audio data. On the other hand, control signals for a keyboard and mouse have little demand for auxiliary data bandwidth. Some data are needed only rarely, such as the EDID data read during operation of a DVI link, so that the channel over which such data are sent can be used at other times for transmitting alternative data, possibly with an alternative method. Because the above-described Disparity modulation can be an analog function, it is particularly suited to transmit audio data over a TMDS-like link. Channels in which auxiliary data are transmitted only in video blanking periods cannot be used to send data that requires low latency. The blanking periods only occur every line so if the auxiliary data comes in bursts at a rate in the tens of kilohertz, a buffer is needed. If a backchannel is being used to indicate an error condition it needs to have a low latency. For example, if an audio channel implements error detection with the ability to retransmit it would need a low latency return path. For example, in a modified DVI link (implemented in accordance with the FIG. 22 embodiment of the invention), audio data can be input to a buffer, read from the buffer (under control of the transmitter control unit "Tx Control") and subjected to error detection coding, then transmitted over the Hot Plug Detect line from the transmitter to the receiver. The receiver accepts the data after a given latency and sends it to an error detect block. The error detect block analyzes the received data and determines if an error has occurred. If an error has occurred, the error detect block indicates this by sending a message over a back channel to the transmitter control unit (via an error message transmitter "Error Tx" and an error message receiver "Error Rx" as shown in FIG. 22). In response to the error message, the transmitter control unit resends the incorrect data from the buffer to the transmitter. When the receiver receives correct data, the correct data are inserted into an outp at buffer on the receiver side. The system needs to retain (in the buffer on the transmitter side) a copy of the data after the transmitter has sent it to the receiver so that the data can be sent again if an error is detected on the receiver side. The buffer on the transmitter side holds the data after it has been transmitted for long enough to perform a retransmit if needed.

To fully consider the combination of streams of auxiliary data to be transmitted and the available channels for transmitting it, one should also examine the bandwidth requirements of the streams. Some examples of high and low data rate streams are as follows: Video (primary), Video (slow scan), Audio, USB, and 1394 data are high bandwidth streams; Keyboard/Mouse, IR remote, EDID on DDC, and Input Tablet streams; are low bandwidth streams.

Among the categories of combination of channels that are contemplated in different embodiments of the invention are the following: High bandwidth forward channel data transmission with low latency reverse channel transmission for error correction; high bandwidth forward channel data transmission with low latency forward channel accurate clock transmission; temporary bidirectional transmission (with forward channel auxiliary data transmission over additional lines for added bandwidth: and low bandwidth bidirectional transmission with reversible channel auxiliary data transmission for controlled flow.

Encryption of Auxiliary Data Transmitted over a TMDS-like Link

In accordance with another aspect of the invention, auxiliary data (e.g., audio data) transmitted over a TMDS-like link are encrypted prior to transmission, and the transmitted encrypted auxiliary data are decrypted at the receiver. The video data are typically also encrypted for transmission over the link and then decrypted at the receiver. The negotiation of a protocol for auxiliary data transmission over the link can be extended to be a type of authentication, such as in an extension of the above-discussed HDCP protocol. If multiple channels are being used to transmit a stream of auxiliary data, encrypting both the data and the clock for the data will further enhance the security.

Among the methods that can be employed in accordance with the invention to encrypt auxiliary data are the following:

where auxiliary data are transmitted only during blanking intervals, employ a first cipher engine to encrypt the video data and a second cipher engine to encrypt the auxiliary data. Run the second cipher engine only during the blanking intervals, and otherwise run the first cipher engine;

where auxiliary data are transmitted only during blanking intervals, employ a first cipher engine to encrypt the video data, and a second cipher engine to encrypt the auxiliary data. The second cipher engine can be identical to the first cipher engine, but it continuously runs (including in the blanking intervals). The two cipher engines are aligned at the beginning of the video period so that they are synchronized; and employ a new, separate cipher to encrypt the auxiliary data (and use a conventional cipher engine to encrypt the video data).

As described above, in a TMDS link there is a dilation of data in time caused by the coding process employed to encode the data for transmission (the coding process maps an 8-bit binary space onto a 10-bit binary space). This dilation is used in some embodiments of the invention to further encrypt the data.

In preferred embodiments, an extension of the above-discussed HDCP protocol is used to encrypt both digital video and auxiliary data transmitted over a DVI link and to decrypt the transmitted video and auxiliary data at the DVI receiver. In a class of such preferred embodiments, the auxiliary data are transmitted continuously over the DVI link (e.g., by modulating the trailing edge of the clock signal transmitted over channel C of FIG. 6). However, in conventional implementations of the HDCP protocol, encryption (and decryption) is performed discontinuously, since the encryption and decryption are performed (and the conventionally generated cout[23:0] data is valid) only when the control signal DE is high; not during blanking intervals of the video data when signal DE is low. To implement the preferred embodiments to be described, a valid cout[23:0] value must be provided for the auxiliary data stream during each clock interval of the continuous auxiliary data transmission and recovery operations (i.e., when the DE signal is low as well as when the DE signal is high).

In conventional implementations of the HDCP protocol, 24 bits of cout[23:0] data are generated each clock cycle (when DE is high) by operating an output module 82 (of the HDCP cipher circuitry in each of the transmitter and the receiver) as described above with reference to FIG. 5, in response to 28 bits from each of registers By, Bz, Ky, and Kz of block module 81.

Figure 3:
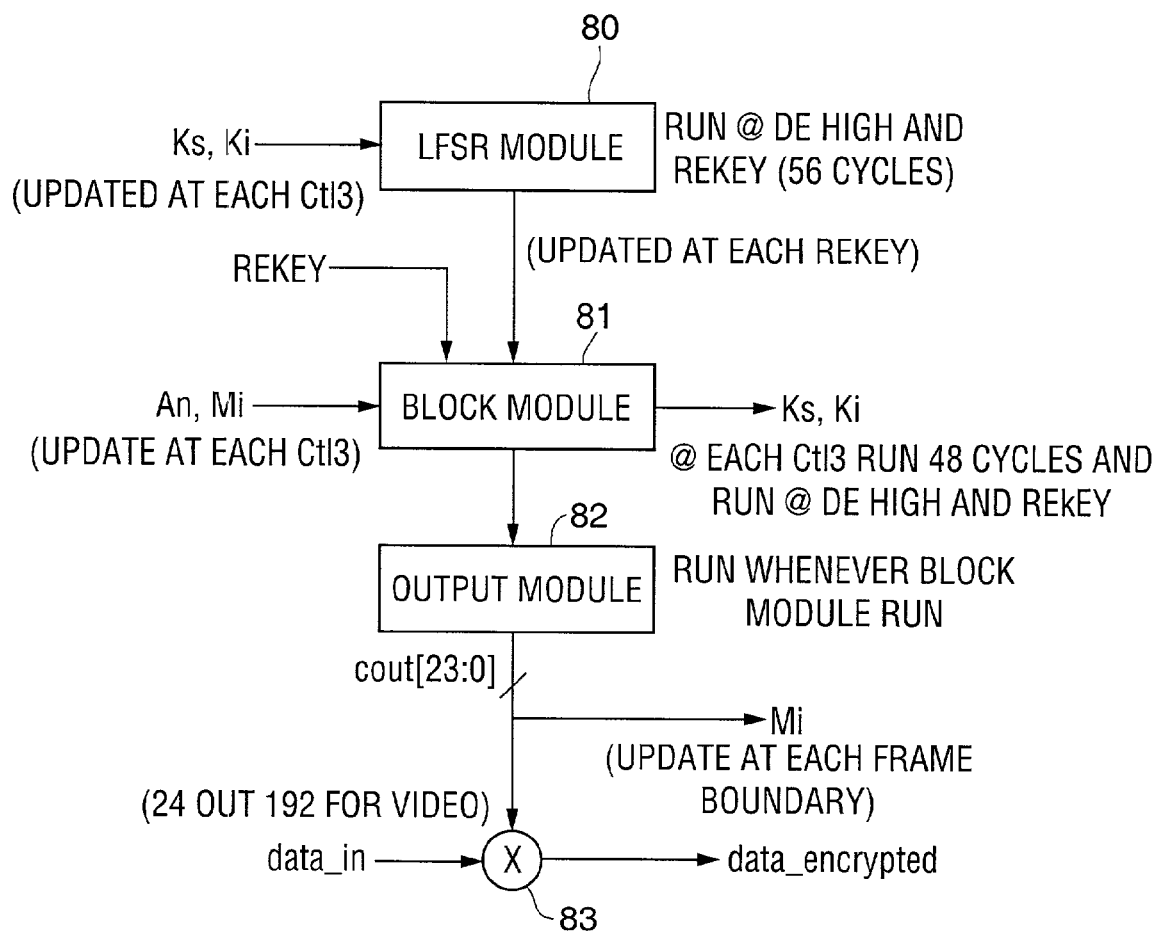
FIG. 3 is a block diagram of conventional circuitry for encrypting digital video data to be transmitted over a DVI link.
Figure 4:
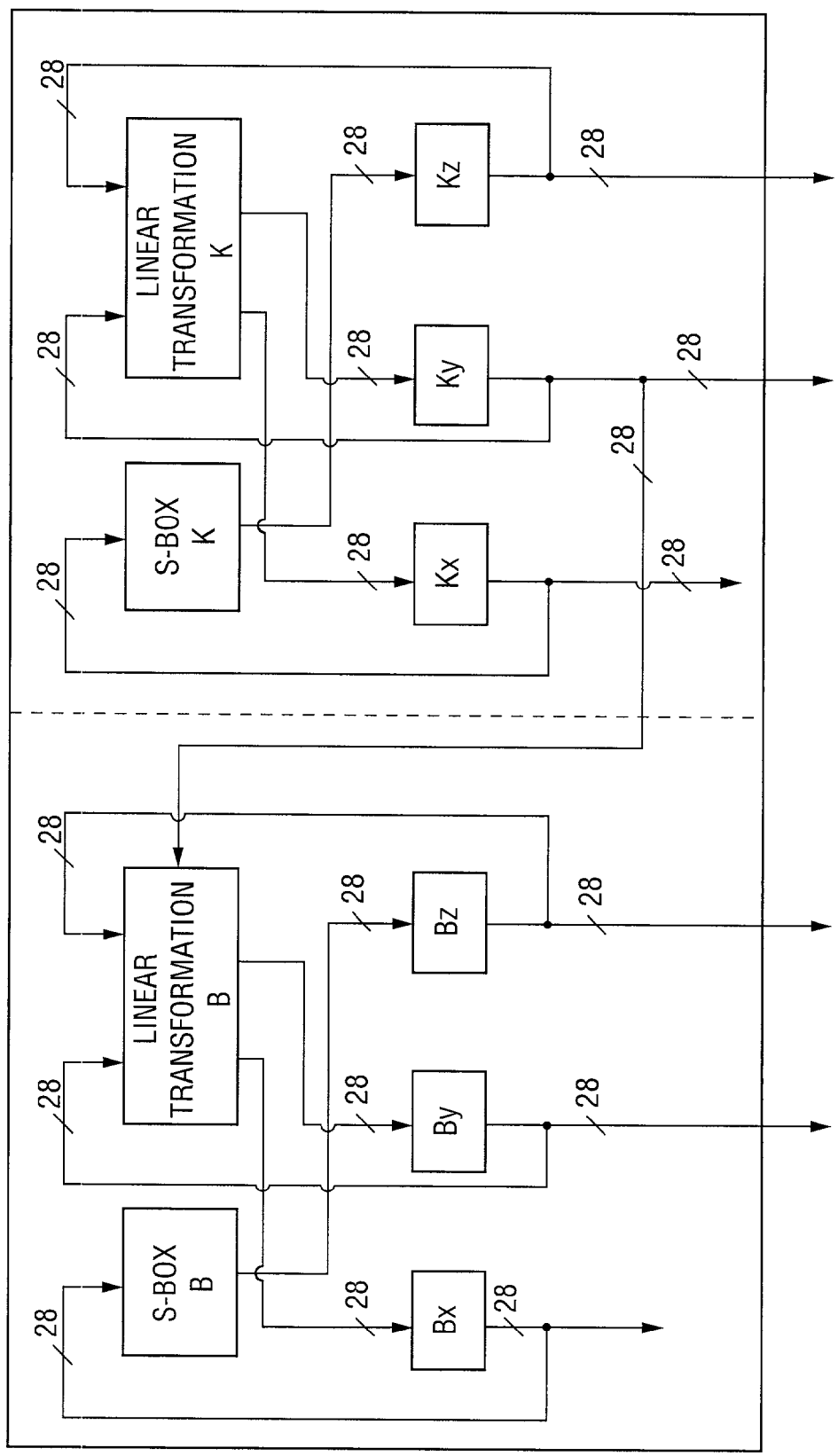
FIG. 4 is a simplified block diagram of module 81 of FIG. 3.
Figure 27:
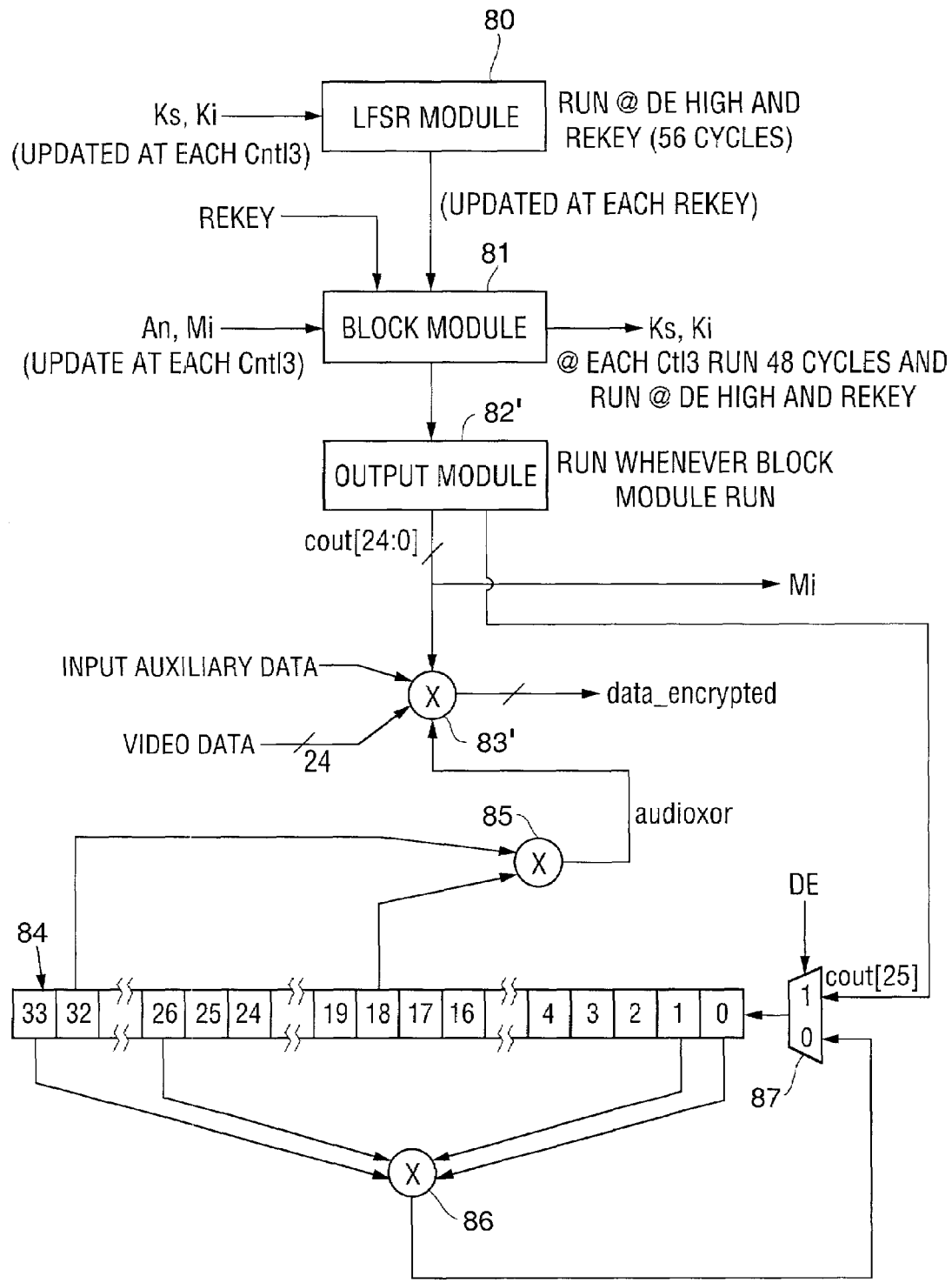
FIG. 27 is a block diagram of a circuit used in a class of embodiments of the invention for HDCP encryption of data (the FIG. 27 circuit is a modified version of the FIG. 3 circuit).

To implement the preferred embodiments to be described, output module 82' of FIG. 27 replaces output module 82 of FIG. 3. Output module 82' is a modified version of module 82 capable of generating 26 bits of cout data during each clock cycle when DE is high. Output module 82' performs a compression operation on the 28-bit keys (By, Bz, Ky and Kz) asserted to it (a total of 112 bits) by module 81 (modules 80 and 81 of FIG. 27 are identical to modules 80 and 81 of FIG. 3) during each clock cycle, to generate one 26-bit block of pseudo-random bits cout[25:0] per clock cycle (when DE is high). Each of the twenty-six output bits of module 82' consists of the exclusive OR ("XOR") of nine terms as follows: (B0*K0)+(B1*K1)+(B2*K2)+(B3*K3)+(B4*K4)+(B5*K5)+(B6*K6)+(B7)+(K7), where "*" denotes a logical AND operation and "+" denotes a logical XOR operation, where FIG. 5 specifies the input values B0-B7 and K0-K7 for generating each of the twenty-four least significant output bits cout[23:0], and the second-most significant bit (cout(24)) of cout[25:0] is specified by adding the following twenty-fifth row to the twenty-four row table set forth in FIG. 5:

22 24 25 13 3 11 6 10 4 8 15 7 6 2 11 1.

Thus, to generate the bit cout(24), output module 82' performs the operation (B0*K0)+(B1*K1)+(B2*K2)+(B3*K3)+(B4*K4)+(B5*K5)+(B6*K6)+(B7)+(K7), where B0 is the twenty-second bit of register Bz, K0 is the fourth bit of register Kz, B1 is the twenty-fourth bit of register Bz, and so on.

The most significant bit (cout(25)) of cout[25:0] is specified by adding the following twenty-sixth row to the twenty-four-row table set forth in FIG. 5 (as supplemented by the noted twenty-fifth row):

13 2 24 21 26 19 17 14 12 15 11 6 3 1 4 5.

Thus, to generate the bit cout(25), output module 82' performs the operation (B0*K0)+(B1*K1)+(B2*K2)+(B3*K3)+(B4*K4)+(B5*K5)+(B6*K6)+(B7)+(K7), where B0 is the thirteenth bit of register Bz, K0 is the twelfth bit of register Kz, B1 is the second bit of register Bz, and so on.

Logic circuit 83' of the embodiment of FIG. 27 is a modified version of logic circuitry 83 of FIG. 3. Circuit 83' of FIG. 27 is configured to perform a bitwise XOR operation during each clock cycle on a 25-bit word of input data (each input data word comprising twenty-four bits of input video data and one bit of auxiliary data) and the following 25-bit word: the bits cout[24:0] (from module 82') during each clock cycle of each time period in which DE is high; and the bits cout[23:0] (from module 82') and the bit "audioxor"

(from circuit 85) during each clock cycle of each time period in which DE is low. Either the bit cout(24) (when DE is high) or the bit "audioxor" (when DE is low) is XORed with the auxiliary data bit.

More specifically, the HDCP cipher of FIG. 27 includes 34-bit linear feedback shift register 84 ("LFSR" 84), XOR units 85 and 86, and multiplexer 87 connected as shown between module 82' and logic circuit 83'. During each time interval in which DE is high (i.e., at times when module 82' produces valid output), the stream of the most significant bits (cout[25]) of the stream cout[25:0] is passed through multiplexer 87 into bit[0] of LFSR 84. During each clock cycle (while bits are clocked through LFSR 84), XOR circuit 85 performs an XOR operation on bit [18] and bit [32] of LFSR 84 to produce the bit audioxor which is asserted to circuit 83'. However, the bit audioxor is used by circuit 83' only at times when DE is low.

During each time interval in which DE is low (i.e., at times when module 82' is not producing valid output), the stream of bits output from circuit 86 is passed through multiplexer 87 into bit[0] of LFSR 84. During each clock cycle as bits are clocked through LFSR 84 (bits continue to be clocked through LFSR 84 regardless of whether DE is high or low), XOR circuit 85 performs an XOR operation on bit [18] and bit[32] of LFSR 84 to produce the bit audioxor (just as when DE is high). During each clock cycle, XOR circuit 86 performs an XOR operation on bits [0], [1], [26] and [33] of LFSR 84 to produce a feedback bit which is asserted to an input of multiplexer 87. When DE is low, the feedback bit from circuit 86 is passed through multiplexer 87 into bit[0] of LFSR 84. The polynomial of LFSR 84 of FIG. 27 is $x^{34}+ x^{27}+x^2+x+1$.

In a conventional DVI link implementing HDCP encryption of video data, the HDCP algorithm is tied to the timing of the DE signal. So, in embodiments of the invention in which encrypted auxiliary data are transmitted continuously over a TMDS-like link (e.g., by modulating the trailing edge of the clock signal transmitted over channel C of FIG. 1), encrypted video data are transmitted discontinuously over the link (i.e., only at times when a DE signal is high), and the video data are encrypted and decrypted in accordance with the HDCP algorithm (or another algorithm tied to the timing of a DE signal), the auxiliary data stream transmitted over the link must also be synchronized with the DE signal. However, the delay latency of the video stream between the transmitter and the receiver will typically be different from that of the auxiliary data stream. The delay latency of the video stream results from regeneration of the signal DE in the receiver, whereas the auxiliary data stream's delay latency results from the auxiliary data stream's encoding, serialization and decoding.

An algorithm to synchronize the auxiliary data stream with the DE signal in accordance with the invention, assuming that one auxiliary data word is transmitted per each A video clock cycles (typically, A=10), is as follows:

in the transmitter (during transmission of encoded auxiliary data): at each rising edge of DE, wait for "A" video clock cycles (to finish processing the last byte of auxiliary data) and then send an "out of band character," de_sync, before resuming normal transmission of encoded auxiliary data encoding (where the expression that a character is an "out of band" character denotes that the character is not one of the set of characters that are employed to denote encoded auxiliary data, and de_sync is any of the existing "out of band characters");

in the receiver (during reception of the transmitted auxiliary data), start counting at each rising edge of the received DE signal and continue counting until receiving the de_sync character, and record the count value ("y") upon receiving de_sync; and to synchronize the received auxiliary data with the received video data, by assuming that the auxiliary data stream delay between transmitter and receiver is x video clock cycles, the elapsed time between transmission and regeneration of the DE signal is determined to be (x+A+1−y). Processing of the auxiliary data stream in the receiver is then delayed by (x+A+1−y)−x=(A+1−y) cycles in order to be synchronized with DE.

In another class of embodiments, an LVDS link is adapted in accordance with the invention to transmit encrypted auxiliary (e.g., audio) data and to protect content. As mentioned above in the Background section, an LVDS link is a TMDS-like link. LVDS links that carry video pixel information at 6 bits per color (with a single color pixel per clock and a pixel clock rate not greater than 86 MHz) use three differential pairs between the transmitter and receiver to transmit the video. In systems including implementations of LVDS links that carry 8 bits per color (also with a single color pixel per clock and a pixel clock rate not greater than 86 MHz), a fourth differential pair is added to transmit video. For higher clock rates (or more pixels per clock), an additional set of either three or four differential pairs is added depending on the number of bits per pixel. In addition to the pixel data, an LVDS link must also transmit a data enable (DE) signal, and HSync and VSync information.

Figure 28:
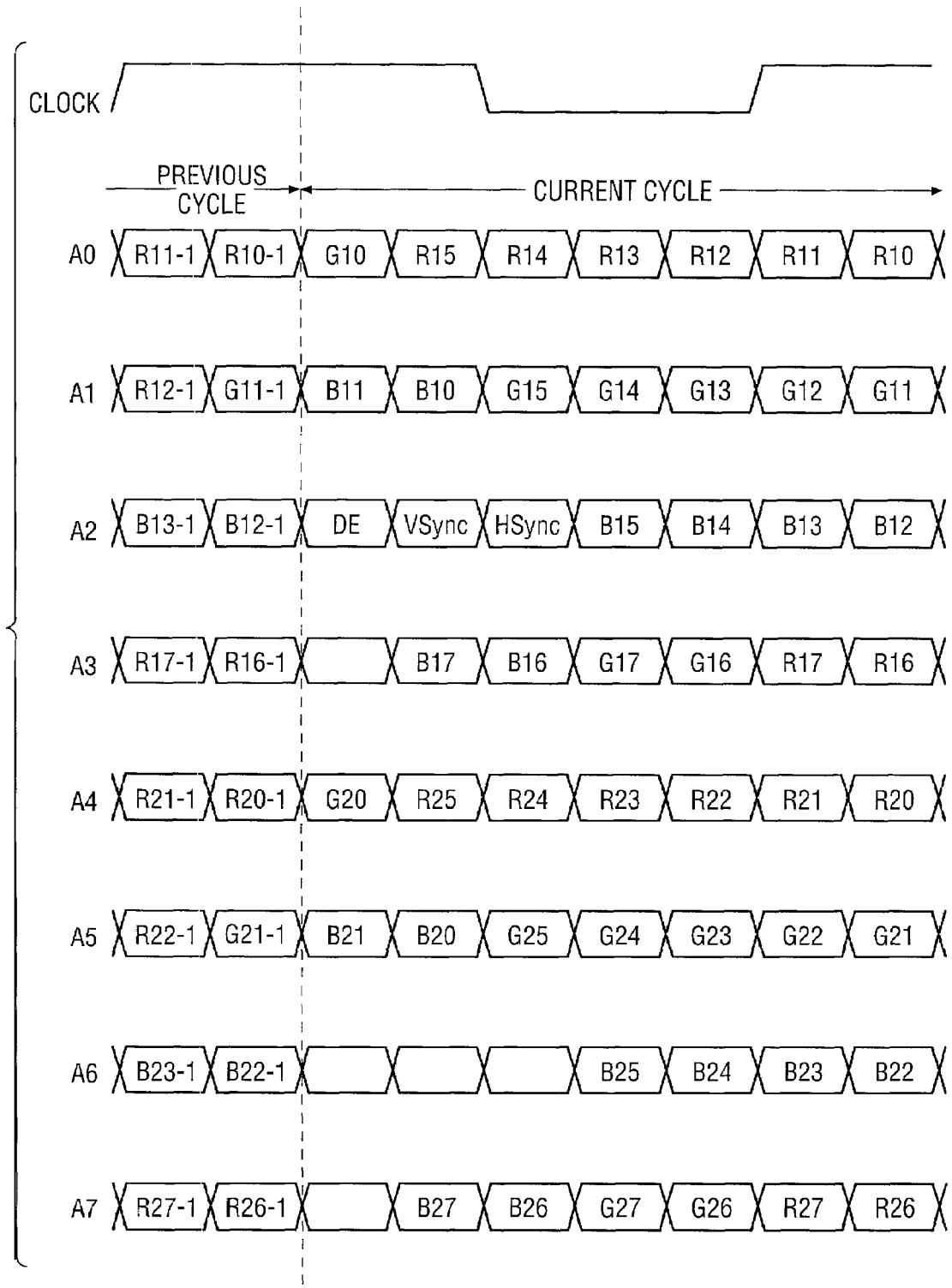
FIG. 28 is a timing diagram of data transmitted over a Low Voltage Differential Signaling ("LVDS") link and a clock signal employed to transmit the data over the LVDS link.

There are spare bits available in the data stream of an LVDS link except in implementations in which there is one pixel per clock and 6 bits per pixel. In implementations in which there are 8 bits per pixel and one pixel per clock, there is a single spare bit per clock cycle. In implementations in which there are 8 bits per pixel and two pixels per clock, there are five spare bits per clock cycle (as shown in FIG. 28, in which the spare bits are the blank bits and the "n"th red, green, and blue pixel are identified respectively as "Rn," "Gn," and "Bn").

Figure 2:
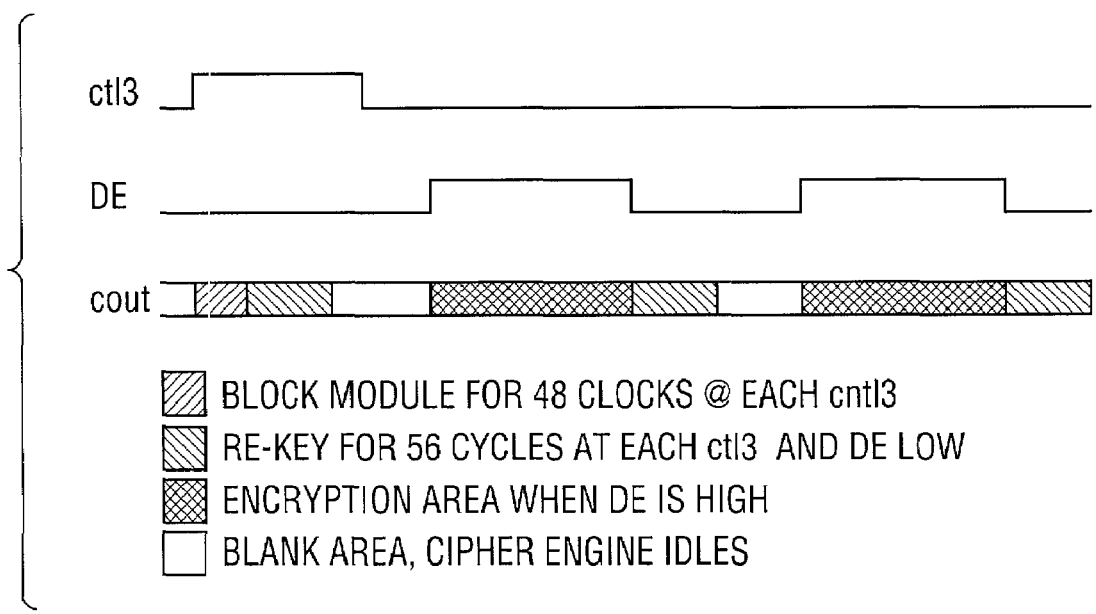
FIG. 2 is a timing diagram of signals generated conventionally to encrypt digital video data to be transmitted over a DVI link using the High-bandwidth Digital Content Protection ("HDCP") protocol.

In order to implement content protection (e.g., conventional High-bandwidth Digital Content Protection ("HDCP") or content protection similar to HDCP) in an LVDS link in accordance with preferred embodiments of the invention, the link must be implemented with the following features: the link transmits digital video data, the link transmits a data enable (DE) signal indicating whether or not video data are being sent, the link transmits a periodic control signal (to trigger a periodic re-keying operation, as does the "ctl3" signal in a DVI link implementing HDCP, as noted above with reference to FIGS. 2 and 3), and the transmitter can authenticate the receiver before transmitting video to the receiver. A conventional LVDS link does transmit digital video and a DE signal. The re-keying control signal can be sent in an unused bit (one of the blank bits in FIG. 28). The authentication can be accomplished using a DDC line, as discussed above.

A system including an LVDS link modified in accordance with the invention can be used to transmit auxiliary data (e.g., audio data) with digital video data. Even in an implementation of an LVDS link lacking spare bits in the video data streams (e.g., an implementation in which there are 6 bits of video data per pixel and one pixel per clock) there is bandwidth available for auxiliary data transmission in accordance with the invention since HSync and VSync will not change during the time that DE is high. The inventors have recognized that two bits (or nearly two bits, on the average) of auxiliary data can be transmitted (when DE is high) in the slots conventionally employed for transmitting HSync and VSync. In a system including an implementation of an LVDS link in which there are 8 bits of video data per pixel and two pixels per clock, auxiliary data can be transmitted in accordance with the invention in the four spare bits available per clock cycle (while also reserving one conventionally unused bit per clock cycle for the above-mentioned re-keying control signal) and in many of the slots conventionally employed for transmitting HSync and Vsync signals. In the latter implementation, more than five bits per clock cycle (on the average) are available for auxiliary data transmission. Additionally, recognizing that one only needs to know the state of the re-keying bit just before DE goes high, the link can be implemented in accordance with the present invention to reserve several clock cycles before DE's rising edge (for transmitting the re-keying bit in one conventionally unused slot) and otherwise (i.e., in all other clock cycles) to use the same conventionally unused slot to transmit auxiliary data. Even for implementations in which there is only a single bit per clock, there is adequate bandwidth to operate digital audio over the inventive modified LVDS link.

It should be understood that while certain forms of the present invention are illustrated and described herein, the invention is defined by the claims and is not to be limited to the specific embodiments described and shown.

What is claimed is:

1. A communication system, including:
a receiver;
a transmitter; and
a communication link between the transmitter and the receiver, wherein the link is a serial link configured to transmit digital video data from the transmitter to the receiver and having at least one other characteristic of a transition minimized differential signaling link, the transmitter is configured to transmit video data to the receiver over one or more channels of the link, at least one of the transmitter and the receiver is configured to transmit at least one stream of auxiliary data to the other one of the transmitter and the receiver over one or more channels of the link, the transmitter is configured to transmit a video clock to the receiver over a video clock channel of the link, and said at least one of the transmitter and the receiver is also configured to transmit, to the other one of the transmitter and the receiver, at least one auxiliary clock for the auxiliary data over said video clock channel.

2. The system of claim 1, wherein the transmitter is configured to transmit to the receiver at least some of the auxiliary data discontinuously over a first channel of the link while continuously transmitting the video clock and each said auxiliary clock over the video clock channel.

3. The system of claim 1, wherein the transmitter is configured to transmit to the receiver a binary signal over the video clock channel, and the binary signal has periodic features that determine the video clock and data structures that determine each said auxiliary clock.

4. The system of claim 3, wherein the periodic features are periodically occurring rising edges of the binary signal, the data structures are falling edges of the binary signal, and a time interval between each of the falling edges and a preceding one of the rising edges determines each said auxiliary clock.

5. The system of claim 3, wherein the video clock has frequency f, and the auxiliary clock has frequency f2=f/N, where N is an integer.

6. The system of claim 3, wherein each of the data structures is indicative of at least two precise times following one of the periodic features, whereby the binary signal determines at least two auxiliary clocks.

7. The system of claim 1, wherein at least some of the auxiliary data are audio data.

8. A transmitter for use in data transmission over a serial link, wherein the link is configured to transmit digital video data and has at least one other characteristic of a transition minimized differential signaling link, said transmitter including:
   a video input for receiving video data;
   an auxiliary data input for receiving auxiliary data;
   outputs configured to be coupled to channels of the link, including a first output configured to be coupled to a clock channel of the link; and
   circuitry, coupled to the video input, the auxiliary data input, and at least some of the outputs including the first output, configured to assert output signals indicative of the auxiliary data and the video data to the outputs, and configured to assert a clock signal to the first output, wherein the clock signal is indicative of a video clock and at least one auxiliary clock for the auxiliary data.

9. The transmitter of claim 8, wherein the clock signal is a binary signal having periodic features that determine the video clock and data structures that determine each said auxiliary clock.

10. The transmitter of claim 9, wherein each of the data structures is indicative of at least two precise times following one of the periodic features, whereby the binary signal determines at least two auxiliary clocks.

11. A communication system, including:
   a receiver;
   a transmitter; and
   a communication link between the transmitter and the receiver, wherein the link is a serial link configured to transmit digital video data from the transmitter to the receiver and having at least one other characteristic of a transition minimized differential signaling link, the transmitter is configured to transmit video data to the receiver over a first channel of the link and at least one of the transmitter and the receiver is configured to transmit a binary signal to the other of the transmitter and the receiver over a second channel of the link, wherein the binary signal has periodic features that determine a pixel clock for the video data, and the binary signal determines a stream of data structures indicative of at least one stream of audio data and at least one additional clock for the at least one audio data stream.

12. The system of claim 11, wherein at least one of the transmitter and the receiver is configured to transmit at least one signal indicative of said at least one audio data stream to the other of the transmitter and the receiver over a channel of the link other than said second channel.

13. A communication system, including:
   a receiver;
   a transmitter; and
   a communication link between the transmitter and the receiver, wherein the link is a serial link configured to transmit digital video data from the transmitter to the receiver and having at least one other characteristic of a transition minimized differential signaling link, the transmitter is configured to transmit video data to the receiver over a first channel of the link and at least one of the transmitter and the receiver is configured to transmit a binary signal to the other of the transmitter and the receiver over a second channel of the link, wherein the binary signal has periodic features that determine a pixel clock for the video data, and the binary signal determines a stream of data structures indicative of at least two streams of auxiliary data, wherein the stream of data structures is also indicative of at least two additional clocks, and each of the additional clocks is for a different stream of auxiliary data.

14. The system of claim 13, wherein each of at least some of the data structures includes data and a header identifying which of the auxiliary data streams includes the data.

15. The system of claim 13, wherein each of at least some of the data structures includes fine position data indicative of a time interval commencing on occurrence of a preceding one of the periodic features, and a header identifying which of the auxiliary data streams includes the fine position data.

16. The system of claim 13, a data structure of each of at least some of the data structures includes fine position data indicative of a time interval commencing on occurrence of a reference feature of said data structure, coarse position data indicative of a time interval between the occurrence of the reference feature and a preceding one of the periodic features, and a header identifying which of the auxiliary data streams includes the fine position data.

17. A communication system, including:
   a receiver;
   a transmitter; and
   a communication link between the transmitter and the receiver, wherein the link is a serial link configured to transmit digital video data from the transmitter to the receiver and having at least one other characteristic of a transition minimized differential signaling link, the transmitter is configured to transmit video data to the receiver over a first channel of the link and to transmit a binary signal to the receiver over a second channel of the link, wherein the binary signal has periodically occurring edges of a first type, the periodically occurring edges determine a video clock, the binary signal has edges of a second type, and relative timing between the edges of the second type and the edges of the first type is indicative of at least one of a stream of audio data, a clock for a stream of audio data, and a clock for each of at least two streams of auxiliary data, wherein the relative timing between the edges of the second type and the edges of the first type is indicative of a clock for a stream of audio data.

18. The system of claim 17, wherein the relative timing between the edges of the second type and the edges of the first type is also indicative of a second clock for another stream of auxiliary data.

19. A receiver for coupling to a serial link, for use in a system including the link and a transmitter configured to transmit auxiliary data and a video clock to the receiver over one or more channels of the link, wherein the link is configured to transmit digital video data from the transmitter to the receiver and has at least one other characteristic of a transition minimized differential signaling link, and the video clock has frequency f, said receiver including:
   a frequency synthesizer to generate, from a recovered version of the video clock, an auxiliary clock for the auxiliary data, wherein the auxiliary clock has a time-averaged frequency $f_{aux}$, wherein the frequency synthesizer includes a phase locked loop, and the phase locked loop includes:
   a voltage controlled oscillator having an output at which the auxiliary clock is asserted; and
   a dual-modulus frequency divider coupled to receive the auxiliary clock and configured to divide the frequency of the auxiliary clock by a selectable value L to generate a second clock, where L is a selected one of a first integer N and a second integer P, and the second clock has frequency f/M', where M' is a number, wherein the dual-modulus frequency divider is configured to operate cyclically to divide the frequency of the auxiliary clock by the first integer N and then by the second integer P, with a duty cycle that is controlled so that the time-averaged frequency of the second clock is equal to (Q/M)f, where Q has a predetermined value greater than N and less than P.

20. The receiver of claim 19, wherein P=N+1.

21. The receiver of claim 19, also including:
circuitry for generating a set of L recovered clocks, wherein each of the recovered clocks has the frequency f, is a recovered version of the video clock, wherein and has a different phase $\phi=\phi_0+2\pi(k/L)$, where k is a non-negative integer in the range $\{0, \ldots, L-1\}$; and
an edge-combining fractional divider, coupled and configured to receive any selected one of the recovered clocks, and to output a third clock having frequency ((M+k)/L)f in response to said selected one of the recovered clocks, where M is an integer, and wherein the phase locked loop also includes:
a phase detector, coupled to receive the second clock and the third clock, and configured to generate a phase signal indicative of relative phase of the second clock and the third clock in response to said second clock and said third clock; and
a loop filter coupled to receive the phase signal and configured to generate an error signal in response to the phase signal, wherein the voltage controlled oscillator is coupled to receive the error signal and configured to generate the auxiliary clock in response to said error signal.

22. A receiver for coupling to a serial link, for use in a system including the link and a transmitter configured to transmit auxiliary data and a video clock to the receiver over one or more channels of the link, wherein the link is configured to transmit digital video data from the transmitter to the receiver and has at least one other characteristic of a transition minimized differential signaling link, and the video clock has frequency f, said receiver including:
a frequency synthesizer to generate, from a recovered version of the video clock, an auxiliary clock for the auxiliary data, wherein the auxiliary clock has a time-averaged frequency $f_{aux}$; and
a second frequency divider coupled and configured to receive the recovered version of the video clock and to output a third clock having frequency f/M in response to the recovered version of the video clock, where M is an integer, and wherein the frequency synthesizer includes a phase locked loop, and the phase locked loop includes:
a voltage controlled oscillator having an output at which the auxiliary clock is asserted; and
a dual-modulus frequency divider coupled to receive the auxiliary clock and configured to divide the frequency of the auxiliary clock by a selectable value L to generate a second clock, where L is a selected one of a first integer N and a second integer P, and the second clock has frequency f/M', where M' is a number;
a phase detector, coupled to receive the second clock and the third clock, and configured to generate a phase signal indicative of relative phase of the second clock and the third clock in response to said second clock and said third clock; and
a loop filter coupled to receive the phase signal and configured to generate an error signal in response to the phase signal, wherein the voltage controlled oscillator is coupled to receive the error signal and configured to generate the auxiliary clock in response to said error signal.

23. A receiver for use in a system including a serial link and a transmitter configured to transmit auxiliary data and a video clock to the receiver over one or more channels of the link, wherein the link is configured to transmit digital video data from the transmitter to the receiver and has at least one other characteristic of a transition minimized differential signaling link, and the video clock has frequency f, said receiver including:
a frequency synthesizer configured to generate, from a recovered version of the video clock, an auxiliary clock for the auxiliary data, wherein the auxiliary clock has a time-averaged frequency $f_{aux}$, and the frequency synthesizer includes:
a dual-modulus frequency divider coupled and configured to receive the recovered video clock and to divide the frequency of the recovered video clock by a selectable value Q to generate a first clock, where Q is a selected one of a first integer R and a second integer S;
a phase detector, coupled to receive the first clock and a second clock, and configured to generate a phase signal indicative of relative phase of the first clock and the second clock in response to said first clock and said second clock;
a loop filter coupled to receive the phase signal and configured to generate an error signal in response to the phase signal;
a voltage controlled oscillator, coupled to receive the error signal, and configured to generate the auxiliary clock in response to said error signal; and
a second dual-modulus frequency divider coupled to receive the auxiliary clock and configured to divide the frequency of the auxiliary clock by a second selectable value L to generate the second clock, where L is a selected one of a third integer N and a fourth integer P.

24. The receiver of claim 23, wherein the dual-modulus frequency divider is configured to operate cyclically to divide the frequency of the recovered video clock by the first integer R and then the second integer S, with a duty cycle that is controlled to so that the first clock has a time-averaged frequency $f_1=f/T'$, where T' has a predetermined value greater than R and less than S, and
wherein the second dual-modulus frequency divider is configured to operate cyclically to divide the frequency of the auxiliary clock by the third integer N and then by the fourth integer P, with a duty cycle that is controlled to so that the second clock has a time-averaged frequency $f_2=f_{aux}/U'$, where U' has a predetermined value greater than N and less than P.

25. The receiver of claim 24, wherein S=R+1 and wherein P=N+1.

26. A receiver for use in a system including a serial link and a transmitter configured to transmit auxiliary data and a video clock to the receiver over one or more channels of the link, wherein the link is configured to transmit digital video data from the transmitter to the receiver and has at least one other characteristic of a transition minimized differential signaling link, and the video clock has frequency f, said receiver including:
circuitry for generating a set of L recovered clocks, wherein each of the recovered clocks has the frequency f, is a recovered version of the video clock, and has a different phase $\phi=\phi_0+2\pi(m/L)$, where m is a nonnegative integer in the range $\{0, \ldots, L-1\}$;

a multiplexer and a preload counter coupled to the multiplexer, wherein each of the multiplexer and the preload counter is coupled to receive any selected one of the recovered clocks, and the multiplexer is configured to output a first clock having frequency $(1\pm k/ML)f$ in response to said selected one of the recovered clocks, where k and M are integers; and a dual-modulus frequency divider coupled to receive the first clock and configured to divide the frequency of the first clock by a selectable value L to generate an auxiliary clock for the auxiliary data, where L is a selected one of a first integer N and a second integer P.

27. The receiver of claim 26, wherein the dual-modulus frequency divider is configured to operate cyclically to divide the frequency of the auxiliary clock by the first integer N and then by the second integer P, with a duty cycle that is controlled so that auxiliary clock has time-averaged frequency equal to $(Q/(1\pm k/ML))f$, where Q has a predetermined value greater than N and less than P.

28. A receiver for use in a system including a serial link and a transmitter configured to transmit video data and auxiliary data to the receiver over one or more channels of the link, wherein the link is configured to transmit digital video data from the transmitter to the receiver and has at least one other characteristic of a transition minimized differential signaling link, the video data are transmitted at a video data rate, and packets of the auxiliary data are transmitted at an auxiliary data rate, said receiver including:

rate determination circuitry coupled to receive time stamp data transmitted to the receiver over the link and configured to generate a rate signal indicative of the auxiliary data rate in response to the time stamp data, wherein the time stamp data are indicative of times at which the packets of the auxiliary data were transmitted by the transmitter; and auxiliary clock generation circuitry coupled and configured to receive the rate signal and to generate an auxiliary clock having frequency closely matching the auxiliary data rate in response to the rate signal.

29. A communication system, including:

a receiver;

a transmitter; and a communication link between the transmitter and the receiver, wherein the link is a serial link configured to transmit digital video data from the transmitter to the receiver and having at least one other characteristic of a transition minimized differential signaling link, the transmitter is configured to transmit video data and auxiliary data to the receiver over one or more channels of the link, wherein the video data are transmitted at a video data rate, and packets of the auxiliary data are transmitted at an auxiliary data rate, and wherein the receiver comprises:

rate determination circuitry coupled to receive time stamp data transmitted to the receiver over the link and configured to generate a rate signal indicative of the auxiliary data rate in response to the time stamp data, wherein the time stamp data are indicative of times at which the packets of the auxiliary data were transmitted by the transmitter; and auxiliary clock generation circuitry coupled and configured to receive the rate signal and to generate an auxiliary clock having frequency closely matching the auxiliary data rate in response to the rate signal.

30. The system of claim 29, wherein the auxiliary data are audio data.

31. The system of claim 29, wherein the transmitter is also configured to transmit a counter clock over at least one channel of the link, and the receiver is configured to recover the counter clock thereby generating a recovered counter clock, and the auxiliary clock generation circuitry is configured to generate the auxiliary clock in response to the recovered counter clock and the rate signal.

32. A receiver for use in a system including a serial link and a transmitter configured to transmit video data and auxiliary data to the receiver over one or more channels of the link, wherein the link is configured to transmit digital video data from the transmitter to the receiver and has at least one other characteristic of a transition minimized differential signaling link, the video data are transmitted at a video data rate, and packets of the auxiliary data are transmitted at an auxiliary data rate, said receiver including:

rate determination circuitry coupled to receive a rate signal transmitted to the receiver over the link and configured to generate a recovered rate signal indicative of the auxiliary data rate in response to the rate signal, wherein the rate signal is indicative of the auxiliary data rate at which the packets of the auxiliary data were transmitted by the transmitter; and auxiliary clock generation circuitry coupled and configured to receive the recovered rate signal and to generate an auxiliary clock having frequency closely matching the auxiliary data rate in response to the recovered rate signal.

33. A receiver for use in a system including a serial link and a transmitter configured to transmit video data and auxiliary data to the receiver over one or more channels of the link, wherein the link is configured to transmit digital video data from the transmitter to the receiver and has at least one other characteristic of a transition minimized differential signaling link, the video data are transmitted at a video data rate, and the auxiliary data are transmitted at an auxiliary data rate, said receiver including auxiliary clock generation circuitry for generating an auxiliary clock whose frequency closely matches the auxiliary data rate, said auxiliary clock generation circuitry including:

a memory structure coupled and configured to queue up packets of the auxiliary data that have been transmitted to the receiver over the link; and rate determination circuitry configured to generate an average time difference signal for each sequence of L of the packets queued in the memory structure, each said average time difference signal being indicative of an average time delay equal to $(Et(1)+Et(2)+ \ldots +Et(L))/L$, where $Et(n)$ is a time difference between arrival time at the memory structure of the n-th one of the packets in the sequence and arrival time at the memory structure of the (n−1)th one of the packets in the sequence.

34. The receiver of claim 33, wherein L is a power of two.

35. A receiver for use in a system including a serial link and a transmitter configured to transmit video data and auxiliary data to the receiver over one or more channels of the link, wherein the link is configured to transmit digital video data from the transmitter to the receiver and has at least one other characteristic of a transition minimized differential signaling link, the video data are transmitted at a video data rate, and the auxiliary data are transmitted at an auxiliary data rate, said receiver including auxiliary clock generation circuitry for generating an auxiliary clock whose frequency closely matches the auxiliary data rate, said auxiliary clock generation circuitry including:

a memory structure coupled and configured to queue up packets of the auxiliary data that have been transmitted to the receiver over the link, each of the packets including a time stamp indicative of one of an absolute transmission time and a relative transmission time of said each of the packets; and rate determination circuitry configured to generate an average time delay signal for each sequence of L of the packets queued in the memory structure by processing the time stamp of each of the packets in the sequence, each said average time delay signal being indicative of average time delay between transmission of successively transmitted ones of the packets in the sequence.

36. The receiver of claim 35, wherein each said time stamp is indicative of a time interval between transmission of said each of the packets and transmission of a previously transmitted one of the packets.

37. A receiver for use in a system including a serial link and a transmitter configured to transmit video data and auxiliary data to the receiver over one or more channels of the link, wherein the link is configured to transmit digital video data from the transmitter to the receiver and has at least one other characteristic of a transition minimized differential signaling link, the video data are transmitted at a video data rate, and the auxiliary data are transmitted at an auxiliary data rate, said receiver including auxiliary clock generation circuitry for generating an auxiliary clock whose frequency closely matches the auxiliary data rate, said auxiliary clock generation circuitry including:

FIFO circuitry including a FIFO memory, wherein the FIFO circuitry is coupled and configured to queue in the FIFO memory packets of the auxiliary data that have been transmitted to the receiver over the link, and to clock the packets out of the FIFO memory at a clock frequency determined by varying a reference frequency in response to a feedback signal, wherein at any instant during operation of said FIFO circuitry the FIFO memory is filled up to a FIFO level with a number of said packets; and feedback circuitry coupled to the FIFO circuitry and configured to generate the feedback signal, wherein said feedback signal is indicative of at least one of the FIFO level and a rate of change of the FIFO level.

38. The receiver of claim 37, wherein the FIFO circuitry is configured to increase the clock frequency in response to the feedback signal indicating that the FIFO level is greater than a threshold level.

39. The receiver of claim 37, wherein the FIFO circuitry is configured to operate in a first mode in response to the feedback signal indicating that the FIFO level is greater than a first threshold level but less than a second threshold level, wherein the second threshold level is greater than the first threshold level, and the FIFO circuitry is configured to operate in a second mode in response to the feedback signal indicating that the FIFO level is greater than the second threshold level.

40. The receiver of claim 39, wherein the FIFO circuitry is configured to operate in a third mode in response to the feedback signal indicating that the FIFO level is less than the first threshold level.

41. The receiver of claim 37, wherein the FIFO circuitry is configured to change the clock frequency at a rate which depends on a difference between the FIFO level and a threshold level as indicated by the feedback signal.

42. The receiver of claim 41, wherein said rate depends nonlinearly on the difference between the FIFO level and a threshold level as indicated by the feedback signal.

43. The receiver of claim 37, wherein the FIFO circuitry is configured to change the clock frequency in a manner that depends on the rate of change of the FIFO level as indicated by the feedback signal.

44. The receiver of claim 37, wherein the FIFO circuitry includes:

first circuitry for generating a raw feedback signal indicative of said at least one of the FIFO level and the rate of change of the FIFO level; and a low pass filter coupled and configured generate the feedback signal by low pass filtering the raw feedback signal.

45. The receiver of claim 44, wherein the raw feedback signal is determined by a sequence of feedback bits, and the low pass filter comprises:

an N-bit shift register coupled to receive sequentially the feedback bits;

an N×1 bit adder coupled to the shift register and configured to periodically add together all of the feedback bits in the shift register to generate sum bits; and logic circuitry coupled and configured to generate the feedback signal in response to the sum bits.

46. A receiver for use in a system including a serial link and a transmitter configured to transmit data to the receiver over one or more channels of the link, said data including video data and auxiliary data, wherein the link is configured to transmit digital video data from the transmitter to the receiver and has at least one other characteristic of a transition minimized differential signaling link, and at least some of said data are transmitted at a data rate determined by a transmitter clock frequency, wherein the receiver includes clock generation circuitry for generating an auxiliary data clock for use in receiving the auxiliary data, wherein the auxiliary data clock has a receiver clock frequency, and wherein the auxiliary clock generation circuitry includes:

circuitry for generating a binary value indicative of a ratio B/A, where A is an integer indicative of the transmitter clock frequency and B is an integer indicative of the receiver clock frequency, said circuitry comprising:

a first counter configured to count repeatedly up to a value equal to $2^m$ and then to reset, in response to a clock having the transmitter clock frequency, where m is an integer; and a second counter coupled to the first counter and configured to generate a second count value in response to a clock having the receiver clock frequency and to reset when the first counter resets, whereby each maximum value of the second count value is indicative of said ratio B/A.

47. A communication system, including:

a receiver;

a transmitter; and a communication link between the transmitter and the receiver, wherein the link is a serial link configured to transmit digital video data from the transmitter to the receiver and having at least one other characteristic of a transition minimized differential signaling link, the transmitter is configured to transmit video data and auxiliary data to the receiver over one or more channels of the link, wherein the video data are transmitted at a video data rate and packets of the auxiliary data are transmitted at an auxiliary data rate, wherein the receiver comprises auxiliary clock generation circuitry configured to generate an auxiliary clock having frequency closely matching the auxiliary data rate, and wherein the receiver is configured to transmit the auxiliary clock to the transmitter over a back channel of the link.

48. The system of claim 47, wherein the is a Digital Video Interface link.

* * * * *